US012777730B2

(12) United States Patent
Ohmaru

(10) Patent No.: US 12,777,730 B2
(45) Date of Patent: Oct. 27, 2026

(54) SEMICONDUCTOR DEVICE, IMAGING DEVICE, AND ELECTRONIC DEVICE

(71) Applicant: SEMICONDUCTOR ENERGY LABORATORY CO., LTD., Atsugi (JP)

(72) Inventor: Takuro Ohmaru, Kasuya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 152 days.

(21) Appl. No.: 18/369,249

(22) Filed: Sep. 18, 2023

(65) Prior Publication Data

US 2024/0015381 A1 Jan. 11, 2024

Related U.S. Application Data

(63) Continuation of application No. 16/838,488, filed on Apr. 2, 2020, now abandoned, which is a continuation (Continued)

(30) Foreign Application Priority Data

Oct. 31, 2014 (JP) ................................ 2014-222882

(51) Int. Cl.

*H10F 39/00* (2025.01)
*H04N 23/54* (2023.01)

(Continued)

(52) U.S. Cl.

CPC ........... *H10F 39/802* (2025.01); *H04N 23/54* (2023.01); *H04N 25/709* (2023.01); *H04N 25/76* (2023.01);

(Continued)

(58) Field of Classification Search

None

See application file for complete search history.

(56) References Cited

U.S. PATENT DOCUMENTS

| | | | |
|---|---|---|---|
| 4,212,034 | A | 7/1980 | Kokie et al. |
| 5,731,856 | A | 3/1998 | Kim et al. |

(Continued)

FOREIGN PATENT DOCUMENTS

| | | | |
|---|---|---|---|
| EP | 1737044 | A | 12/2006 |
| EP | 2209141 | A | 7/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Twyler L Haskins
*Assistant Examiner* — Wesley J Chiu
(74) *Attorney, Agent, or Firm* — Fish & Richardson P.C.

(57) ABSTRACT

Provided is a novel semiconductor device, a semiconductor device with reduced area, or a versatile semiconductor device. The semiconductor device includes a pixel portion including a first pixel, a second pixel, a third pixel, and a fourth pixel; a first switch and a second switch located outside the first to fourth pixels; a first wiring located outside the first to fourth pixels; a second wiring electrically connected to the first and second pixels; and a third wiring electrically connected to the third and fourth pixels. A first terminal of the first switch is electrically connected to the first wiring. A second terminal of the first switch is electrically connected to the second wiring. A first terminal of the second switch is electrically connected to the first wiring. A (Continued)

second terminal of the second switch is electrically connected to the third wiring.

6 Claims, 22 Drawing Sheets

Related U.S. Application Data of application No. 14/925,130, filed on Oct. 28, 2015, now abandoned.

(51) Int. Cl.

| | |
|---|---|
| ***H04N 25/709*** | (2023.01) |
| ***H04N 25/76*** | (2023.01) |
| ***H04N 25/778*** | (2023.01) |
| ***H10D 86/40*** | (2025.01) |
| ***H10D 86/60*** | (2025.01) |

(52) U.S. Cl.

CPC ......... *H04N 25/778* (2023.01); *H10D 86/423* (2025.01); *H10D 86/60* (2025.01); *H10F 39/803* (2025.01); *H10F 39/8037* (2025.01); *H10F 39/811* (2025.01); *H10F 39/813* (2025.01)

(56) References Cited

U.S. PATENT DOCUMENTS

| | | | | |
|---|---|---|---|---|
| 5,744,864 | A | 4/1998 | Cillessen et al. | |
| 6,107,655 | A | 8/2000 | Guidash | |
| 6,294,274 | B1 | 9/2001 | Kawazoe et al. | |
| 6,352,869 | B1 | 3/2002 | Guidash | |
| 6,563,174 | B2 | 5/2003 | Kawasaki et al. | |
| 6,727,522 | B1 | 4/2004 | Kawasaki et al. | |
| 7,049,190 | B2 | 5/2006 | Takeda et al. | |
| 7,061,014 | B2 | 6/2006 | Hosono et al. | |
| 7,064,346 | B2 | 6/2006 | Kawasaki et al. | |
| 7,105,868 | B2 | 9/2006 | Nause et al. | |
| 7,211,825 | B2 | 5/2007 | Shih et al. | |
| 7,282,782 | B2 | 10/2007 | Hoffman et al. | |
| 7,297,977 | B2 | 11/2007 | Hoffman et al. | |
| 7,323,356 | B2 | 1/2008 | Hosono et al. | |
| 7,385,224 | B2 | 6/2008 | Ishii et al. | |
| 7,402,506 | B2 | 7/2008 | Levy et al. | |
| 7,411,209 | B2 | 8/2008 | Endo et al. | |
| 7,453,065 | B2 | 11/2008 | Saito et al. | |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,501,293 | B2 | 3/2009 | Ito et al. | |
| 7,674,650 | B2 | 3/2010 | Akimoto et al. | |
| 7,732,819 | B2 | 6/2010 | Akimoto et al. | |
| 7,884,401 | B2 | 2/2011 | Shim | |
| 7,952,627 | B2 | 5/2011 | Morimoto et al. | |
| 8,134,625 | B2 | 3/2012 | Abe et al. | |
| 8,314,870 | B2 | 11/2012 | Itonaga et al. | |
| 8,378,391 | B2 | 2/2013 | Koyama et al. | |
| 8,638,382 | B2 | 1/2014 | Itonaga et al. | |
| 8,665,354 | B2 | 3/2014 | Okura et al. | |
| 8,665,363 | B2 | 3/2014 | Toda | |
| 8,716,712 | B2 | 5/2014 | Kozuma et al. | |
| 8,817,152 | B2 | 8/2014 | Abe et al. | |
| 8,916,869 | B2 | 12/2014 | Koyama et al. | |
| 9,034,104 | B2 | 5/2015 | Yamazaki et al. | |
| 9,049,392 | B2 | 6/2015 | Itonaga et al. | |
| 9,103,724 | B2 | 8/2015 | Aoki et al. | |
| 9,106,856 | B2 | 8/2015 | Ohtsuki et al. | |
| 9,117,713 | B2 | 8/2015 | Koyama | |
| 9,153,610 | B2 | 10/2015 | Kobayashi et al. | |
| 9,179,082 | B2 | 11/2015 | Itonaga et al. | |
| 9,196,648 | B2 | 11/2015 | Kozuma et al. | |
| 9,357,148 | B2 | 5/2016 | Itonaga et al. | |
| 9,445,026 | B2 | 9/2016 | Kobayashi et al. | |
| 9,543,341 | B2 | 1/2017 | Itonaga et al. | |
| 9,577,006 | B2 | 2/2017 | Itonaga et al. | |
| 9,848,149 | B2 | 12/2017 | Aoki et al. | |
| 10,147,758 | B2 | 12/2018 | Itonaga et al. | |
| 10,784,306 | B2 | 9/2020 | Itonaga et al. | |
| 11,233,132 | B2 | 1/2022 | Kimura | |
| 11,961,894 | B2 | 4/2024 | Kimura | |
| 2001/0046027 | A1 | 11/2001 | Tai et al. | |
| 2002/0056838 | A1 | 5/2002 | Ogawa | |
| 2002/0132454 | A1 | 9/2002 | Ohtsu et al. | |
| 2003/0189401 | A1 | 10/2003 | Kido et al. | |
| 2003/0218222 | A1 | 11/2003 | Wager, III et al. | |
| 2004/0038446 | A1 | 2/2004 | Takeda et al. | |
| 2004/0127038 | A1 | 7/2004 | Carcia et al. | |
| 2004/0174450 | A1 | 9/2004 | Lee et al. | |
| 2005/0017302 | A1 | 1/2005 | Hoffman | |
| 2005/0116251 | A1* | 6/2005 | Abe ...................... | H10F 39/803 257/E27.131 |
| 2005/0199959 | A1 | 9/2005 | Chiang et al. | |
| 2005/0237405 | A1* | 10/2005 | Ohkawa ................ | H10F 39/813 348/308 |
| 2005/0248673 | A1* | 11/2005 | Fowler ................... | H04N 25/60 348/241 |
| 2006/0035452 | A1 | 2/2006 | Carcia et al. | |
| 2006/0043377 | A1 | 3/2006 | Hoffman et al. | |
| 2006/0044434 | A1* | 3/2006 | Okita .................... | H10F 39/807 348/294 |
| 2006/0091793 | A1 | 5/2006 | Baude et al. | |
| 2006/0108529 | A1 | 5/2006 | Saito et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2006/0113539 | A1 | 6/2006 | Sano et al. | |
| 2006/0113549 | A1 | 6/2006 | Den et al. | |
| 2006/0113565 | A1 | 6/2006 | Abe et al. | |
| 2006/0169973 | A1 | 8/2006 | Isa et al. | |
| 2006/0170111 | A1 | 8/2006 | Isa et al. | |
| 2006/0197092 | A1 | 9/2006 | Hoffman et al. | |
| 2006/0203114 | A1 | 9/2006 | Xu | |
| 2006/0208977 | A1 | 9/2006 | Kimura | |
| 2006/0228974 | A1 | 10/2006 | Thelss et al. | |
| 2006/0231882 | A1 | 10/2006 | Kim et al. | |
| 2006/0238135 | A1 | 10/2006 | Kimura | |
| 2006/0244107 | A1 | 11/2006 | Sugihara et al. | |
| 2006/0284171 | A1 | 12/2006 | Levy et al. | |
| 2006/0284172 | A1 | 12/2006 | Ishii | |
| 2006/0292777 | A1 | 12/2006 | Dunbar | |
| 2007/0024187 | A1 | 2/2007 | Shin et al. | |
| 2007/0046191 | A1 | 3/2007 | Saito | |
| 2007/0052025 | A1 | 3/2007 | Yabuta | |
| 2007/0054507 | A1 | 3/2007 | Kaji et al. | |
| 2007/0090365 | A1 | 4/2007 | Hayashi et al. | |
| 2007/0108446 | A1 | 5/2007 | Akimoto | |
| 2007/0128954 | A1 | 6/2007 | Itonaga | |
| 2007/0152217 | A1 | 7/2007 | Lai et al. | |
| 2007/0172591 | A1 | 7/2007 | Seo et al. | |
| 2007/0187678 | A1 | 8/2007 | Hirao et al. | |
| 2007/0187760 | A1 | 8/2007 | Furuta et al. | |
| 2007/0194379 | A1 | 8/2007 | Hosono et al. | |
| 2007/0252928 | A1 | 11/2007 | Ito et al. | |
| 2007/0272922 | A1 | 11/2007 | Kim et al. | |
| 2007/0287296 | A1 | 12/2007 | Chang | |
| 2008/0006877 | A1 | 1/2008 | Mardilovich et al. | |
| 2008/0038882 | A1 | 2/2008 | Takechi et al. | |
| 2008/0038929 | A1 | 2/2008 | Chang | |
| 2008/0050595 | A1 | 2/2008 | Nakagawara et al. | |
| 2008/0073653 | A1 | 3/2008 | Iwasaki | |
| 2008/0083950 | A1 | 4/2008 | Pan et al. | |
| 2008/0106191 | A1 | 5/2008 | Kawase | |
| 2008/0128689 | A1 | 6/2008 | Lee et al. | |
| 2008/0129195 | A1 | 6/2008 | Ishizaki et al. | |
| 2008/0151091 | A1 | 6/2008 | Hynecek | |
| 2008/0157152 | A1* | 7/2008 | Shim ..................... | H10F 39/803 257/292 |
| 2008/0166834 | A1 | 7/2008 | Kim et al. | |
| 2008/0182358 | A1 | 7/2008 | Cowdery-Corvan et al. | |
| 2008/0224133 | A1 | 9/2008 | Park et al. | |
| 2008/0252742 | A1 | 10/2008 | Oike | |
| 2008/0254569 | A1 | 10/2008 | Hoffman et al. | |

(56) References Cited

U.S. PATENT DOCUMENTS

2008/0258139 A1 10/2008 Ito et al.
2008/0258140 A1 10/2008 Lee et al.
2008/0258141 A1 10/2008 Park et al.
2008/0258143 A1 10/2008 Kim et al.
2008/0259178 A1 10/2008 Oike
2008/0296568 A1 12/2008 Ryu et al.
2009/0068773 A1 3/2009 Lai et al.
2009/0073325 A1 3/2009 Kuwabara et al.
2009/0079857 A1 3/2009 Kato et al.
2009/0114910 A1 5/2009 Chang
2009/0134399 A1 5/2009 Sakakura et al.
2009/0152506 A1 6/2009 Umeda et al.
2009/0152541 A1 6/2009 Maekawa et al.
2009/0207291 A1 8/2009 Abe et al.
2009/0212336 A1* 8/2009 Iwata .................... H10F 39/807 257/292
2009/0242741 A1 10/2009 Konishi
2009/0278122 A1 11/2009 Hosono et al.
2009/0280600 A1 11/2009 Hosono et al.
2010/0065844 A1 3/2010 Tokunaga
2010/0092800 A1 4/2010 Itagaki et al.
2010/0109002 A1 5/2010 Itagaki et al.
2010/0224878 A1 9/2010 Kimura
2011/0147739 A1 6/2011 Yamazaki et al.
2011/0149102 A1 6/2011 Toda
2011/0155893 A1 6/2011 Endo et al.
2012/0056251 A1 3/2012 Kudoh
2012/0132791 A1 5/2012 Aoki et al.
2012/0241895 A1 9/2012 Kurogi
2012/0280108 A1 11/2012 Dawson et al.
2013/0001403 A1 1/2013 Yamakawa
2013/0049082 A1 2/2013 Kato et al.
2013/0070133 A1 3/2013 Takazawa
2013/0264468 A1* 10/2013 Kobayashi ............ H10F 39/803 257/229
2014/0061436 A1 3/2014 Kobayashi
2014/0102877 A1 4/2014 Yamazaki
2014/0139713 A1 5/2014 Gomi et al.
2014/0218578 A1 8/2014 Kohyama
2014/0246670 A1 9/2014 Koyama
2014/0253792 A1 9/2014 Watanabe
2014/0267858 A1 9/2014 Ohtsuki et al.
2015/0048366 A1 2/2015 Koyama et al.
2015/0340401 A1 11/2015 Yoshii et al.
2015/0364513 A1* 12/2015 Takahashi ............. H10F 39/026 257/292
2015/0380450 A1 12/2015 Okamoto et al.
2016/0126283 A1 5/2016 Ohmaru
2017/0126948 A1 5/2017 Uchida
2017/0201702 A1* 7/2017 Niwa ..................... H04N 25/00
2024/0222464 A1 7/2024 Kimura

FOREIGN PATENT DOCUMENTS

EP 2226847 A 9/2010
EP 2618376 A 7/2013
EP 2800136 A 11/2014
EP 3168876 A 5/2017
EP 3379574 A 9/2018
JP 54-029517 A 3/1979
JP 60-198861 A 10/1985
JP 63-210022 A 8/1988
JP 63-210023 A 8/1988
JP 63-210024 A 8/1988
JP 63-215519 A 9/1988
JP 63-239117 A 10/1988
JP 63-265818 A 11/1988
JP 05-251705 A 9/1993
JP 08-264794 A 10/1996
JP 11-126895 A 5/1999
JP 11-505377 5/1999
JP 2000-044236 A 2/2000
JP 2000-150900 A 5/2000
JP 2002-076356 A 3/2002
JP 2002-289859 A 10/2002
JP 2003-086000 A 3/2003
JP 2003-086808 A 3/2003
JP 2004-103957 A 4/2004
JP 2004-273614 A 9/2004
JP 2004-273732 A 9/2004
JP 3759435 3/2006
JP 2008-166810 A 7/2008
JP 2008-301378 A 12/2008
JP 2009-141624 A 6/2009
JP 2009-194260 A 8/2009
JP 2009-296016 A 12/2009
JP 2010-212288 A 9/2010
JP 2012-199760 A 10/2012
JP 2012-248953 A 12/2012
JP 2012-257191 A 12/2012
JP 2013-055447 A 3/2013
JP 2013-168634 A 8/2013
JP 2013-201446 A 10/2013
JP 2014-049727 A 3/2014
JP 2014-129590 A 7/2014
JP 6587497 10/2019
KR 2010-0084124 A 7/2010
KR 2010-0100659 A 9/2010
KR 2011-0070788 A 6/2011
KR 2012-0089776 A 8/2012
KR 2012-0135410 A 12/2012
TW 201143052 12/2011
TW 201432891 8/2014
WO WO-2004/114391 12/2004
WO WO-2011/074506 6/2011
WO WO-2011/102183 8/2011
WO WO-2012/073797 6/2012
WO WO-2013/084406 6/2013

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects In ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—Bo Systems [A; Fe, Ga, or All; B: Mg, Mn, Fe, Ni, Cu, or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Mcilrath.L, "A Low-Power Analog Correlation Processor for Real-Time Camera Alignment and Motion Computation", IEEE Transactions on Circuits and Systems II : Analog and Digital Signal Processing, Dec. 1, 2000, vol. 47, No. 12, pp. 1353-1364.
Martin-Gonthier.P et al., "Novel Readout Circuit Architecture for CMOS Image Sensors Minimizing RTS Noise", IEEE Electron Device Letters, Apr. 29, 2011, vol. 32, No. 6, pp. 776-778.
Taiwanese Office Action (Application No. 110141700) Dated Nov. 23, 2022.

* cited by examiner

FIG. 17A1
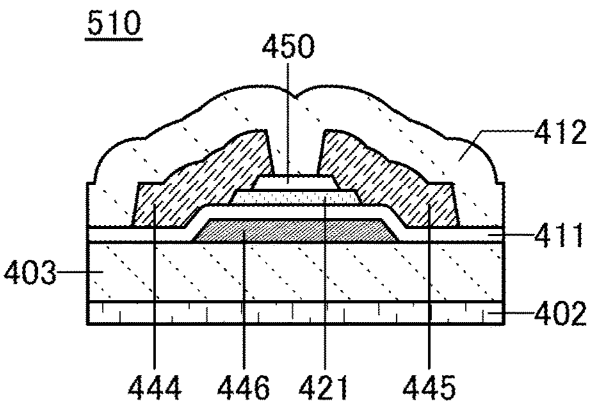
FIG. 17A2
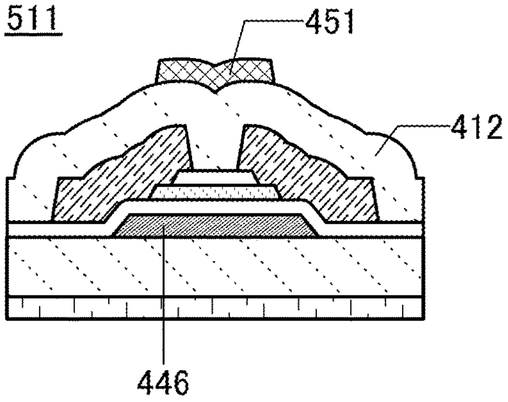
FIG. 17B1
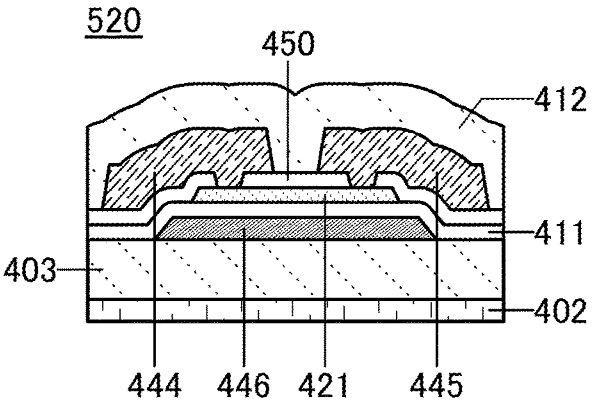
FIG. 17B2
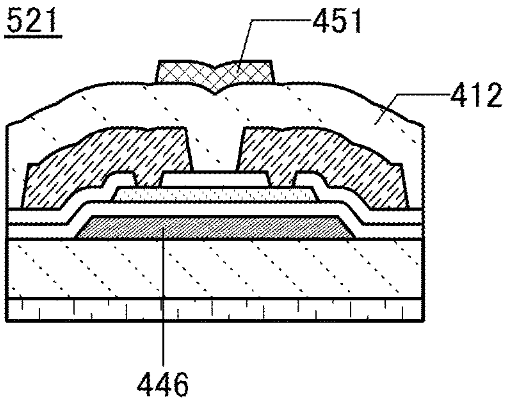

FIG. 18A1
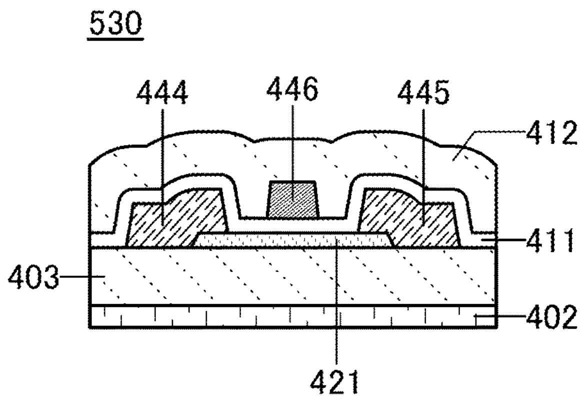
FIG. 18A2
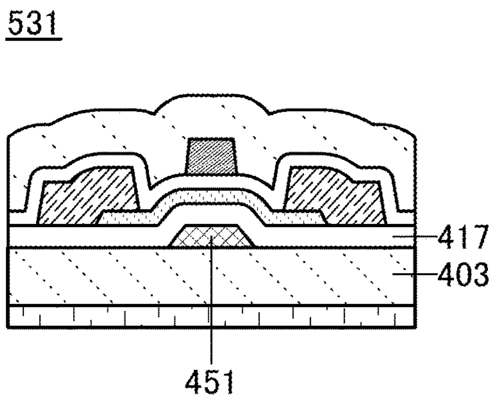
FIG. 18A3
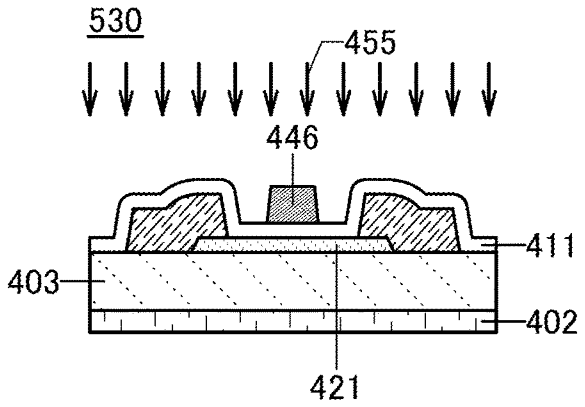
FIG. 18B1
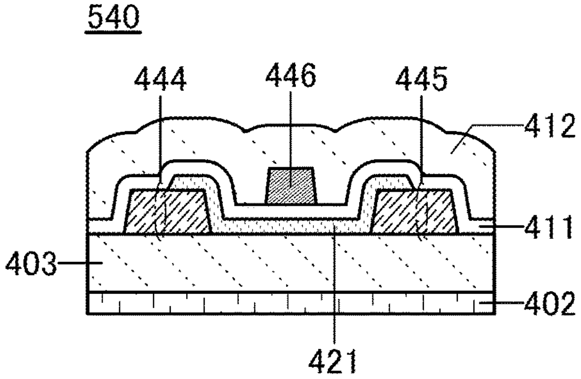
FIG. 18B2
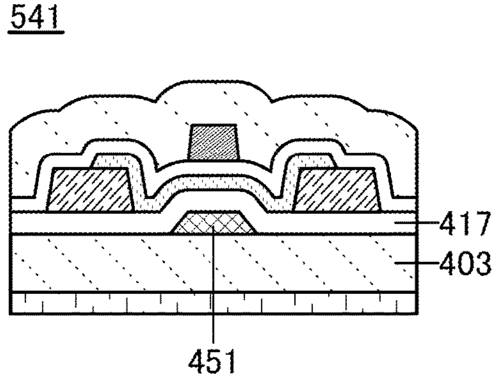

550

550

550

552

552

552

SEMICONDUCTOR DEVICE, IMAGING DEVICE, AND ELECTRONIC DEVICE

CROSS-REFERENCE TO RELATED APPLICATIONS

This application is a continuation of U.S. application Ser. No. 16/838,488, filed Apr. 2, 2020, now pending, which is a continuation of U.S. application Ser. No. 14/925,130, filed Oct. 28, 2015, now abandoned, which claims the benefit of a foreign priority application filed in Japan as Serial No. 2014-222882 on Oct. 31, 2014, all of which are incorporated by reference.

BACKGROUND OF THE INVENTION

1. Field of the Invention

One embodiment of the present invention relates to a semiconductor device, an imaging device, and an electronic device.

One embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. One embodiment of the present invention relates to a semiconductor device, a display device, a lighting device, a power storage device, a memory device, or a driving method or manufacturing method thereof.

2. Description of the Related Art

A technological development of a photodetector including a photodetector circuit (also referred to as an optical sensor) capable of generating data having a value corresponding to the illuminance of incident light has been advanced.

An image sensor is an example of the photodetector. Examples of the image sensor include a charge coupled device (CCD) image sensor and a complementary metal oxide semiconductor (CMOS) image sensor. The CMOS image sensor is generally used as an imaging element in portable devices, such as digital cameras or cellular phones. In recent years, a pixel in the CMOS image sensor has been made smaller in accordance with the increase in definition of imaging and the reduction in size and power consumption of portable devices.

Patent Document 1 discloses an imaging element in which a transistor is shared by adjacent pixels to reduce the pixel area.

REFERENCE

Patent Document

[Patent Document 1] Japanese Published Patent Application No. 11-126895

SUMMARY OF THE INVENTION

If an element, such as a transistor, included in an image sensor is shared by a plurality of pixels, a certain area in a pixel region is occupied by the element because the shared element is provided in the pixel region. Thus, there is a limit to reduction in the area of the pixel region by the element sharing among pixels in the pixel region.

In addition, an amplifier and a reset transistor are connected to the same power source line in Patent Document 1. Because of this, power voltage for the amplifier and power voltage for the reset transistor cannot be determined separately, and the degree of freedom of pixel design is decreased. However, in the case where different power source lines are provided for the amplifier and the reset transistor, space for two power source lines needs to be provided in a pixel, which leads to increase in the pixel area and reduction in the aperture ratio.

An object of one embodiment of the present invention is to provide a novel semiconductor device. Another object of one embodiment of the present invention is to provide a semiconductor device with reduced area. Another object of one embodiment of the present invention is to provide a versatile semiconductor device. Another object of one embodiment of the present invention is to provide a semiconductor device capable of high-resolution imaging. Another object of one embodiment of the present invention is to provide a semiconductor device capable of reducing power consumption. Another object of one embodiment of the present invention is to provide a semiconductor device capable of high-speed imaging.

One embodiment of the present invention does not necessarily achieve all the objects listed above and only needs to achieve at least one of the objects. The description of the above objects does not disturb the existence of other objects. Other objects are apparent from and can be derived from the description of the specification, the drawings, and the claims.

Means for Solving the Problems

A semiconductor device according to one embodiment of the present invention includes a pixel portion including a first pixel, a second pixel, a third pixel, and a fourth pixel; a first switch and a second switch located outside the first pixel, the second pixel, the third pixel, and the fourth pixel; a first wiring located outside the first pixel, the second pixel, the third pixel, and the fourth pixel; a second wiring electrically connected to the first pixel and the second pixel and a third wiring electrically connected to the third pixel and the fourth pixel. A first terminal of the first switch is electrically connected to the first wiring. A second terminal of the first switch is electrically connected to the second wiring. A first terminal of the second switch is electrically connected to the first wiring. A second terminal of the second switch is electrically connected to the third wiring.

A semiconductor device according to one embodiment of the present invention includes a pixel portion including a first pixel, a second pixel, a third pixel, and a fourth pixel; a first switch and a second switch located outside the first pixel, the second pixel, the third pixel, and the fourth pixel; a first wiring located outside the first pixel, the second pixel, the third pixel, and the fourth pixel; a second wiring electrically connected to the first pixel and the second pixel; and a third wiring electrically connected to the third pixel and the fourth pixel. A first terminal of the first switch is electrically connected to the first wiring. A second terminal of the first switch is electrically connected to the second wiring. A first terminal of the second switch is electrically connected to the first wiring. A second terminal of the second switch is electrically connected to the third wiring. The semiconductor device according to one embodiment of the present invention includes a first step for resetting the first pixel, the second pixel, the third pixel, and the fourth pixel; a second step for turning the first switch on, supplying a potential of the first wiring to the second wiring, and reading an electric signal from the first pixel and the second pixel after the first step; a third step for resetting the first pixel, the second pixel, the third pixel, and the fourth pixel after the second step; and a fourth step for turning the second switch on, supplying a potential of the first wiring to the third wiring, and reading an electric signal from the third pixel and the fourth pixel after the third step.

The semiconductor device according to one embodiment of the present invention may further include a fourth wiring capable of supplying a reset potential to the first pixel, the second pixel, the third pixel, and the fourth pixel. A potential higher than the fourth wiring may be supplied to the first wiring.

In the semiconductor device according to one embodiment of the present invention, each of the first pixel, the second pixel, the third pixel, and the fourth pixel may include a photoelectric conversion element and a transistor. The photoelectric conversion element may be electrically connected to the transistor. A channel formation region of the transistor may include an oxide semiconductor.

In the semiconductor device according to one embodiment of the present invention, the first switch and the second switch may include a first transistor and a second transistor, respectively. Each of the first pixel, the second pixel, the third pixel, and the fourth pixel may include a photoelectric conversion element and a third transistor. The photoelectric conversion element may be electrically connected to the third transistor. A channel formation region of each of the first transistor and the second transistor may include a single-crystal semiconductor. A channel formation region of the third transistor may include an oxide semiconductor. The third transistor may be stacked over the first transistor and the second transistor.

In the semiconductor device according to one embodiment of the present invention, the photoelectric conversion element may include a first electrode, a second electrode, and a photoelectric conversion layer between the first electrode and the second electrode. The photoelectric conversion layer may contain selenium.

An imaging device of one embodiment of the present invention includes a photodetector portion including the semiconductor device, and a data processing portion having a function of generating an image data on the basis of a signal from the photodetector portion.

An electronic device of one embodiment of the present invention includes one of the semiconductor device and the imaging device and at least one of a lens, a display portion, an operation key, and a shutter button.

According to one embodiment of the present invention, a novel semiconductor device, a semiconductor device with reduced area, a versatile semiconductor device, a semiconductor device capable of high-resolution imaging, a semiconductor device capable of reducing power consumption, or a semiconductor device capable of high-speed imaging.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 17A1, 17A2, 17B1, and 17B2 are diagrams each illustrating a structure example of a transistor.

FIGS. 18A1, 18A2, 18A3, 18B1, and 18B2 are diagrams each illustrating a structure example of a transistor.

DETAILED DESCRIPTION OF THE INVENTION

Figure 1:
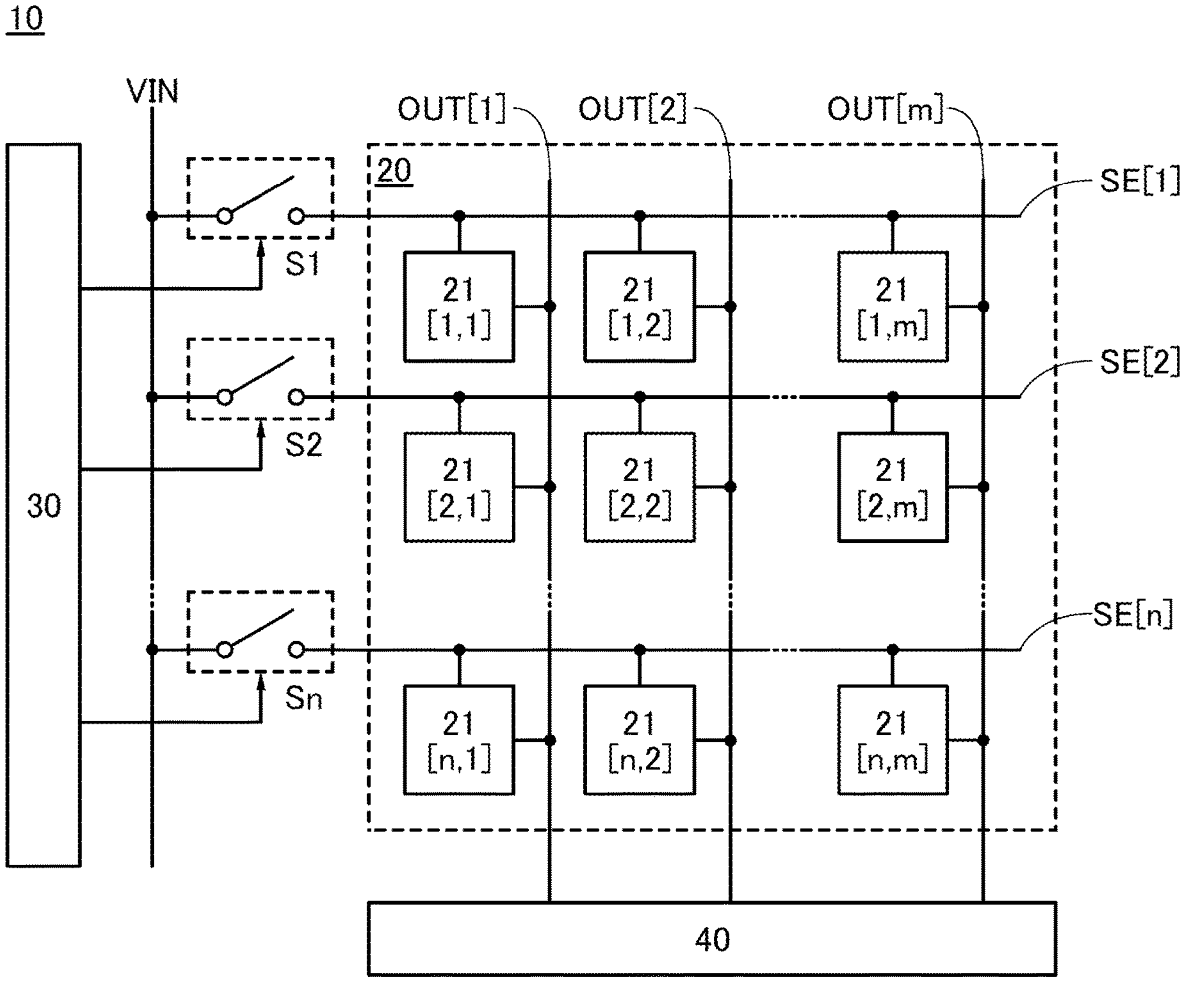
FIG. 1 is a diagram illustrating a structure example of a semiconductor device.

Best Mode for Carrying Out the Invention

Hereinafter, embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the embodiments.

One embodiment of the present invention includes, in its category, devices such as an imaging device, a radio frequency (RF) tag, a display device, and an integrated circuit. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

The same reference numerals are sometimes used for the same element in different drawings of the present invention.

In this specification and the like, the explicit description of X and Y are connected means that X and Y are connected to each other electrically, functionally, or directly. Accordingly, without being limited to a connection relationship shown in drawings or specifications, another connection relationship is included therein. Here, X and Y denote an object (e.g., a device, an element, a circuit, a wiring or line, an electrode, a terminal, a conductive film, and a layer).

In the condition that X and Y are directly connected to each other, for example, X and Y are connected without an element capable of electrically connecting X and Y (e.g., a switch, a transistor, a capacitor, an inductor, a resistor, a diode, a display element, a light-emitting element, and a load) provided therebetween.

In the condition that X and Y are electrically connected to each other, one or more elements capable of electrically connecting X and Y (e.g., a switch, a transistor, a capacitor, an inductor, a resistor, a diode, a display element, a light-emitting element, or a load) can be connected between X and Y. A switch is turned on and off and controlled. That is, a switch has a function of controlling the flow of current when turned on and off. Alternatively, the switch has a function of selecting and changing a current path. Note that the description of X and Y are electrically connected includes X and Y are directly connected.

In the condition that X and Y are functionally connected, one or more circuits capable of functionally connecting X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, the case where a signal output from X is transmitted to Y even when another circuit is provided between X and Y is also included. Note that the case where X and Y are functionally connected includes the case where X and Y are directly connected and the case where X and Y are electrically connected.

In this specification and the like, the explicit description of X and Y are electrically connected means that X and Y are electrically connected (i.e., X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description of X and Y are electrically connected is the same as X and Y are connected.

One component actually has functions of a plurality of components in some cases, though independent components are electrically connected to each other in a diagram. For example, when part of a wiring has a function of an electrode, a conductive film forming the wiring has a function of not only the wiring but also the electrode. Thus, "electrical connection" in this specification includes in its category such a case where a conductive film has functions of a plurality of components.

Embodiment 1

In this embodiment, a structure example of a semiconductor device of one embodiment of the present invention is described.

<Structure Example of Semiconductor Device 10>

FIG. 1 illustrates a structure example of a semiconductor device 10 of one embodiment of the present invention. The semiconductor device 10 includes a pixel portion 20, a circuit 30, and a circuit 40. The semiconductor device 10 further includes a wiring VIN and a plurality of switches S outside the pixel portion 20.

The pixel portion 20 includes a plurality of pixels 21. Shown here is an example in which the pixels 21[1,1] to 21[n,m] are provided in n rows and m columns (n and m are natural numbers) in the pixel portion 20. Each pixel 21 has a function of converting irradiation light into an electrical signal (hereinafter also referred to as an optical data signal). Each pixel 21 thus serves as a photodetector circuit in an imaging device. Specifically, irradiation light of a photoelectric conversion element provided in each pixel 21 is converted into an electrical signal.

Each pixel 21 is connected to a wiring SE and a wiring OUT. Specifically, pixels 21 in the i-th row (i is an integer greater than or equal to 1 and less than or equal to n), i.e., a pixel 21[0] to a pixel 21[i,m] are connected to a wiring SE[i]; and pixels 21 in the j-th row (j is an integer greater than or equal to 1 and less than or equal to m), i.e., a pixel 21[1,j] to a pixel 21[n,j] are connected to a wiring OUT[j]. An optical data signal generated in each pixel 21 is output to the circuit 40 through the wiring OUT.

Note that a pixel 21 receiving red light, a pixel 21 receiving green light, and a pixel 21 receiving blue light each of which generates an optical data signal may be provided in the circuit 20. The optical data signals are synthesized with each other to generate a data signal of a full-color image signal. Instead of or in addition to these pixels 21, a pixel 21 receiving light exhibiting one or more of cyan, magenta, and yellow may be provided, in which case the number of reproducible colors in an image, which is displayed based on image signals generated by the pixels 21, can be increased. For example, by providing a coloring layer, which transmits light of a particular color, in a pixel 21 and letting light enter the pixel 21 through the coloring layer, the optical data signal in accordance with the amount of light of a particular color can be generated.

Light detected in the pixel 21 can be visible or invisible.

The pixel 21 may be provided with a cooling unit, which suppresses occurrence of noise due to heat.

The circuit 30 is a driver circuit having a function of selecting pixels 21 in a specific row from the pixels 21 in n rows. The circuit 30 selects the pixels 21 in a specific row outputting optical data signals. Specifically, the circuit 30 outputs a control signal to a plurality of switches S (switches 51 to Sn) to control conductions of the plurality of switches S so that pixels 21 in a specific row can be selected. The circuit 30 can include a decoder, for example.

Note that the circuit 30 may have a function of supplying a reset signal to the pixels 21.

The circuit 40 is a read circuit having a function of outputting the optical data signal, which is obtained in the pixel portion, to the outside. Specifically, the circuit 40 is connected to the pixels 21 through the wirings OUT and has a function of outputting the optical data signal, which is input from predetermined pixels 21 through the wiring OUT, to the outside. The circuit 40 can include a current source, a transistor, and the like.

In addition, the circuit 40 has a function of supplying a predetermined potential to the wiring OUT, and accordingly the potential of the wiring OUT which is used for outputting the signal generated in the pixels 21 to the outside can be reset. The circuit 40 can also serve as a constant current source, which enables supply of a predetermined potential to the wiring OUT in accordance with the signal, which is input from the pixels 21.

In addition, the semiconductor device 10 includes the plurality of switches S (the switches Si to Sn) and a wiring VIN outside the pixel portion 20. A first terminal and a second terminal of a switch Si are connected to the wiring SE[i] and the wiring VIN, respectively. The switches S each have a function of controlling electrical connection between the wirings SE and VIN in accordance with the control signal input from the circuit 30.

The wiring VIN is a power source line used for outputting an optical data signal. When the switch Si is turned on and the wiring VIN is electrically connected to the wiring SE[i], an optical data signal is output from the pixels 21[i,1] to 21[i,m], which are connected to the wiring SE[i], to the circuit 40.

For example, in order to read an optical data signal from the pixels 21[1,1] to 21[1,m] in the first row, a predetermined control signal is output from the circuit 40 to the switch Si to turn the switch Si on. Accordingly, the wiring SE[1] is electrically connected to the wiring VIN, and the potential (power source potential) of the power source line VIN is supplied to the pixels 21[1,1] to 21[1,m], so that the optical data signal can be read out.

As described, in one embodiment of the present invention, the switches S for selecting the pixels 21 are shared by the pixels 21 in one row and are provided outside the pixel portion 20. Thus, a switch (e.g., a transistor) for selecting the pixels 21 and a power source line connected to the switch need not be provided in the pixel portion 20, which leads to the reduction in the area of the pixel portion 20.

In addition, in one embodiment of the present invention, the wiring VIN functioning as a power source line for reading an optical data signal from the pixels 21 is provided outside the pixel portion 20. Thus, if the wiring VIN is formed using a wiring different from a wiring (e.g., a reset power source line) connected to the pixels 21, the area of the pixel portion 20 is not increased. Since a potential different from that supplied to the power source line connected to the pixels 21 can be thus supplied to the wiring VIN, a power potential used for reading an optical data signal can be freely determined, which leads to an improvement of the freedom degree of design and the versatility of the semiconductor device 10.

Note that it is preferable that the wiring SE be not electrically connected to the wiring OUT in rows other than the row where an optical data signal is read, in which case the optical data signal can be read more accurately.

<Another Example of Circuit Configuration>

Figure 2:
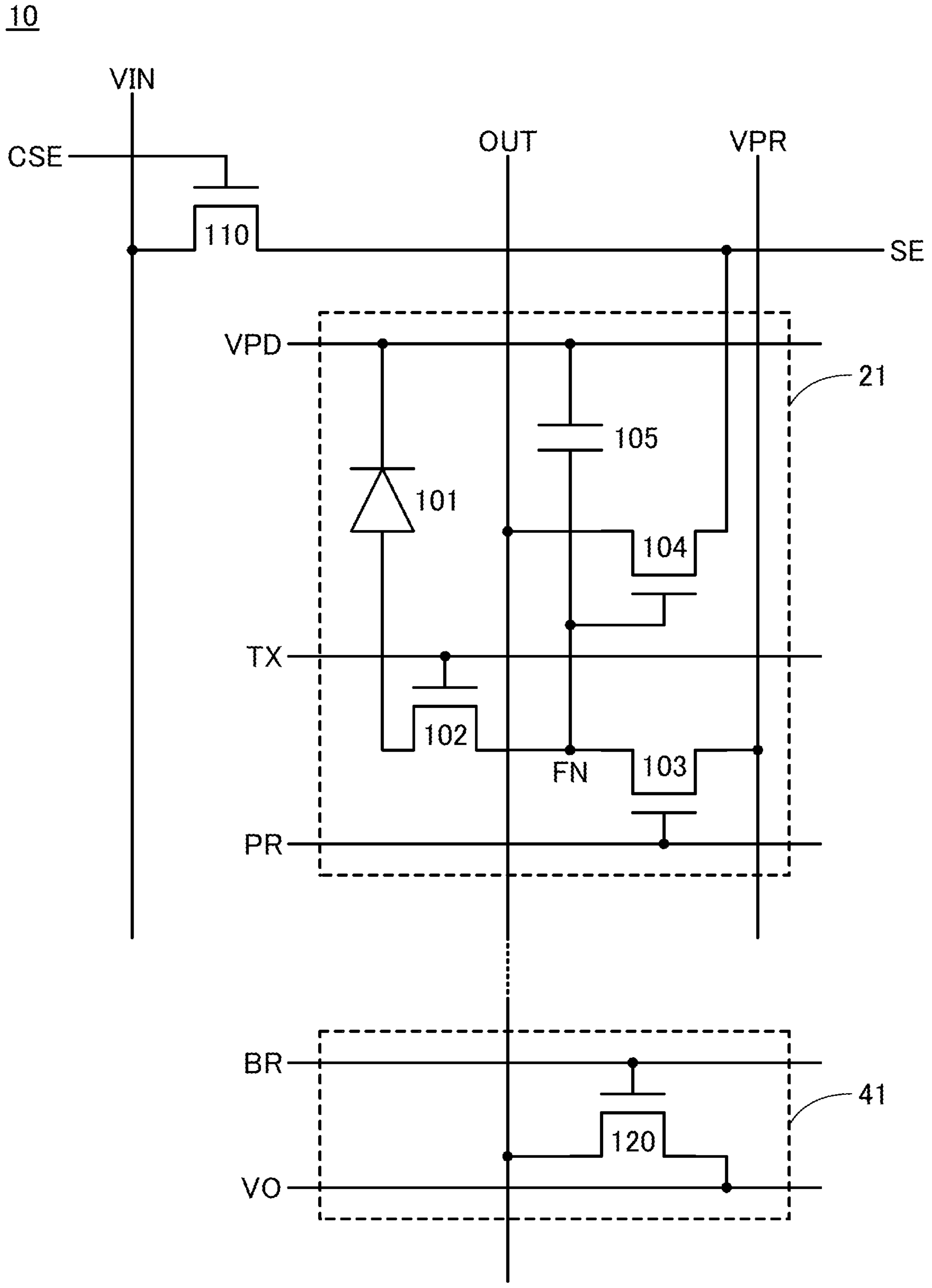
FIG. 2 is a circuit diagram illustrating a structure example of a semiconductor device.

Next, a specific circuit configuration of the semiconductor device 10 is described. FIG. 2 shows an example of a circuit configuration of the semiconductor device 10 including the pixel 21 and a circuit 41. Although all of the transistors are n-channel transistors in the non-limiting example, each of the transistors described below may be an n-channel transistor or a p-channel transistor.

First, a structure example of the pixel 21 is described.

The pixel 21 shown in FIG. 2 includes a photoelectric conversion element 101, transistors 102, 103, and 104, and a capacitor 105. A first terminal and a second terminal of the photoelectric conversion element 101 are connected to one of a source and drain of the transistor 102 and a wiring VPD, respectively. A gate and the other of the source and drain of the transistor 102 are connected to a wiring TX and a gate of the transistor 104, respectively. A gate of the transistor 103 is connected to a wiring PR, one of a source and drain of the transistor 104 is connected to the gate of the transistor 104, and the other of the source and drain of the transistor 104 is connected to a wiring VPR. One of the source and drain of the transistor 104 and the other thereof are connected to the wiring SE and the wiring OUT, respectively. One of electrodes of the capacitor 105 and the other thereof are connected to the gate of the transistor 104 and the wiring VPD, respectively. A node connected to the other of the source and drain of the transistor 102, the one of the source and drain of the transistor 103, the gate of the transistor 104, and the one of electrodes of the capacitor 105 is referred to as a node FN. Note that the capacitor 105 can be formed using a capacitor element or a parasitic capacitance. If the gate capacitance of the transistor 104 is sufficiently large, the capacitor 105 and the wiring VPD can be omitted.

Note that a "source" of a transistor in this specification means a source region that is part of a semiconductor functioning as an active layer or a source electrode connected to the semiconductor. Similarly, a "drain" of the transistor means a drain region that is part of the semiconductor or a drain electrode connected to the semiconductor. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Each of the wirings VPD and VPR is supplied with a predetermined potential and functions as a power source line. A potential supplied to each of the wirings VPD and VPR may be a high power source potential or a low power source potential (e.g., a ground potential). Described here is the case where the wirings VPD and VPR are a high potential power source line and a low potential power source line, respectively. That is, a high power source potential VDD is supplied to the wiring VPD, whereas a low power source potential VSS is supplied to the wiring VPR. The wirings VPD and VPR may be shared by all the pixels 21.

The photoelectric conversion element 101 has a function of converting irradiation light into an electrical signal. An element with which photocurrent can be obtained in accordance with the amount of irradiation light can be used as the photoelectric conversion element 101. A PN photodiode, a PIN photodiode, an avalanche diode, an NPN buried diode, a Schottky diode, a phototransistor, an X-ray photoconductor, an infrared ray sensor, and the like can be given as specific examples of the photoelectric conversion element 101. In addition, an element containing selenium in a photoelectric conversion layer can be used as the photoelectric conversion element 101. In FIG. 2, a photodiode is used as the photoelectric conversion element 101. An anode and a cathode of the photodiode are connected to one of the source and drain of the transistor 102 and the wiring VPD, respectively. Note that in the case where the low power source potential VSS and the high power source potential VDD are supplied to the wirings VPD and VPR, respectively, the anode and cathode of the photodiode are preferably interchanged.

The on/off state of the transistor 102 is controlled by a potential of the wiring TX. If the transistor 102 is on, an electrical signal output from the photoelectric conversion element 101 is supplied to the node FN. Thus, the potential of the node FN is determined by the amount of irradiation light on the photoelectric conversion element 101. Light exposure can be performed in a period during which the transistors 102 and 103 are on and off, respectively.

The on/off state of the transistor 103 is controlled by the potential of the wiring PR. When the transistor 103 is turned on, the potential of the wiring VPR is supplied to the node FN to reset the potential of the node FN. The potential of the wiring PR at which the transistor 103 is turned on corresponds to a reset signal, and a period during which the reset signal is supplied to the wiring PR corresponds to a reset period. Note that the potential of the wiring PR may be controlled by the circuit 30 or another driver circuit.

In order to reset the pixel 21, the potential of the wiring VPR is supplied to the node FN as described above. Such a potential of the wiring VPR for resetting the pixel 21 is also referred to as a reset potential.

The on/off state of the transistor 104 is controlled by the potential of the node FN. Specifically, the source-drain resistance value of the transistor 104 changes in accordance with the potential of the node FN. A potential to be supplied from the wiring SE to the wiring OUT via the transistor 104 is determined by the potential of the node FN.

In one embodiment of the present invention, the potential of the wiring SE is controlled by the transistor 110 and the wiring VIN. A gate of the transistor 110 is connected to a wiring CSE, one of a source and drain thereof is connected to the wiring SE, and the other of the source and drain thereof is connected to the wiring VIN. Note that the transistor 110 corresponds to the switch S in FIG. 1. When a potential at which the transistor 110 is turned on (hereinafter such a potential is also referred to as a selection signal) is supplied to the wiring CSE, the wiring VIN is electrically connected to the wiring SE, and the potential of the wiring VIN is supplied to the pixel 21 as a power source potential. The pixel 21 from which an optical data signal is read can thus be selected.

The transistor 110 for selecting from among the pixels 21 is shared by pixels 21 in one row and is provided outside the pixels 21; thus, the number of transistors included in each pixel 21 and the area of each pixel 21 can be reduced.

Next, a configuration of the circuit 41 is described.

The circuit 41 is included in the circuit 40 shown in FIG. 1. Described here is a structure example in which the circuit 41 is provided for each row of pixels 21.

The circuit 41 includes a transistor 120. A gate of the transistor 120 is connected to a wiring BR, one of a source and drain of the transistor 120 is connected to a wiring VO, and the other of the source and drain of the transistor 120 is connected to the wiring OUT.

The on/off state of the transistor 120 is controlled in accordance with a potential of the wiring BR. When the transistor 120 is turned on, the potential of the wiring VO is supplied to the wiring OUT to reset the potential of the wiring OUT. Then, when a power source potential is supplied to the wiring SE from the wiring VIN through the transistor 110, the potential corresponding to the node FN is output to the wiring OUT. The transistor 104 is used in a source follower, and the potential of the node FN lowered by the threshold voltage of the transistor 104 is output to the wiring OUT.

The wiring VO is supplied with a predetermined potential and serves as a power source line. A potential supplied to the wiring VO may be a high power source potential or a low power source potential (e.g., a ground potential). Described here is the case where the wiring VO is a low potential power supply line. That is, the low power supply potential VSS is supplied to the wiring VO.

Note that while a predetermined potential at which the transistor 120 is on is continuously supplied to the wiring BR, the transistor 120 serves as a current source. A potential obtained by resistance division of combined resistance of the source—drain resistance of the transistor 120 and the source—drain resistance of the transistor 104 is output to the wiring OUT.

In one embodiment of the present invention, the wiring VIN is separated from the wiring VPR, and a potential different from a potential supplied to the wiring VPR can be supplied to the wiring VIN. For example, when the low power source potential VSS is supplied to the wiring VPR, the high power source potential VDD can be supplied to the wiring VIN. Thus, a source follower can be formed with the transistors 104 and 120 to read an optical data signal at high speed. The dynamic range of the output potential of the wiring OUT can be changed by adjustments of the high power source potential VDD supplied to the wiring VIN.

<Example of Reading Operation>

Next, operation for reading an optical data signal from the pixel 21 will be described.

In order to read an optical data signal from the pixel 21 in FIG. 2, the potential of the signal line CSE is set high to turn the transistor 110 on, and the high power source potential VDD is accordingly supplied from the wiring VIN to the wiring SE. In this state, the source—drain resistance value of the transistor 104 corresponds to the node FN, and the potential corresponding to the potential of the node FN is output from the wiring SE through the transistor 104 to the wiring OUT; accordingly, an optical data signal can be read from the pixel 21.

In a period during which an optical data signal is not read from the pixel 21, the potential of the signal line CSE is set low to turn the transistor 110 off. The power source potential is not supplied from the wiring VIN to the wiring SE in this state, and thus an optical data signal is not output to the wiring OUT.

In the period during which an optical data signal is not read, it is preferable that the pixel 21 be reset; specifically, it is preferable that the node FN be low and the transistor 104 be off, whereby electrical connection between the wirings SE and OUT can be cut to prevent supply of an undesired potential to the wiring OUT. In order to turn the transistor 104 off, the transistor 103 is turned on to supply the low power source potential VSS of the wiring VPR to the node FN.

The above-described operation can output an optical data signal to the wiring OUT. The optical data signal output to the wiring OUT is input to the circuit 40 and output to the outside from the circuit 40.

Although there is no particular limitation on materials and the like used for the transistors shown in FIG. 2, it is particularly preferable to use a transistor in which an oxide semiconductor is used in a channel formation region (hereinafter also referred to as an OS transistor) for the transistors 102, 103, and 104, which are included in the pixel 21. An oxide semiconductor has a wider band gap and lower intrinsic carrier density than other semiconductors such as silicon; therefore, the off-state current of an OS transistor is extremely low. Thus, the use of an OS transistor for the pixel 21 allows a predetermined potential to be held for a long time. The details of an oxide semiconductor and an OS transistor will be described in Embodiments 4 and 7.

When an OS transistor is used as the transistor 102, for example, charge transfer between the node FN and the photoelectric conversion element 101 can be suppressed while the transistor 102 is off; accordingly, charge accumulated in the node FN can be held for an extremely long time to prevent a potential change of the node FN.

When an OS transistor is used as the transistor 103, charge transfer between the node FN and the wiring VPR can be suppressed while the transistor 103 is off; accordingly, charge accumulated in the node FN can be held for an extremely long time to prevent a potential change of the node FN.

When an OS transistor is used as the transistor 104, for example, charge transfer between the wirings SE and OUT can be suppressed while the transistor 104 is off; accordingly, an undesired potential change of the wiring OUT can be suppressed. Thus, when a transistor 104 in one pixel 21 is off, an optical data signal in the other pixel 21 connected to the same wiring OUT can be read more accurately.

In addition, the use of OS transistors as the transistors 102 and 103 allows the potential of the node FN to be kept stably and an optical data signal to be output accurately even if the potential of the node FN is extremely low. Thus, it is possible to broaden the detection range of light illuminance, i.e., the dynamic range, of the pixel 21.

In addition, temperature dependence of variation in electrical characteristics is smaller in an OS transistor than a transistor containing silicon in a channel formation region (hereinafter, also referred to as Si transistor), and thus an OS transistor can be used at an extremely wide range of temperatures. The use of a semiconductor device including an OS transistor can provide an imaging device suitable for use in automobiles, aircrafts, and spacecrafts.

In the case where a photoelectric conversion element in which a photoelectric conversion layer is formed using a selenium-based material is used as the photoelectric conversion element 101, relatively high voltage (e.g., 10 V or higher) is preferably applied to easily cause the avalanche phenomenon. For example, the potential of the wiring VPD is preferably higher than or equal to 10 V, and the potential of the wiring VPR is preferably 0 V. An OS transistor has higher drain breakdown voltage than a Si transistor and thus is preferable as the transistors 102 to 104. The combination of an OS transistor with a photoelectric conversion element using a selenium-based material can provide a highly reliable imaging device capable of taking high-resolution images. Note that the details of the photoelectric conversion element in which a photoelectric conversion layer is formed using a selenium-based material will be described in Embodiment 6.

Note that the transistors 102, 103, and 104 are not limited to an OS transistor. For example, a transistor in which a channel formation region is formed in part of a substrate including a single crystal semiconductor to include the single crystal semiconductor in the channel formation region (hereinafter, also referred to as a single crystal transistor) can be used. As the substrate including a single crystal semiconductor, a single crystal silicon substrate, a single crystal germanium substrate, or the like can be used. Since a single crystal transistor has a high current supply ability, the operation speed of the pixel 21 using such a transistor can be increased.

Other than an OS transistor, a transistor including a non-single-crystal semiconductor in a channel formation region (hereinafter, also referred to as a non-single-crystal transistor) can be used as the transistors 102, 103, and 104. As the non-single-crystal semiconductor other than an OS transistor, non-single-crystal silicon such as amorphous silicon, microcrystalline silicon or polycrystalline silicon, non-single-crystal germanium such as amorphous germanium, microcrystalline germanium or polycrystalline germanium, or the like can be used.

The above-described OS transistors, single-crystal transistors, and non-single-crystal transistors can be appropriately used as the transistors 110 and 120.

The transistor 110 needs high current supply ability because it is connected to a plurality of pixels 21 (m pixels 21 in FIG. 1). It is thus preferable to use a single-crystal transistor having high current supply ability as the transistor 110, which makes it easier to supply a power source potential from the wiring VIN to a plurality of pixels 21. In this case, the transistors 102 to 104 are preferably stacked over the transistor 110 to suppress the increase in area caused by the transistor 110. The details of the stacked structure of the transistors will be described in Embodiment 4.

In the case where the transistor 110 is a transistor containing the same semiconductor material as the transistors 102 to 104 (e.g., in the case where an OS transistor is used as the transistor 110 as well), the channel width of the transistor 110 is preferably larger than that of the transistors 102 to 104. This can increase the current supply ability of the transistor 110.

<Operation Example of Semiconductor Device 10>

Next, operation example of the semiconductor device 10 will be described in detail.

Figure 3:
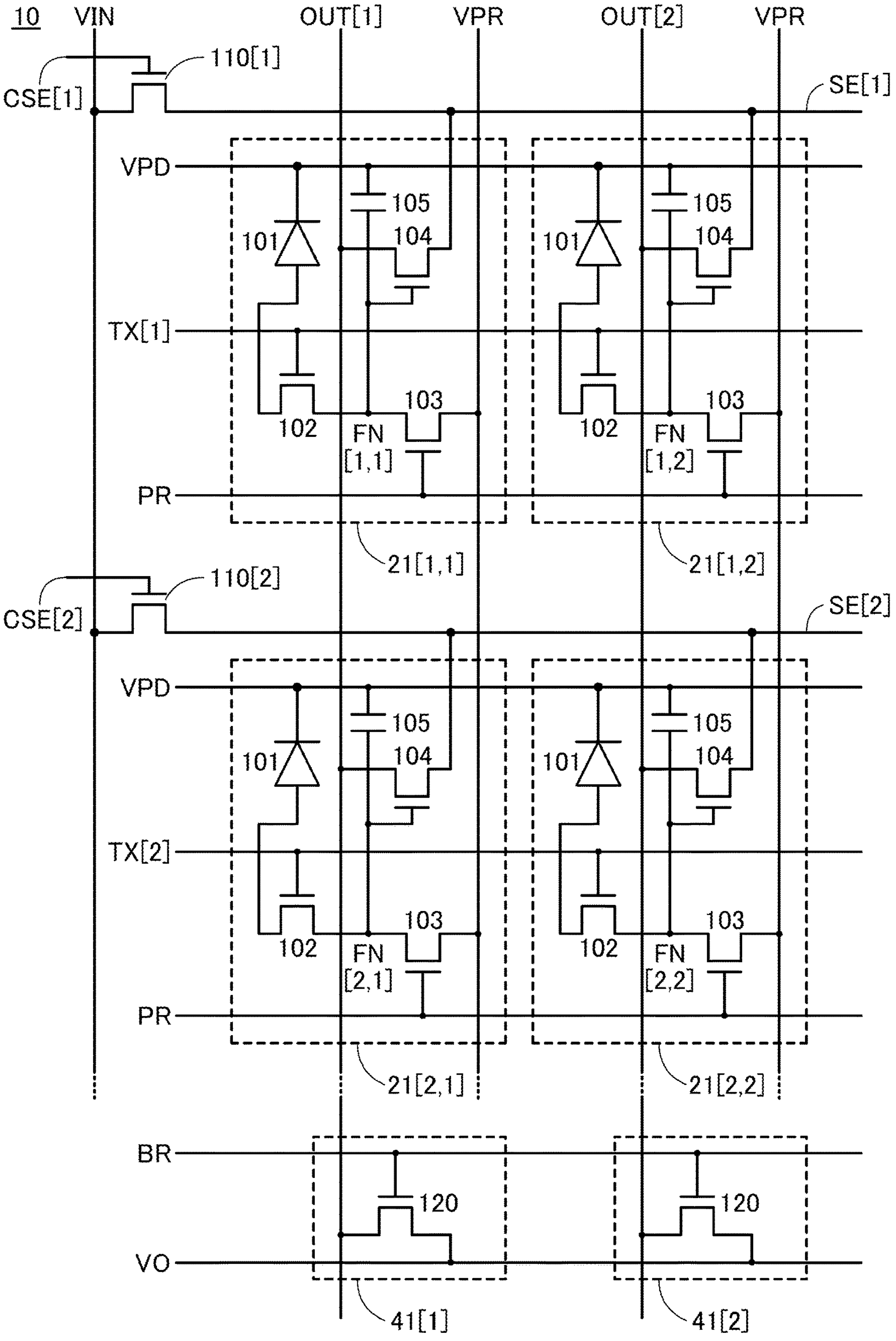
FIG. 3 is a circuit diagram illustrating a structure example of a semiconductor device.

Described here is an operation example of the pixels 21[1,1] and 21[1,2] in the first row and the pixels 21[2,1] and 21[2,2] in the second row shown in FIG. 3. In FIG. 3, a wiring TX[1] and a wiring TX[2] respectively denote the wiring TX connected to the pixels 21[1,1] and 21[1,2] and the wiring TX connected to the pixels 21[2,1] and 21[2,2]. A transistor 110[1] and a transistor 110[2] respectively denote the transistor 110 connected to the wiring SE[1] and the transistor 110 connected to the wiring SE[2]. A wiring CSE[1] and a wiring CSE[2] respectively denote the wiring CSE connected to the transistor 110[1] and the wiring CSE connected to the transistor 110[2]. In addition, a node FN[1,1], a node FN[1,2], a node FN[2,1], and a node FN[2,2] respectively denote the nodes FN included in the pixels 21[1,1], 21[1,2], 21[2,1], and 21[2,2]. In addition, a circuit 41[1] and a circuit 41[2] respectively denote the circuit 41 connected to the wiring OUT[1] and the circuit 41 connected to the wiring OUT[2].

Figure 4:
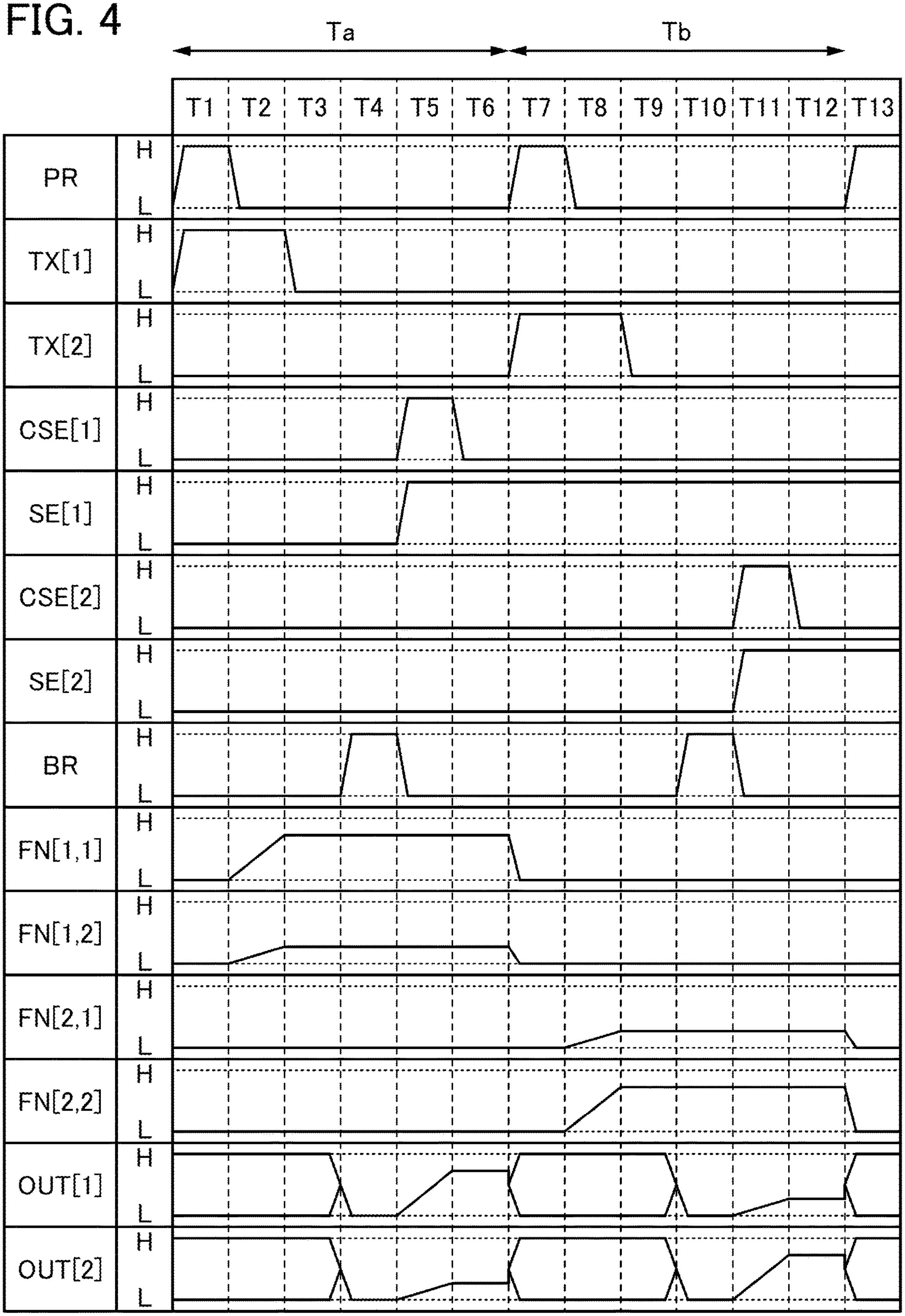
FIG. 4 is a timing chart.

FIG. 4 is a timing chart of the semiconductor device 10 shown in FIG. 3. Note that a period Ta and a period Tb in FIG. 4 are periods for reset, light exposure, and reading in the first-row pixels and the second-row pixels, respectively.

First, in a period T1, the potential of the wiring PR is set high, and the transistors 103 are turned on in all the pixels 21 and the potential of the wiring VPR (low potential) is supplied to the node FN; accordingly, the potentials of the nodes FN[1,1], FN[1,2], FN[2,1], and FN[2,2] are reset to low. The transistors 104 are turned off in all the pixels 21. The pixels 21[1,1], 21[1,2], 21[2,1], and 21[2,2] are reset by the operation.

In addition, in the pixel T1, the potential of the wiring TX[1] is set high to turn on the transistors 102 of the pixels 21[1,1] and 21[1,2], so that the photoelectric conversion element 101 is electrically connected to the node FN.

Next, in a period T2, the potential of the wiring PR is set low to turn off the transistors 103 of all the pixels 21, and the node FN is in a floating state. Then, the potentials of the nodes FN[1,1] and FN[1,2] increase in accordance with the amount of irradiation light of the photoelectric conversion element 101. In this example, an increase in the potential of the node FN[1,1] is larger than that of the node FN[1,2]. By the operation, irradiation light of the photoelectric conversion element 101 is converted into an electrical signal and light exposure in the pixels 21[1,1] and 21[1,2] is performed; accordingly, the period T2 is also referred to as a period for light exposure in the pixels 21[1,1] and 21[1,2].

Next, in a period T3, the potential of the wiring TX[1] is set low to turn off the transistors 102 of the pixels 21[1,1] and 21[1,2]; thus, the potentials of the node FN[1,1] and the node FN[2,2] are held and the period for light exposure in the pixels 21[1,1] and 21[1,2] ends.

Then, in a period T4, the potential of the wiring BR is set high to turn the transistor 120 on, and the potential of the wiring VO is supplied to the wiring OUT[1] and the wiring OUT[2]. The potential of the wiring VO is low in this example, and accordingly the potentials of the wiring OUT [1] and the wiring OUT[2] are low.

Then, in a period T5, the potential of the wiring BR is set low to turn the transistor 120 off. In addition, the potential of the wiring CSE[1] is set high to turn the transistor 110[1] on. The potential of the wiring VIN is thus supplied to the wiring SE[1], and the potential of the wiring SE[1] becomes high.

Although the potential of the wiring OUT is controlled by changing the potential of the wiring BR in this example, a predetermined potential may be continuously supplied to wiring BR. In that case, the transistor 120 serves as a current source and the potential of the wiring OUT is determined in accordance with the potential of the wiring BR.

In this example, the wiring SE[1] serves as a power source line for the pixels 21[1,1] and 21[1,2]. Specifically, the potential of the wiring SE[1] is supplied to the transistor 104 serving as an amplifier transistor. Accordingly, the potentials of the wirings OUT[1] and OUT[2] become potentials corresponding to the potentials of the nodes FN[1,1] and FN[1,2], respectively. The potentials of the wirings OUT[1] and OUT[2] correspond to optical data signals of the pixels 21[1,1] and 21[1,2], respectively. The transistor 110[1] in the period T5 serves as a selection transistor for selecting the pixels 21 from which an optical data signal is read.

In addition, the pixels 21[2,1] and 21[2,2] are reset in the period T5. Specifically, the nodes FN[2,1] and FN[2,2] are low and the transistors 104 of the pixels 21[2,1] and 21[2,2] are off; accordingly, the wiring SE[2] is not electrically connected to the wirings OUT[1] and OUT[2]. This can suppress potential changes of the wirings OUT[1] and OUT[2] caused by the potential of the wiring SE[2] when optical data signals are read from the pixels 21[1,1] and 21[1,2].

Next, in a period T6, the potential of the wiring CSE[1] is set low to turn the transistor 110[1] off. The supply of power source potential to the wiring SE[1] is accordingly stopped, and the reading of optical data signals ends.

Through the operation, reset, light exposure and reading are performed in the first-row pixels.

Next, in a period T7, the potential of the wiring PR is set high, and the transistors 103 are turned on in all the pixels 21 and the potential of the wiring VPR (low potential) is supplied to the node FN; accordingly, the potentials of the nodes FN[1,1], FN[1,2], FN[2,1], and FN[2,2] are reset to low. The transistors 104 are turned off in all the pixels 21. The pixels 21[1,1], 21[1,2], 21[2,1], and 21[2,2] are reset by the operation.

In addition, in the pixel T7, the potential of the wiring TX[2] is set high to turn on the transistors 102 of the pixels 21[2,1] and 21[2,2], so that the photoelectric conversion element 101 is electrically connected to the node FN.

Next, in a period T8, the potential of the wiring PR is set low to turn off the transistors 103 of all the pixels 21, and the node FN is in a floating state. Then, the potentials of the nodes FN[2,1] and FN[2,2] increase in accordance with the amount of irradiation light of the photoelectric conversion element 101. In this example, an increase in the potential of the node FN[2,1] is smaller than that of the node FN[2,2]. By the operation, irradiation light of the photoelectric conversion element 101 is converted into an electrical signal and light exposure in the pixels 21[2,1] and 21[2,2] is performed; accordingly, the period T8 is also referred to as a period for light exposure in the pixels 21[2,1] and 21[2,2].

Next, in a period T9, the potential of the wiring TX[2] is set low to turn off the transistors 102 of the pixels 21[2,1] and 21[2,2]; thus, the potentials of the node FN[2,1] and the node FN[2,2] are held and the period for light exposure in the pixels 21[2,1] and 21[2,2] ends.

Then, in a period T10, the potential of the wiring BR is set high to turn the transistor 120 on, and the potential of the wiring VO is supplied to the wiring OUT[1] and the wiring OUT[2]. The potential of the wiring VO is low in this example, and accordingly the potentials of the wiring OUT [1] and the wiring OUT[2] are low.

Then, in a period T11, the potential of the wiring BR is set low to turn the transistor 120 off. In addition, the potential of the wiring CSE[2] is set high to turn the transistor 110[2] on. The potential of the wiring VIN is thus supplied to the wiring SE[2], and the potential of the wiring SE[2] becomes high.

Although the potential of the wiring OUT is controlled by changing the potential of the wiring BR in this example, a predetermined potential may be continuously supplied to wiring BR. In that case, the transistor 120 serves as a current source and the potential of the wiring OUT is determined in accordance with the potential of the wiring BR.

In this example, the wiring SE[2] serves as a power source line for the pixels 21[2,1] and 21[2,2]. Specifically, the potential of the wiring SE[2] is supplied to the transistor 104 serving as an amplifier transistor. Accordingly, the potentials of the wirings OUT[1] and OUT[2] become potentials corresponding to the potentials of the nodes FN[2,1] and FN[2,2], respectively. The potentials of the wirings OUT[1] and OUT[2] correspond to optical data signals of the pixels 21[2,1] and 21[2,2], respectively. The transistor 110[2] in the period T11 serves as a selection transistor for selecting the pixels 21 from which an optical data signal is read.

In addition, the pixels 21[1,1] and 21[1,2] are reset in the period T11. Specifically, the nodes FN[1,1] and FN[1,2] are low and the transistors 104 of the pixels 21[1,1] and 21[1,2] are off; accordingly, the wiring SE[1] is not electrically connected to the wirings OUT[1] and OUT[2]. This can suppress potential changes of the wirings OUT[1] and OUT[2] caused by the potential of the wiring SE[1] when optical data signals are read from the pixels 21[2,1] and 21[2,2].

Next, in a period T12, the potential of the wiring CSE[2] is set low to turn the transistor 110[2] off. The supply of power source potential to the wiring SE[2] is accordingly stopped, and the reading of optical data signals ends.

Through the operation, reset, light exposure and reading are performed in the second-row pixels.

Then, in a period T13, the potential of the wiring PR is set high to turn on the transistors 103 in all of the pixels 21, and the potential of the node FN is reset low. Through the operation similar to that described above, light exposure and reading are performed in pixels 21 in the third row and subsequent rows and reset, light exposure, and reading are performed in pixels 21 in the fourth rows and subsequent rows.

As described, in one embodiment of the present invention, the switches for selecting the pixels 21 are shared by the pixels 21 in one row and are provided outside the pixel portion 20. Thus, a switch for selecting the pixels 21 and a power source line connected to the switch need not be provided in the pixel portion 20, which leads to the reduction in the area of the pixel portion 20.

In addition, in one embodiment of the present invention, the wiring VIN functioning as a power source line for selecting the pixels 21 is provided outside the pixel portion 20. Thus, if the wiring VIN is formed using a wiring different from a wiring (e.g., the wiring VPR) connected to the pixels 21, the area of the pixel portion 20 is not increased. Since a potential different from that supplied to the power source line connected to the pixels 21 can be thus supplied to the wiring VIN, a power potential used for reading an optical data signal can be freely determined, which leads to an improvement of the freedom degree of design and the versatility of the semiconductor device 10.

In this embodiment, embodiments of the present invention are described. Note that one embodiment of the present invention is not limited to them. In other words, since various embodiments of the invention are described in this embodiment, one embodiment of the present invention is not limited to a particular embodiment. For example, one embodiment of the present invention is not limited to the above-described example of a semiconductor device in which a switch that is shared by pixels in one row is provided outside a pixel portion. Depending on circumstances or situations, one embodiment of the present invention may include a structure in which the switch is not shared by pixels in one row or the switch is provided inside the pixel portion. In addition, one embodiment of the present invention is not limited to the above-described example of a semiconductor device in which a power source line connected to a shared switch is different from a power source line connected to pixels. Depending on circumstances or situations, one embodiment of the present invention may include a structure in which these power source lines are the same line.

Although light exposure is performed row by row in this embodiment, a global shutter system that performs light exposure in pixels 21 in several rows (pixels 21 in all the rows at a maximum) at the same time and then performs row-by-row reading sequentially can be employed, in which case distortion-free images can be obtained. However, in a global shutter system, time from exposure to reading, i.e., a period when charge is retained in the node FN, varies depending on the row where the pixels 21 are provided. Therefore, potential change of the node FN caused by time passage is preferably small when a global shutter system is employed. Here, if an OS transistor is used in the pixel 21, charge stored in the node FN can be retained for an extremely long time; therefore, an optical data signal can be accurately read even when a global shutter system is employed.

This embodiment can be combined with any other embodiment as appropriate. Content (or may be part of the content) described in one embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. The same can be applied to any other embodiment

Embodiment 2

In this embodiment, structure examples of a pixel of one embodiment of the present invention are described.

<Layout Example of Pixels>

Figure 5:
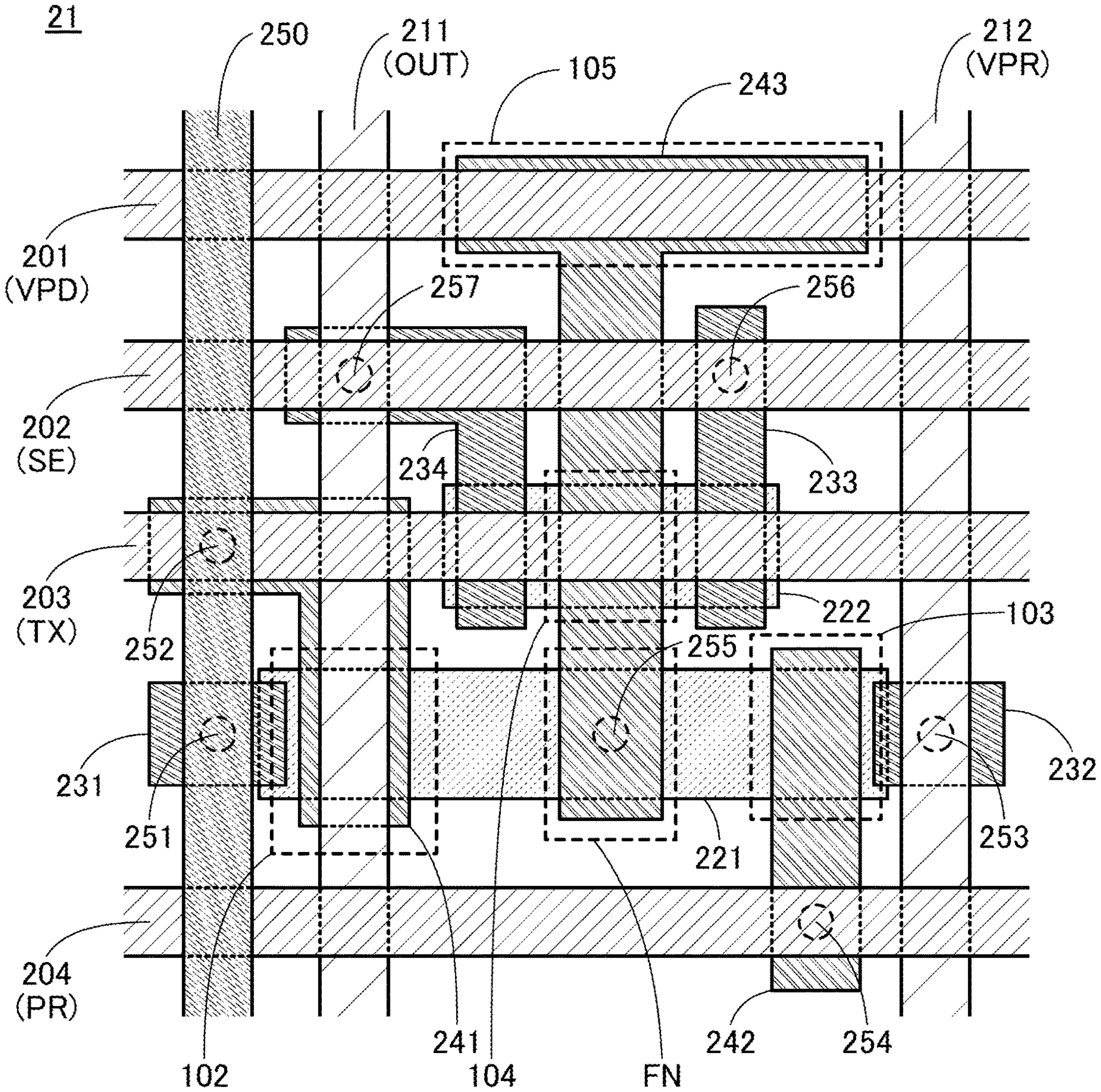
FIG. 5 is a diagram illustrating a structure example of a pixel.

FIG. 5 is a layout example of the pixel 21, which can be used in the above embodiment. Note that the wirings, conductive layers, and semiconductor layers using the same hatch pattern in FIG. 5 can be formed using the same material in the same process. The pixel 21 in FIG. 5 includes the transistors 102, 103, and 104 and the capacitor 105. Detailed description of connection relationship between the elements is skipped because the description of FIG. 2 can be referred to. Although the photoelectric conversion element 101 is not shown in FIG. 5, the photoelectric conversion element 101 is connected to a conductive layer 250.

A semiconductor layer 221 serves as an active layer of the transistors 102 and 103. That is, the semiconductor layer 221 is shared by the transistors 102 and 103. A semiconductor layer 222 serves as an active layer of the transistor 104.

The semiconductor layer 221 is connected to conductive layers 231 and 232. The conductive layer 231 is connected to a conductive layer 250 through an opening 251. The conductive layer 232 is connected to a conductive layer 212 through an opening 253. The semiconductor layer 221 is connected to a conductive layer 243 through an opening 255.

The conductive layer 231 functions as the one of the source and drain of the transistor 102. The conductive layer 232 functions as the one of the source and drain of the transistor 103. The conductive layer 243 functions as the other of the source and drain of the transistor 102, the other of the source and drain of the transistor 103, the gate of the transistor 104, and the one electrode of the capacitor 105.

The semiconductor layer 222 is connected to conductive layers 233 and 234. The conductive layer 233 is connected to a conductive layer 202 through an opening 256. The conductive layer 234 is connected to a conductive layer 211 through an opening 257.

The conductive layer 233 functions as the one of the source and drain of the transistor 104. The conductive layer 234 functions as the other of the source and drain of the transistor 104.

The conductive layers 212, 202, and 211 correspond to the wirings VPR, SE, and OUT, respectively. A node connected to the semiconductor layer 221 and the conductive layer 243 corresponds to the node FN.

Single crystal semiconductor layers, non-single crystal semiconductor layers, and the like can be used as the semiconductor layers 221 and 222, and an oxide semiconductor layer is preferably used, in which case the transistors 102 to 104 become OS transistors.

A conductive layer 241 is connected to the conductive layer 203 through an opening 252. The conductive layer 241 serves as the gate of the transistor 102. Note that the conductive layer 241 may be included in the conductive layer 203. The conductive layer 203 corresponds to the wiring TX.

A conductive layer 242 is connected to the conductive layer 204 through an opening 254. The conductive layer 242 serves as the gate of the transistor 103. Note that the conductive layer 242 may be included in the conductive layer 204. The conductive layer 204 corresponds to the wiring PR.

A conductive layer 201 includes a region overlapping with the conductive layer 243 with an insulating layer provided therebetween (not shown). The conductive layer 201 serves as the other electrode of the capacitor 105 and corresponds to the wiring VPD.

Although each of the transistors 102 to 104 in FIG. 5 is a top-gate transistor, each of them may be a top-gate transistor or a bottom-gate transistor.

Although the semiconductor layers 221 and 222, the conductive layers 231 to 234, the conductive layers 241 to 243, the conductive layers 211 and 212, the conductive layers 201 to 204, and the conductive layer 250 are stacked in this order in FIG. 5, their stacking order can be freely determined without limitation thereto.

<Modification Example of Pixel>

Next, a modification example of the pixel 21, which is described in Embodiment 1, is shown.

Figure 6A:
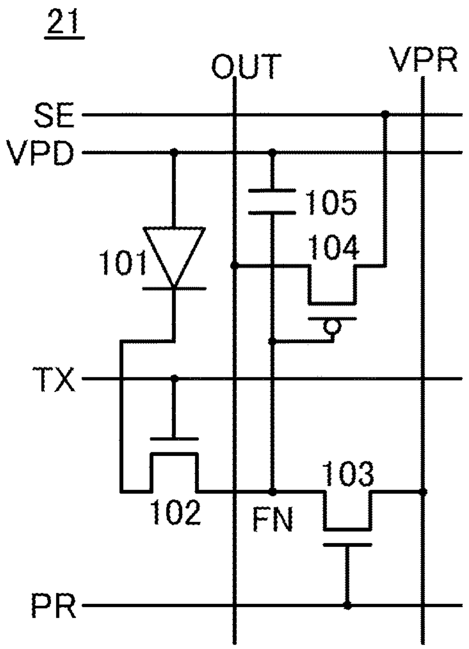
FIGS. 6A, 6B, 6C, and 6D are circuit diagrams each illustrating a structure example of a pixel.

The pixel 21 may have a configuration illustrated in FIG. 6A. The pixel 21 in FIG. 6A differs from that in FIG. 2 in that the anode and the cathode of the photoelectric conversion element 101 are respectively connected to the wiring VPD and one of the source and drain of the transistor 102. In FIG. 6A, the wirings VPD and VPR are a low-potential power source line and a high-potential power source line, respectively.

Note that in one embodiment of the present invention, the transistor 104 is preferably turned off by the supply of the potential of the wiring VPR as a reset potential to the node FN. Accordingly, it is preferable that the transistor 104 be a p-channel transistor in FIG. 6A and be turned off by the supply of a high-level potential from the wiring VPR to the node FN.

Figure 6B:
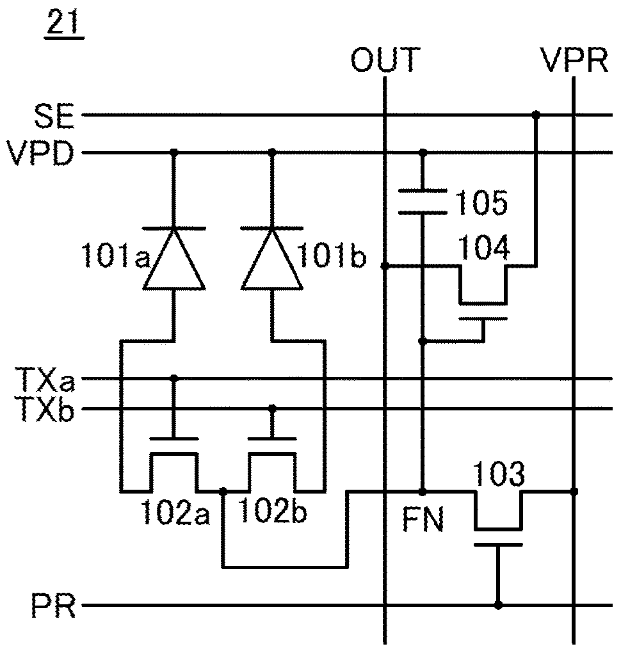

Further, the pixel 21 may have a configuration illustrated in FIG. 6B. The pixel 21 shown in FIG. 6B is different from the structure in FIG. 2 in that a plurality of photoelectric conversion elements 101 and a plurality of transistors 102 are included. A first terminal and a second terminal of a photoelectric conversion element 101*a* are connected to one of a source and drain of a transistor 102*a* and the wiring VPD, respectively. A first terminal and a second terminal of a photoelectric conversion element 101*b* are connected to one of a source and drain of a transistor 102*b* and the wiring VPD, respectively. A gate of the transistor 102*a* and a gate of the transistor 102*b* are connected to a wiring TXa and a wiring TXb, respectively. The other of the source and drain of the transistor 102*a* and the other of the source and drain of the transistor 102*b* are connected to the node FN.

The gate of the transistor 102*a* and the gate of the transistor 102*b* are connected to the different wirings, whereby exposure by the photoelectric conversion element 101*a* and that by the photoelectric conversion element 101*b* are separately controlled. With such a structure, exposure can be performed with the use of the two photoelectric conversion elements in one pixel. Note that there is no particular limitation on the number of the photoelectric conversion elements provided in the pixel 21, and three or more photoelectric conversion elements may be provided.

Figure 6C:
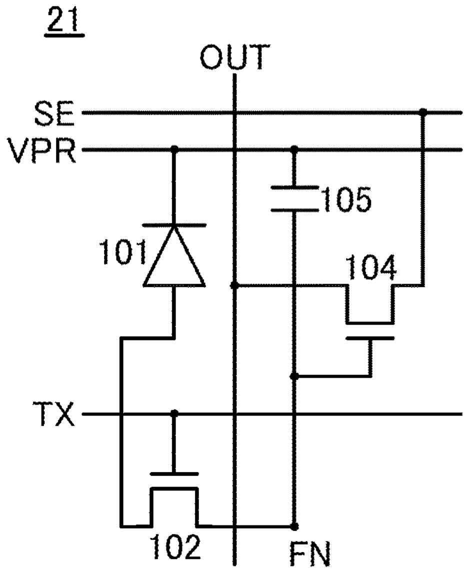

The pixel 21 may have a configuration illustrated in FIG. 6C. In the circuit configuration in FIG. 6C, the transistor 103 is omitted from the circuit in FIG. 2. The anode and the cathode of the photoelectric conversion element 101 are connected to one of the source and drain of the transistor 102 and the wiring VPR, respectively.

In order to reset the pixel 21 (this operation corresponds to the operation in the periods T1 and T7 shown in FIG. 4, for example), the potentials of the wirings VPR and TX are set low and high, respectively. The forward bias is accordingly applied to the photoelectric conversion element 101 to reset the potential of the node FD to low. After the reset of the node FD, the potential of the wiring VPR is set high.

Figure 6D:
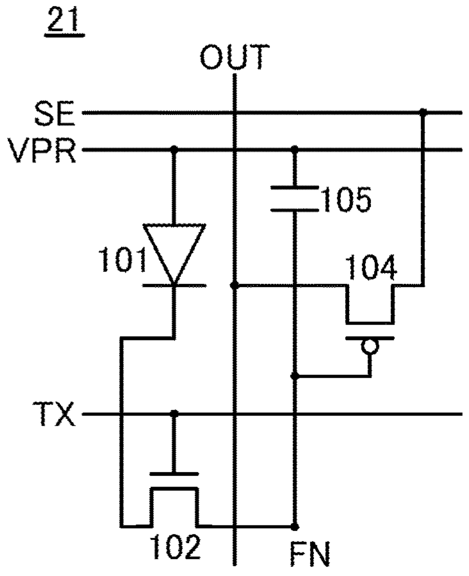

The pixel 21 may have a configuration illustrated in FIG. 6D. The pixel 21 in FIG. 6D differs from the pixel 21 in FIG. 6C in that the anode and the cathode of the photoelectric conversion element 101 are connected to the wiring VPD and one of the source and drain of the transistor 102, respectively.

In order to reset the pixel 21 (this operation corresponds to the operation in the periods T1 and T7 shown in FIG. 4, for example), the potentials of the wirings VPR and TX are set high. The forward bias is accordingly applied to the photoelectric conversion element 101 to reset the potential of the node FD to high. After the reset of the node FD, the potential of the wiring VPR is set low.

Note that in one embodiment of the present invention, the transistor 104 is preferably turned off by the supply of the potential of the wiring VPR as a reset potential to the node FN. Accordingly, it is preferable that the transistor 104 be a p-channel transistor in FIG. 6D and be turned off by the reset of the potential of the node FN to high.

Figure 7A:
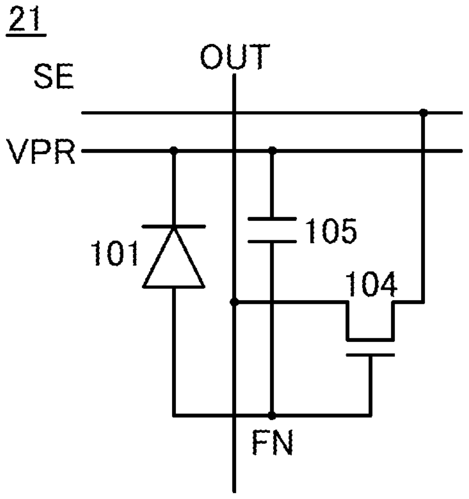
FIGS. 7A and 7B are circuit diagrams each illustrating a structure example of a pixel.
Figure 7B:
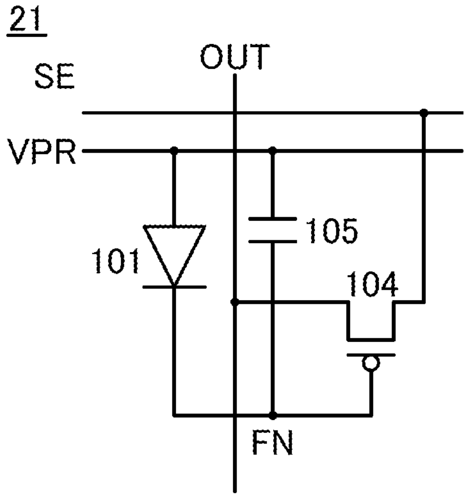

The transistor 102 can be omitted from FIG. 2. FIGS. 7A and 7B show configurations in which the transistor 102 is omitted from FIG. 2 and FIG. 6A, respectively.

A transistor used for the pixel 21 may include a second gate electrode (hereinafter, also referred to as a back gate) in addition to a first gate electrode (hereinafter, also referred to as a front gate). FIGS. 8A to 8D show configurations in which each of the transistors 102, 103, and 104 includes a back gate.

Figure 8A:
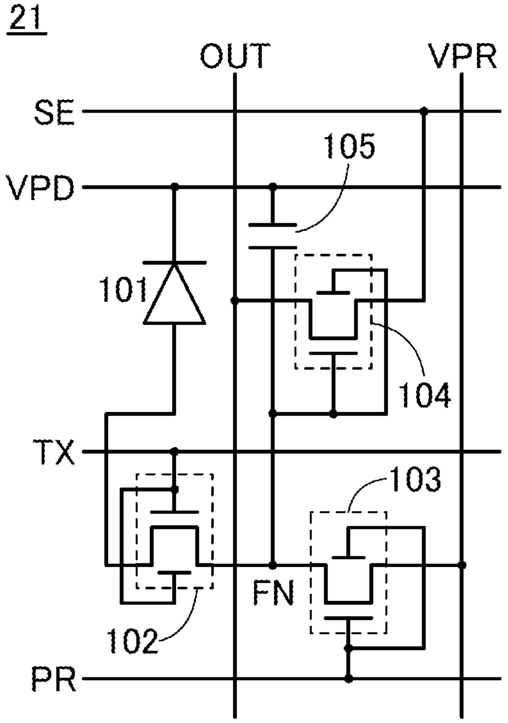
FIGS. 8A, 8B, 8C, and 8D are circuit diagrams each illustrating a structure example of a pixel.
Figure 8B:
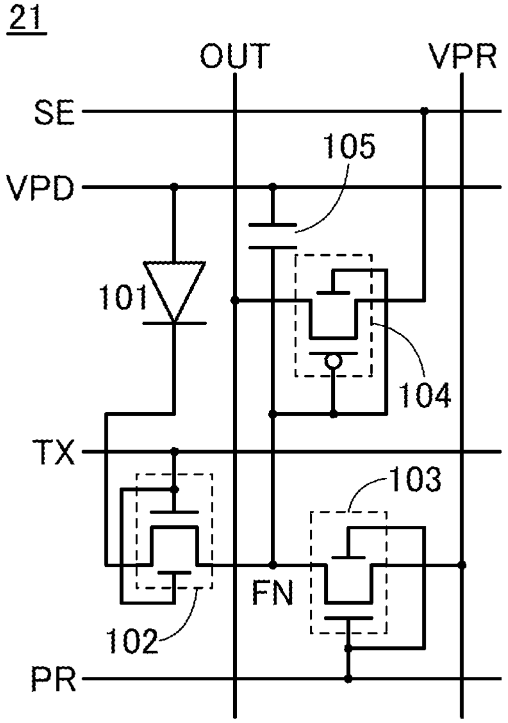

FIG. 8A shows a configuration in which each of the transistors 102, 103, and 104 shown in FIG. 2 includes a back gate connected to a front gate so that the same potential can be supplied to the back gate and the front gate. FIG. 8B shows a configuration in which each of the transistors 102, 103, and 104 shown in FIG. 6A includes a back gate connected to a front gate so that the same potential can be supplied to the back gate and the front gate. Such configurations can increase on-state current of the transistors 102, 103, and 104, leading to high-speed image taking.

Figure 8C:
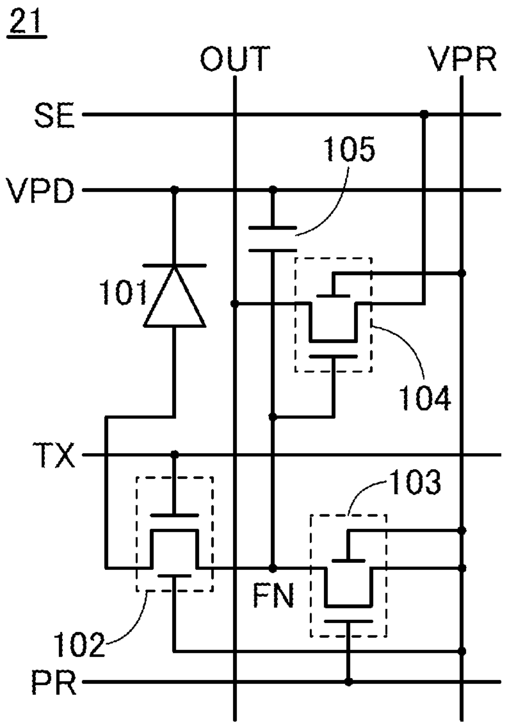
Figure 8D:
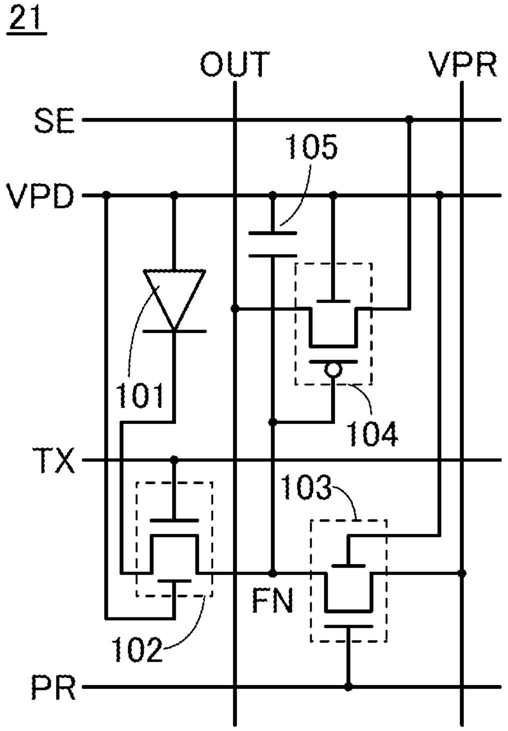

FIG. 8C is a configuration in which each of the transistors 102, 103, and 104 in FIG. 2 includes a back gate connected to the wiring VPR so that a constant potential can be supplied to the back gate. A ground potential is supplied to the wiring VPR in FIG. 8C. FIG. 8D is a configuration in which each of the transistors 102, 103, and 104 in FIG. 6A includes a back gate connected to the wiring VPD so that a constant potential can be supplied to the back gate. A ground potential is supplied to the wiring VPD in FIG. 8D. Such configurations can control threshold voltages of the transistors 102, 103, and 104, leading to highly reliable image taking.

Although each of the back gates of the transistors 102, 103, and 104 is connected to the wiring VPR in FIG. 8C and each of the back gates of the transistors 102, 103, and 104 is connected to the wiring VPD in FIG. 8D, the back gates may be connected to other wirings to which a constant potential is supplied. A back gate can be provided similarly in the pixels 21 shown in FIGS. 6B to 6D and FIGS. 7A and 7B.

As each of the transistors 102, 103, and 104, any of a transistor in which the same potential is supplied to a back gate and a front gate, a transistor in which a constant potential is supplied to a back gate, and a transistor in which a back gate is not provided can be used. In other words, one pixel 21 can include two or more different kinds of transistors.

Figure 9:
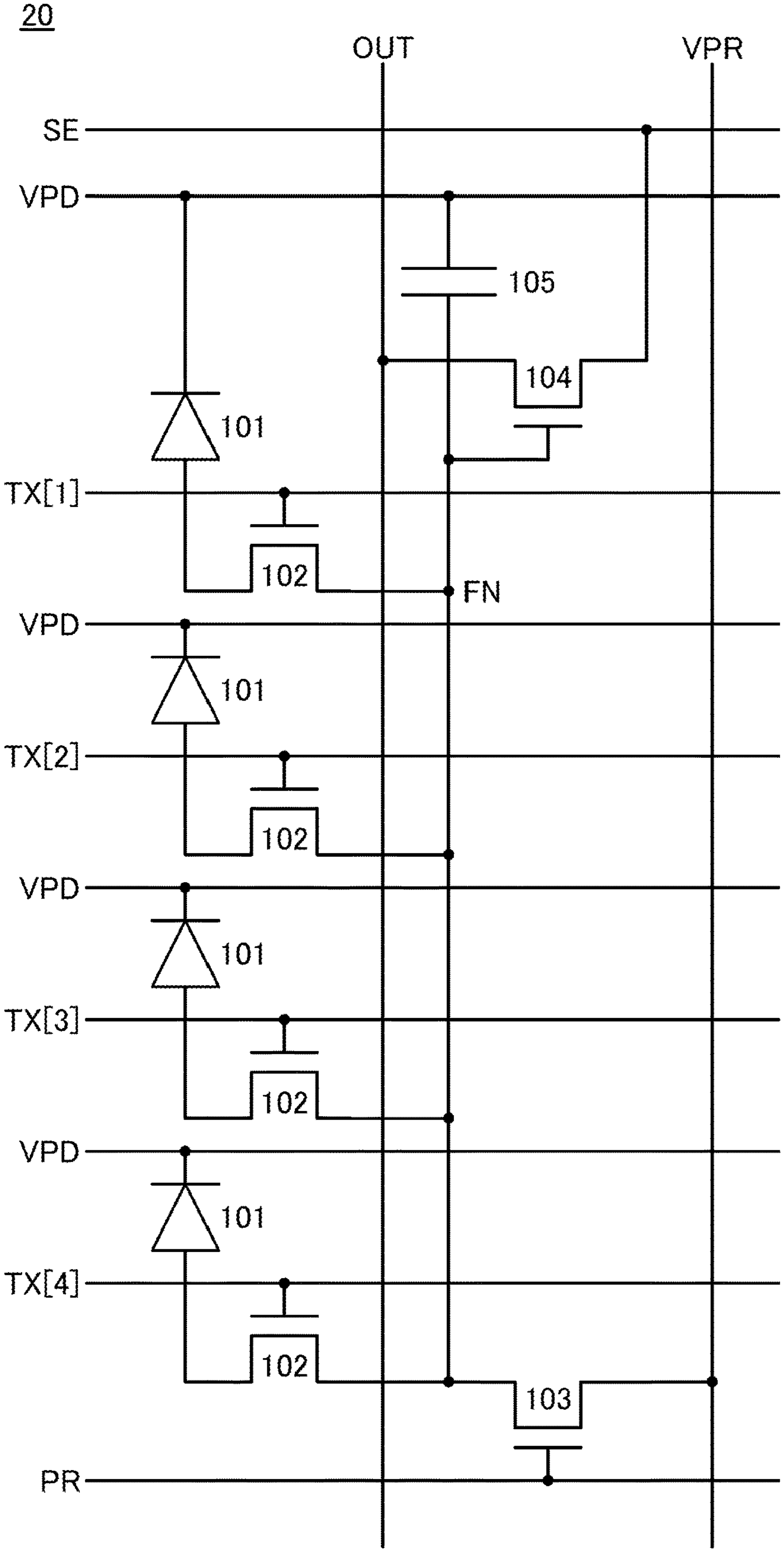
FIG. 9 is a circuit diagram illustrating a structure example of a pixel portion.

In FIG. 2, FIGS. 6A to 6D, FIGS. 7A and 7B, and FIGS. 8A to 8D, elements included in the pixel 21 can be shared by a plurality of pixels. FIG. 9 shows a structure of the pixel portion 20 in which the transistors 103 and 104 and the capacitor 105 in FIG. 2 are shared by four pixels 21. In FIG. 9, the four transistors 102 are connected to the node FN, and the node FN is connected to the transistors 103 and 104 and the capacitor 105. Such a structure can reduce the number of elements in the pixel portion 20.

Although a transistor and a capacitor are shared by pixels 21 in different rows in FIG. 9, a transistor and/or a capacitor may be shared by pixels 21 in different columns. In addition, although the transistors 103 and 104 and the capacitor 105 are shared by four pixels, the number of pixels sharing the elements is not limited to four and may be two, three, five, or more. The same applies to the pixels 21 in FIGS. 6A to 6D, FIGS. 7A and 7B, FIGS. 8A to 8D.

The configurations shown in FIG. 2, FIGS. 6A to 6D, FIGS. 7A and 7B, FIGS. 8A to 8D, and FIG. 9 can be freely combined.

This embodiment can be combined with any other embodiment as appropriate.

Embodiment 3

In this embodiment, an imaging device including the semiconductor device of one embodiment of the present invention is described.

Figure 10:
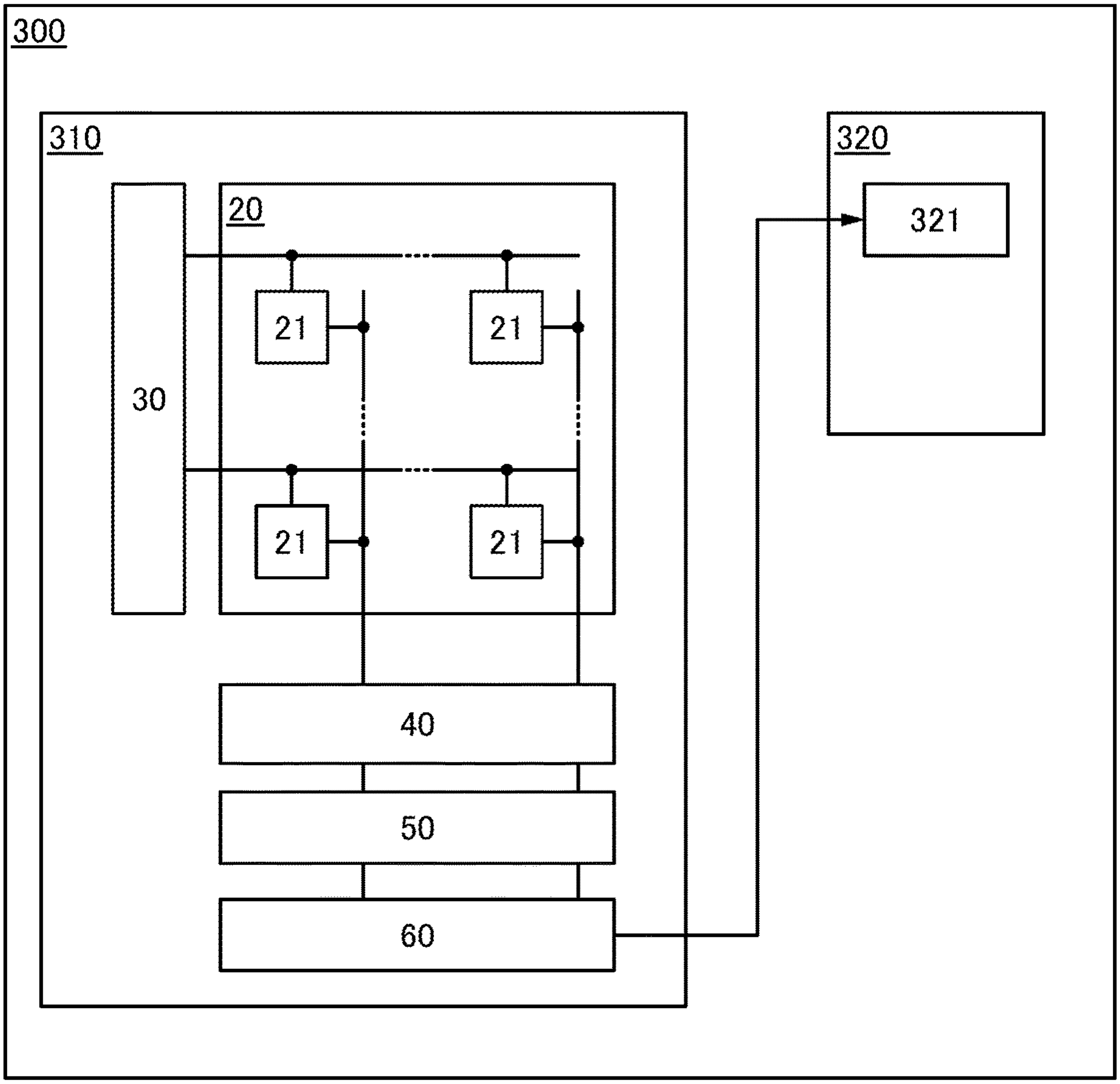
FIG. 10 is a diagram illustrating a structure example of an imaging device.

FIG. 10 illustrates a structure example of an imaging device 300. The imaging device 300 includes a photodetector portion 310 and a data processing portion 320.

The photodetector portion 310 includes circuits 20, 30, 40, 50, and 60. The pixel portion and the circuit described in the above embodiments can be used for the pixel portion 20 and the circuits 30 and 40.

The circuit 50 has a function of converting an analog signal input from the circuit into a digital signal. The circuit 50 can be composed of an A/D converter and the like.

The circuit 60 is a driving circuit having a function of reading a digital signal input from the circuit 50. The circuit 60 includes a selection circuit. The selection circuit can be formed using a transistor. The transistor can be an OS transistor or the like.

The data processing portion 320 includes a circuit 321. The circuit 321 has a function of generating image data with the use of the digital signal corresponding to the difference data generated in the photodetector portion 310.

The circuit 20 may include a circuit having a function of displaying an image. With such a structure, the imaging device 300 can serve as a touch panel.

Next, an example of a driving method of the imaging device 300 in FIG. 10 is described.

First, an optical data signal is generated in the pixels 21 in a manner described in Embodiment 1. The optical data signal generated in the pixels 21 is output to the circuit 40. Then, the circuit 40 converts the optical data signal into an analog signal and outputs to the circuit 50.

The analog signal output from the circuit 40 is converted into a digital signal in the circuit 50, and the digital signal is output to the circuit 60. The circuit 60 reads the digital signal. The digital signal read in the circuit 60 is used for processing in the circuit 321 and the like.

This embodiment can be combined with any other embodiment as appropriate.

Embodiment 4

In this embodiment, structure examples of an element that can be used in the semiconductor device 10 are described.

Figure 11A:
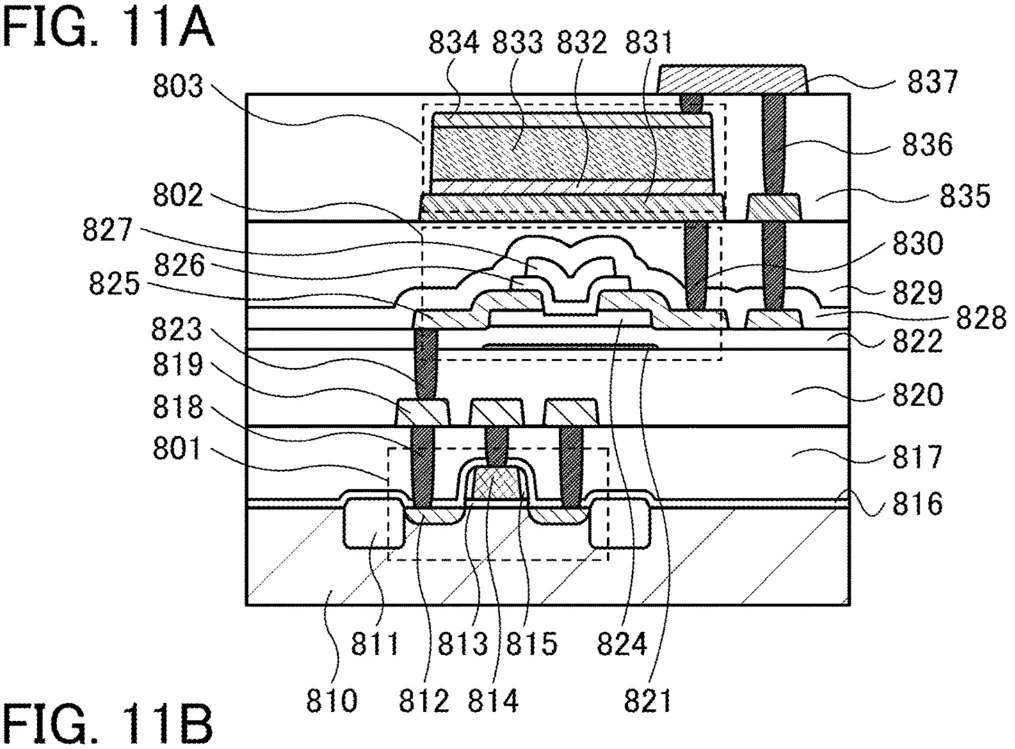
FIGS. 11A, 11B, and 11C are diagrams each illustrating a cross-sectional structure example of a semiconductor device.
Figure 11B:
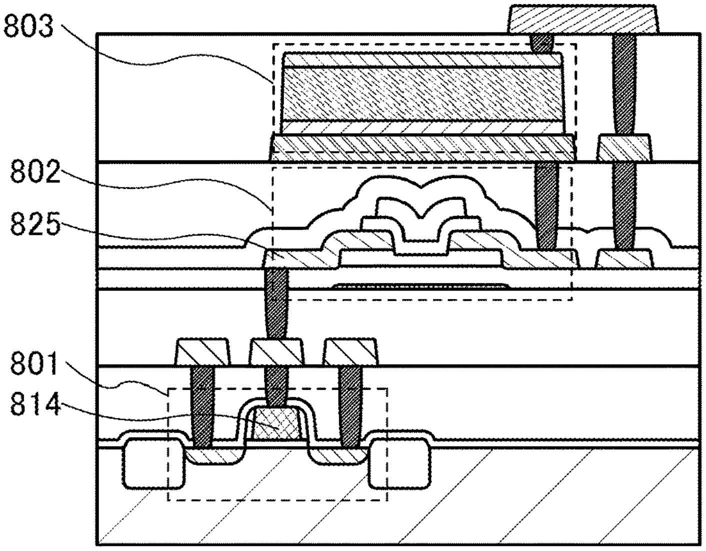
Figure 11C:
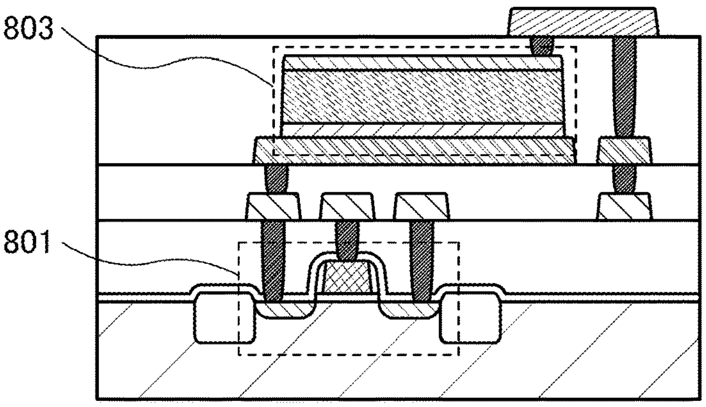

FIGS. 11A to 11C show structure examples of transistors and a photoelectric conversion element that can be used in the semiconductor device 10. A photodiode is used as the photoelectric conversion element, as an example, in this embodiment.

Structure Example 1

FIG. 11A shows a structure example of a transistor 801, a transistor 802, and a photodiode 803. The transistor 801 is connected to the transistor 802 through a wiring 819 and a conductive layer 823, and the transistor 802 is connected to the photodiode 803 through a conductive layer 830.

The transistors 801 and 802 can be freely used as the transistors shown in FIG. 2, FIG. 3, FIGS. 6A to 6D, FIGS. 7A and 7B, FIGS. 8A to 8D, and FIG. 9 and other transistors included in the semiconductor device 10. For example, the transistor 801 the transistor 802 can be used as the transistors 110 and 120 and the like in FIG. 2 and FIG. 3, the transistor 102 to 104 and the like in FIG. 2, FIG. 3, FIGS. 6A to 6D, FIGS. 7A and 7B, FIGS. 8A to 8D, and FIG. 9, respectively. The photodiode 803 can be used as the photoelectric conversion element 101 in FIG. 2, FIG. 3, FIGS. 6A to 6D, FIGS. 7A and 7B, FIGS. 8A to 8D, and FIG. 9.

[Transistor 801]

First, the transistor 801 is described.

The transistor 801 is formed using a semiconductor substrate 810 and includes element separation layers 811 over the semiconductor substrate 810 and impurity regions 812 formed in the semiconductor substrate 810. The impurity regions 812 have a function as a source region and a drain region of the transistor 801, and a channel region is formed between the impurity regions 812. The transistor 801 further includes an insulating layer 813 and a conductive layer 814. The insulating layer 813 has a function as a gate insulating layer of the transistor 801, and the conductive layer 814 has a function as a gate electrode of the transistor 801. Note that a side wall 815 may be formed on the side surface of the conductive layer 814. Furthermore, an insulating layer 816 having a function as a protective layer and an insulating layer 817 having a function as a planarization film can be formed over the conductive layer 814.

A silicon substrate is used as the semiconductor substrate 810. Note that germanium, silicon germanium, silicon carbide, gallium arsenide, aluminum gallium arsenide, indium phosphide, gallium nitride, or an organic semiconductor besides silicon can be used as a material of the substrate.

The element separation layer 811 can be formed by a local oxidation of silicon (LOCOS) method, a shallow trench isolation (STI) method, or the like.

The impurity regions 812 include an impurity element imparting conductivity to the material of the semiconductor substrate 810. When a silicon substrate is used as the semiconductor substrate 810, phosphorus, arsenic, or the like is used as the impurity imparting n-type conductivity; and boron, aluminum, gallium, or the like is used as the impurity imparting p-type conductivity. The impurity element can be added to a predetermined region of the semiconductor substrate 810 by an ion implantation method, an ion doping method, or the like.

The insulating layer 813 can be formed using an insulating layer containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 813 may be formed using stacked insulating layers each containing one or more of the above materials.

The conductive layer 814 can be formed using a conductive film of aluminum, titanium, chromium, cobalt, nickel, copper, yttrium, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials.

The insulating layer 816 can be formed using an insulating layer containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 816 may be formed using stacked insulating layers each containing one or more of the above materials.

An organic material such as an acrylic resin, an epoxy resin, a benzocyclobutene resin, polyimide, or polyamide can be used for the insulating layer 817. Alternatively, the insulating layer 817 may be formed using stacked insulating layers each containing one or more of the above materials. A material similar to the material of the insulating layer 816 can be used for the insulating layer 817.

Note that the impurity region 812 can be connected to the wiring 819 via a conductive layer 818.

[Transistor 802]

Next, the transistor 802 is described. The transistor 802 is an OS transistor.

The transistor 802 includes an oxide semiconductor layer 824 over an insulating layer 822, conductive layers 825 over the oxide semiconductor layer 824, an insulating layer 826 over the conductive layers 825, and a conductive layer 827 over the insulating layer 826. The conductive layers 825 have a function as a source electrode and a drain electrode of the transistor 802. The insulating layer 826 has a function as a gate insulating layer of the transistor 802. The conductive layer 827 has a function as a gate electrode of the transistor 802. Furthermore, an insulating layer 828 having a function as a protective layer and an insulating layer 829 having a function as a planarization film can be formed over the conductive layer 827.

A conductive layer 821 may be formed under the insulating layer 822. In that case, the conductive layer 821 has a function as a back gate electrode of the transistor 802. In the case where the conductive layer 821 is formed, the conductive layer 821 can be formed over the insulating layer 820 that is formed over the wiring 819. Alternatively, part of the wiring 819 may serve as a back gate electrode of the transistor 802. An OS transistor with a back gate electrode can be used for the transistors 102 to 104 in FIGS. 8A to 8D.

When a transistor T includes a pair of gates that sandwiches a semiconductor film as in the transistor 802, one of the gates may be supplied with a signal A and the other of the gates may be supplied with a fixed potential Vb.

The signal A is, for example, a signal for controlling the on/off state. The signal A may be a digital signal with two kinds of potentials, V1 and V2 (V1>V2). For example, the potential V1 may be a high power source potential and the potential V2 may be a low power source potential. The signal A may be an analog signal.

The fixed potential Vb is, for example, a potential for controlling a threshold voltage VthA of the transistor T. The fixed potential Vb may be the potential V1 or the potential V2. In that case, a potential generator circuit for generating the fixed potential Vb is not necessary, which is preferable. The fixed potential Vb may be different from the potential V1 or the potential V2. When the fixed potential Vb is low, the threshold voltage VthA can be increased in some cases. As a result, a drain current of when a voltage Vgs between the gate and a source is 0 V can be reduced and a leakage current of the circuit including the transistor T can be reduced in some cases. The fixed potential Vb may be, for example, lower than the low power source potential. When the fixed potential Vb is high, the threshold voltage VthA may be decreased in some cases. As a result, a drain current of when the voltage Vgs between the gate and the source is VDD can be increased and operation speed of the circuit including the transistor T can be increased in some cases. The fixed potential Vb may be, for example, higher than the low power source potential.

The signal A and a signal B may be applied to one gate and the other gate of the transistor T, respectively. The signal B is, for example, a signal for controlling the on/off state of the transistor T. The signal B may be a digital signal with two kinds of potentials, V3 and V4 (V3>V4). For example, the potential V3 may be the high power source potential and the potential V4 may be the low power source potential. The signal B may be an analog signal.

When both the signal A and the signal B are digital signals, the signal B may have the same digital value as the signal A. In that case, an on-state current of the transistor T may be increased and operation speed of the circuit including the transistor T may be increased in some cases. Here, the potential V1 of the signal A may be different from the potential V3 of the signal B, and the potential V2 of the signal A may be different from the potential V4 of the signal B. For example, if a gate insulating film used with the gate to which the signal B is input is thicker than a gate insulating film used with the gate to which the signal A is input, the potential amplitude of the signal B (V3-V4) can be larger than the potential amplitude of the signal A (V1-V2). In this way, influence of the signal A and that of the signal B on the on/off state of the transistor T can be approximately the same in some cases.

When both the signal A and the signal B are digital signals, the signal B may be a signal with a different digital value from that of the signal A. In that case, the signal A and the signal B can separately control the transistor T, and thus higher performance may be achieved. For example, if the transistor T is an n-channel transistor, the transistor T may be turned on only when the signal A has the potential V1 and the signal B has the potential V3, or may be turned off only when the signal A has the potential V2 and the signal B has the potential V4, in which case the transistor T, a single transistor, may function as a NAND circuit, a NOR circuit, or the like. In addition, the signal B may be a signal for controlling the threshold voltage VthA. For example, the potential of the signal B in a period when the circuit including the transistor T operates may be different from the potential of the signal B in a period when the circuit does not operate. The potential of the signal B may vary depending on operation modes of the circuit. In that case, the potential of the signal B is not switched so often as that of the signal A in some cases.

When both the signal A and the signal B are analog signals, the signal B may be an analog signal with the same potential as that of the signal A, an analog signal with a potential that is a constant multiple of the potential of the signal A, an analog signal with a potential that is higher or lower than the potential of the signal A by a constant, or the like. In that case, an on-state current of the transistor T may be increased and operation speed of the circuit including the transistor T may be increased in some cases. The signal B may be an analog signal different from the signal A. In that case, the signal A and the signal B can separately control the transistor T, and thus higher performance may be achieved.

The signal A and the signal B may be a digital signal and an analog signal, respectively. The signal A and the signal B may be an analog signal and a digital signal, respectively.

A fixed potential Va and a fixed potential Vb may be applied to one gate and the other gate of the transistor T, respectively. When both of the gates of the transistor T are supplied with the fixed potentials, the transistor T can serve as an element equivalent to a resistor in some cases. For example, when the transistor T is an n-channel transistor, effective resistance of the transistor can be decreased (increased) by heightening (lowering) the fixed potential Va or the fixed potential Vb in some cases. When both the fixed potential Va and the fixed potential Vb are heightened (lowered), effective resistance lower (higher) than that obtained by the transistor with one gate can be obtained in some cases.

The insulating layer 822 can be formed using an insulating layer containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 822 may be formed using stacked insulating layers each containing one or more of the above materials. Note that it is preferable that the insulating layer 822 have a function of supplying oxygen to the oxide semiconductor layer 824. This is because even in the case where oxygen vacancies are present in the oxide semiconductor layer 824, the oxygen vacancies are repaired by oxygen supplied from the insulating layer. An example of treatment for supplying oxygen is heat treatment.

An oxide semiconductor layer can be used for the oxide semiconductor layer 824. As an oxide semiconductor, for example, any of the following can be used: indium oxide, tin oxide, gallium oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide. In particular, In—Ga—Zn oxide is preferable.

Here, In—Ga—Zn oxide means oxide containing In, Ga, and Zn as its main components. Note that a metal element other than In, Ga, and Zn may be contained as an impurity. Note that a film formed using In—Ga—Zn oxide is also referred to as an IGZO film.

The conductive layer 825 can be formed using a conductive film of aluminum, titanium, chromium, cobalt, nickel, copper, yttrium, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials. Typically, it is preferable to use titanium, which is particularly easily bonded to oxygen, or tungsten, which has a high melting point and thus allows subsequent process temperatures to be relatively high. It is also possible to use a stack of any of the above materials and copper or an alloy such as copper-manganese, which has low resistance. When a material which is easily bonded to oxygen is used for the conductive layer 825, and the conductive layer 825 and the oxide semiconductor layer 824 are in contact with each other, a region including oxygen vacancies is formed in the oxide semiconductor layer 824. Hydrogen slightly contained in the film is diffused into the oxygen vacancies, whereby the region is markedly changed to an n-type region. The n-type region can function as a source region or a drain region of the transistor.

The insulating layer 826 can be formed using an insulating layer containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 826 may be formed using stacked insulating layers each containing one or more of the above materials.

The conductive layer 827 can be formed using a conductive film of aluminum, titanium, chromium, cobalt, nickel, copper, yttrium, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials.

The insulating layer 828 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 828 may be formed using stacked insulating layers each containing one or more of the above materials.

An organic material such as an acrylic resin, an epoxy resin, a benzocyclobutene resin, polyimide, or polyamide can be used for the insulating layer 829. Alternatively, the insulating layer 817 may be formed using stacked insulating layers each containing one or more of the above materials. A material similar to the material of the insulating layer 828 can be used for the insulating layer 829.

[Photodiode 803]

Next, the photodiode 803 is described.

In the photodiode 803, an n-type semiconductor layer 832, an i-type semiconductor layer 833, and a p-type semiconductor layer 834 are stacked in this order. The i-type semiconductor layer 833 is preferably formed using amorphous silicon. Furthermore, the n-type semiconductor layer 832 and the p-type semiconductor layer 834 can be formed using amorphous silicon or microcrystalline silicon including an impurity imparting conductivity. A photodiode using amorphous silicon is preferable because its sensitivity in a wavelength region of visible light is high. Note that the p-type semiconductor layer 834 serves as a light-receiving surface, whereby the output current of the photodiode can be increased.

The n-type semiconductor layer 832 having a function as a cathode is connected to the conductive layer 825 of the transistor 802 via the conductive layer 830. Furthermore, the p-type semiconductor layer 834 having a function as an anode is connected to a wiring 837. The photodiode 803 may be connected to another wiring via a wiring 831 or a conductive layer 836. Furthermore, an insulating layer 835 having a function as a protective film can be formed.

The stacked structure shown in FIG. 11A in which the transistor 802 is over the transistor 801 and the photodiode 803 is over the transistor 802 can reduce the area of the semiconductor device.

Although the impurity region 812 is connected to the conductive layer 825 in FIG. 11A, that is, a gate of the transistor 801 is connected to one of a source and a drain of the transistor 802, the connection relation between the transistor 801 and the transistor 802 is not limited thereto. For example, as shown in FIG. 11B, the conductive layer 814 may be connected to the conductive layer 825, that is, one of a source and a drain of the transistor 801 may be connected to one of the source and the gate of the transistor 802.

Although not illustrated, the gate of the transistor 801 may be connected to a gate of the transistor 802, or one of the source and drain of the transistor 801 may be connected to the gate of the transistor 802.

Alternatively, as shown in FIG. 11C, the OS transistor may be omitted and the photodiode 803 may be connected to the transistor 801. The structure shown in FIG. 11C can be used when all the transistors in FIG. 2 is single-crystal transistors, for example. The number of steps of manufacturing the semiconductor device can be reduced by omission of the OS transistor.

Structure Example 2

Figure 12A:
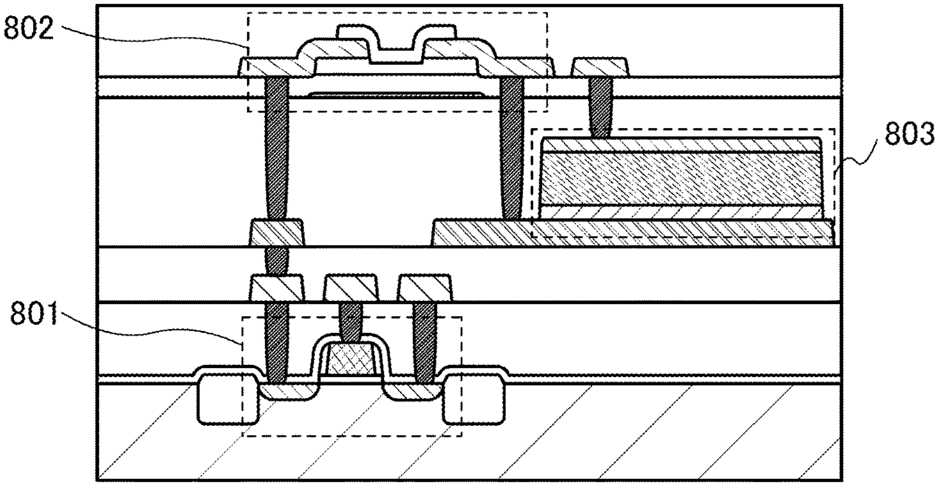
FIGS. 12A, 12B, and 12C are diagrams each illustrating a cross-sectional structure example of a semiconductor device.

Although the photodiode 803 is stacked over the transistor 802 in FIGS. 11A to 11C, the position of the photodiode 803 is not limited thereto. For example, as shown in FIG. 12A, the photodiode 803 may be provided between the transistor 801 and the transistor 802.

Figure 12B:
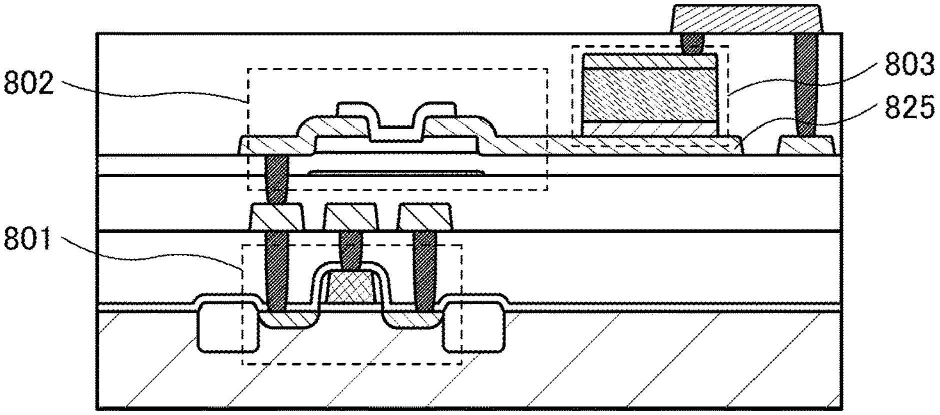

Alternatively, as shown in FIG. 12B, the photodiode 803 may be provided in the layer where the transistor 802 is provided. In that case, the conductive layer 825 may be used as the source electrode or the drain electrode of the transistor 802 and an electrode of the photodiode 803.

Figure 12C:
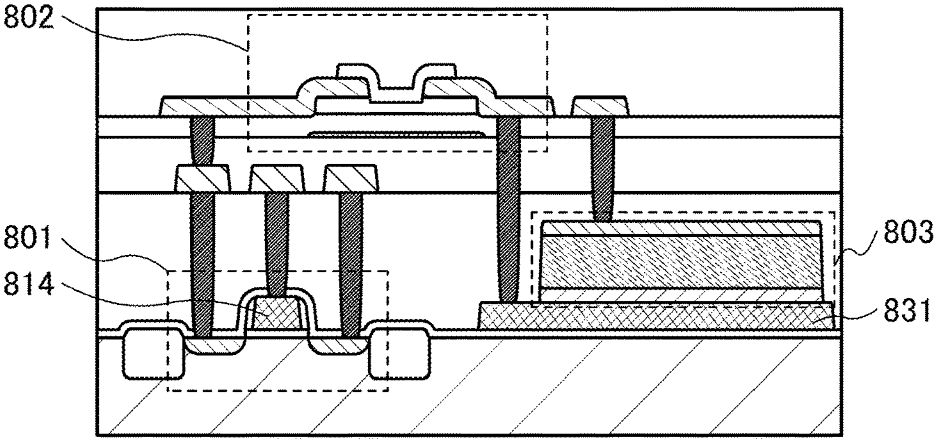

Alternatively, as shown in FIG. 12C, the photodiode 803 may be provided in the layer where the transistor 801 is provided. In that case, the conductive layer 814 having a function as the gate electrode of the transistor 801 and the wiring 831 having a function as the electrode of the photodiode 803 may be formed with the same material at a time.

Figure 13A:
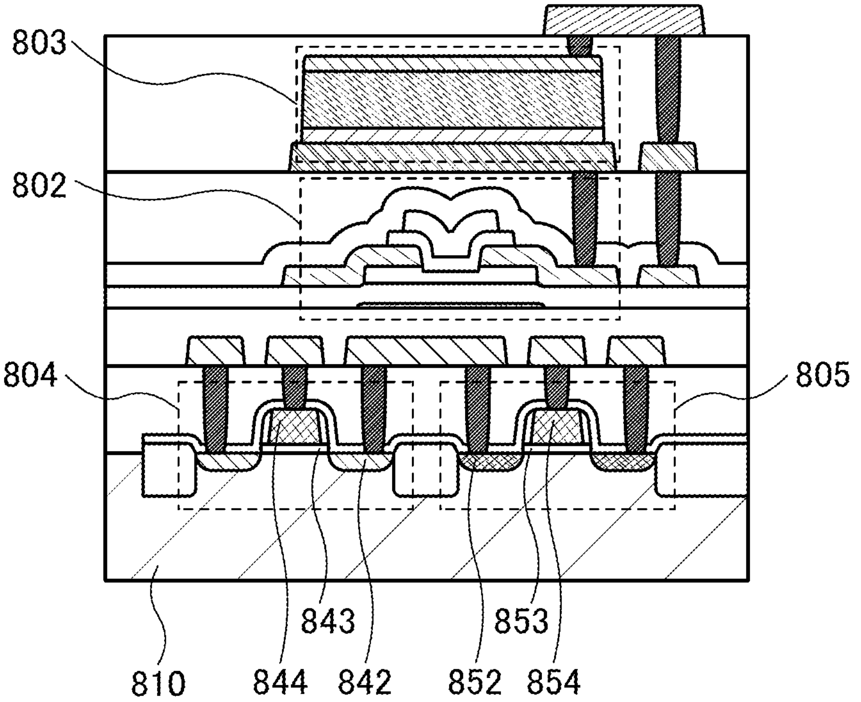
FIGS. 13A and 13B are diagrams each illustrating a cross-sectional structure example of a semiconductor device.

A plurality of transistors can be formed using the semiconductor substrate 810. FIG. 13A shows an example where a transistor 804 and a transistor 805 are formed using the semiconductor substrate 810.

The transistor 804 includes impurity regions 842, an insulating layer 843 having a function as a gate insulating film, and a conductive layer 844 having a function as a gate electrode. The transistor 805 includes impurity regions 852, an insulating film 853 having a function as a gate insulating film, and a conductive layer 854 having a function as a gate electrode. Structures and materials of the transistors 804 and 805 are the same as those of the transistor 801, and thus the detailed description is omitted.

The impurity regions 842 include an impurity element imparting opposite conductivity type to conductivity type of the impurity regions 852. That is, the transistor 804 has an opposite polarity to the polarity of the transistor 805. In addition, as shown in FIG. 13A, the impurity region 842 may be connected to the impurity region 852. In that case, a complementary metal oxide semiconductor (CMOS) inverter including the transistor 804 and the transistor 805 can be formed.

The circuits 30, 40, 50, and 60 and the data processing portion 320 in FIG. 1 and FIG. 10 include the transistor using the semiconductor substrate 810, and then the pixel portion 20 including OS transistors can be stacked over the circuits. The structure shown in FIG. 13A can reduce the area of the semiconductor device.

Figure 13B:
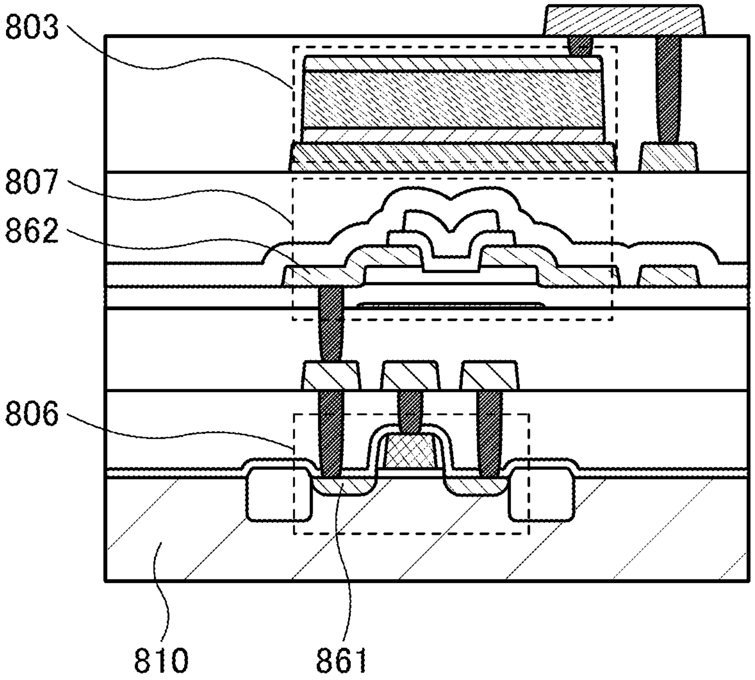

In a structure where a transistor 807 that is an OS transistor is stacked over a transistor 806 formed using the semiconductor substrate 810 as shown in FIG. 13B, an impurity region 861 may be connected to a conductive layer 862, that is, a source or a drain of the transistor 806 may be connected to a source or a drain of the transistor 807. In this way, a CMOS inverter including the transistor formed using the semiconductor substrate 810 and the OS transistor can be formed.

The transistor 806 formed using the semiconductor substrate 810 is easily formed to be a p-channel transistor as compared with the OS transistor. Therefore, it is preferable that the transistor 806 be a p-channel transistor and the transistor 807 be an n-channel transistor. In this way, a CMOS inverter can be formed without formation of two kinds of transistors with different polarities using the semiconductor substrate 810, whereby the manufacturing steps of the semiconductor device can be reduced.

This embodiment can be combined with any other embodiment as appropriate.

Embodiment 5

In this embodiment, a structure example of an imaging device to which a color filter and the like are added is described.

Figure 14A:
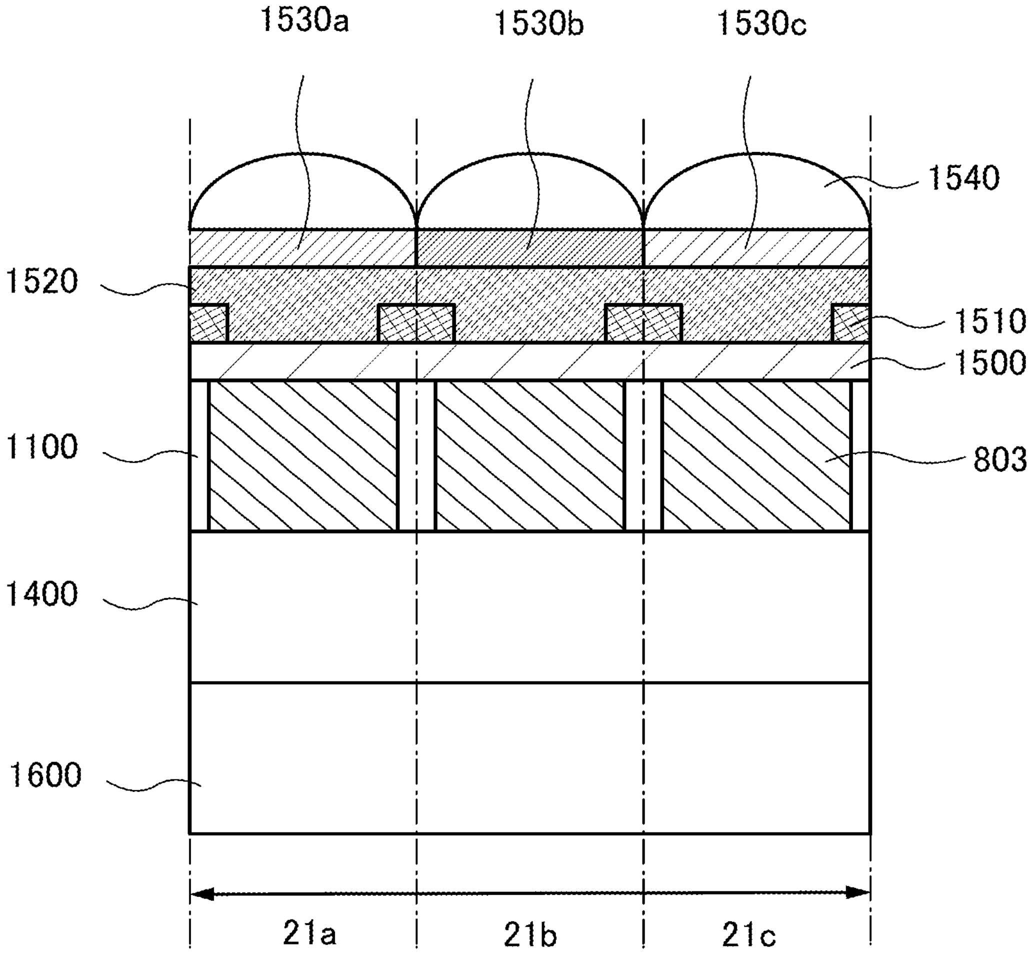
FIGS. 14A and 14B are diagrams each illustrating a structure example of an imaging device.

FIG. 14A is a cross-sectional view of an example of an embodiment in which a color filter and the like are added to the structure in any of FIGS. 11A to 11C, FIGS. 12A to 12C, FIGS. 13A and 13B, and the like, and illustrates a region occupied by circuits (pixels 21*a*, 21*b*, and 21*c*) corresponding to three pixels. An insulating layer 1500 is formed over the photodiode 803 provided in the layer 1100. As the insulating layer 1500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 1510 is formed over the insulating layer 1500. The light-blocking layer 1510 has a function of inhibiting color mixing of light passing through the color filter. The light-blocking layer 1510 can be formed using a metal layer of aluminum, tungsten, or the like, or a stack including the metal layer and a dielectric film functioning as an anti-reflection film.

An organic resin layer 1520 is formed as a planarization film over the insulating layer 1500 and the light-blocking layer 1510. A color filter 1530*a*, a color filter 1530*b*, and a color filter 1530*c* are formed over the pixel 21*a*, the pixel 21*b*, and the pixel 21*c* to be paired up with the pixel 21*a*, the pixel 21*b*, and the pixel 21*c*, respectively. The color filter 1530*a*, the color filter 1530*b*, and the color filter 1530*c* have colors of R (red), G (green), B (blue), and the like, whereby a color image can be obtained.

A microlens array 1540 is provided over the color filters 1530*a*, 1530*b*, and 1530*c* so that light penetrating a lens goes through the color filter positioned just below the lens to reach the photodiode.

A supporting substrate 1600 is provided in contact with the layer 1400. As the supporting substrate 1600, a hard substrate such as a semiconductor substrate (e.g., a silicon substrate), a glass substrate, a metal substrate, or a ceramic substrate can be used. Note that an inorganic insulating layer or an organic resin layer as an adhering layer may be between the layer 1400 and the supporting substrate 1600.

Figure 14B:
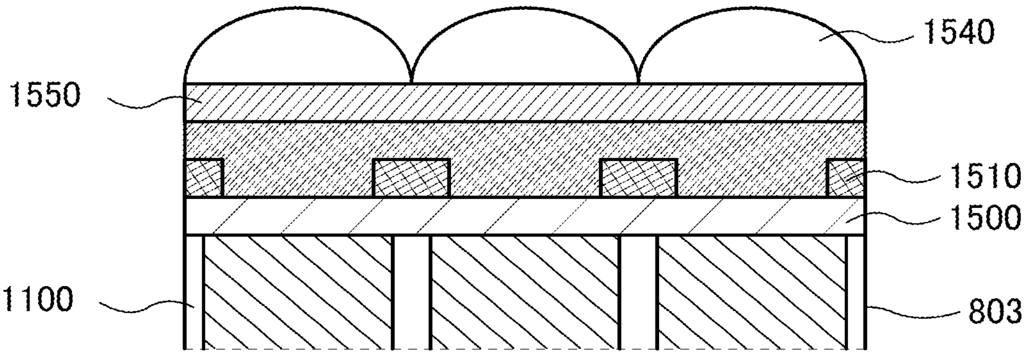

In the structure of the imaging device, an optical conversion layer 1550 (see FIG. 14B) may be used instead of the color filters 1530*a*, 1530*b*, and 1530*c*. When the optical conversion layer 1550 is used instead, the imaging device can convert light in various wavelength regions into an image.

For example, when a filter which blocks light having a wavelength shorter than or equal to that of visible light is used as the optical conversion layer 1550, an infrared imaging device can be obtained. When a filter which blocks light having a wavelength shorter than or equal to that of near infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Furthermore, when a scintillator is used as the optical conversion layer 1550, an imaging device which takes an image visualizing the intensity of a radiation, such as a medical X-ray imaging device, can be obtained. Radiations such as X-rays passes through a subject to enter a scintillator, and then is converted into light (fluorescence) such as visible light or ultraviolet light owing to a phenomenon known as photoluminescence. Then, the photodiode 803 detects the light to obtain image data.

The scintillator is formed of a substance that, when irradiated with radiations such as X-rays or gamma-rays, absorbs energy of the radiations to emit visible light or ultraviolet light or a material containing the substance. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known.

This embodiment can be combined with any other embodiment as appropriate.

Embodiment 6

In this example, other structure examples of the semiconductor device 10 are described.

Figure 15A:
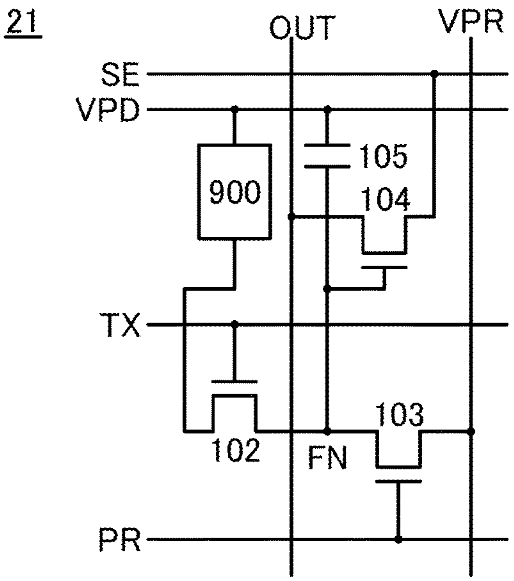
FIGS. 15A, 15B, and 15C are diagrams each illustrating a structure example of a pixel.

A structure example of the pixel 21 is shown in FIG. 15A. In the pixel 21 in FIG. 15A, an element 900 including a selenium-based semiconductor is used as the photoelectric conversion element 101 shown in FIG. 2 and the like.

The element including the selenium-based semiconductor is an element which is capable of conducting photoelectric conversion utilizing a phenomenon called avalanche multiplication, in which a plurality of electrons can be taken from one incident photon by application of voltage. Therefore, in the pixel 21 including the selenium-based semiconductor element, the gain of electrons to the amount of incident light can be large; therefore, a highly sensitive sensor can be obtained. In a photoelectric conversion element in which a selenium-based material is used for a photoelectric conversion layer, relatively high voltage (e.g., 10 V or higher) is preferably applied to easily cause the avalanche phenomenon. In addition, an OS transistor which is highly resistant to drain voltage is preferably used as each of the transistors 102 to 104.

For the selenium-based semiconductor, a selenium-based semiconductor with an amorphous structure or a selenium-based semiconductor with a crystalline structure can be used. For example, the selenium-based semiconductor with a crystalline structure may be obtained in such a manner that a selenium-based semiconductor with an amorphous structure is deposited and subjected to heat treatment. Note that it is preferable that the crystal grain diameter of the selenium-based semiconductor with a crystalline structure be smaller than a pixel pitch because variation in characteristics of the pixels is reduced and the image quality of an image to be obtained becomes uniform.

A selenium-based semiconductor with a crystalline structure among the selenium-based semiconductors has a characteristic of having a light absorption coefficient in a wide wavelength range. Therefore, the element using selenium-based semiconductor with a crystalline structure can be used as an imaging element for a wide wavelength range of light, such as visible light, ultraviolet light, X-rays, and gamma rays, and can be used as what is called a direct conversion element, which is capable of directly converting light in a short wavelength range, such as X-rays and gamma rays, into electric charge.

Figure 15B:
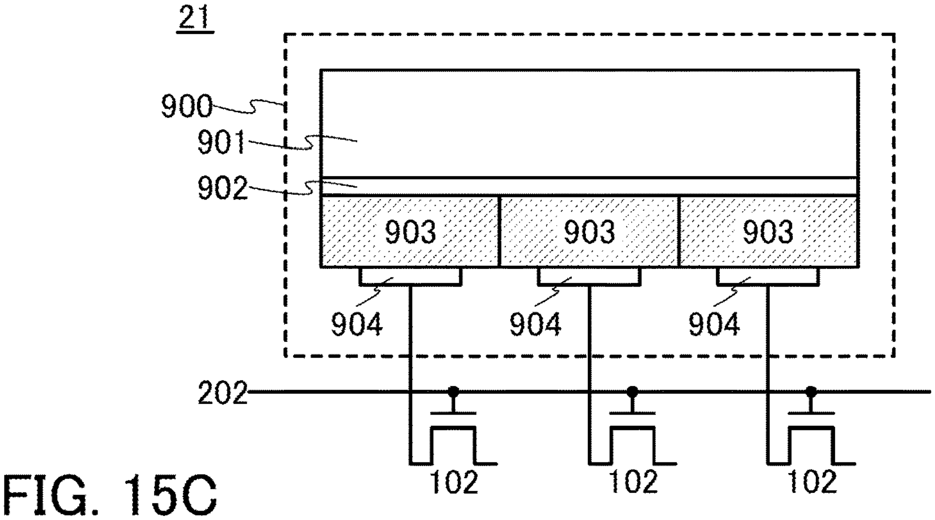

A structure example of the element 900 is shown in FIG. 15B. The element 900 includes a substrate 901, an electrode 902, a photoelectric conversion layer 903, and electrodes 904. The electrode 904 is connected to the source or the drain of the transistor 102. Here, the element 900 includes the plurality of photoelectric conversion layers 903 and the plurality of electrodes 904, and each of the plurality of electrodes 904 is connected to the corresponding transistor 102; however, there is no particular limitation on the number of the photoelectric conversion layers 903 and that of the electrodes 904, and one or more of the photoelectric conversion layers 903 and one or more of the electrodes 904 may be provided for the transistor 102.

Light is to be incident on the photoelectric conversion layers 903 through the substrate 901 and the electrode 902. Therefore, the substrate 901 and the electrode 902 preferably have a light-transmitting property. As the substrate 901, a glass substrate can be used. As the electrode 902, indium tin oxide (ITO) can be used.

The photoelectric conversion layer 903 contains selenium. Selenium-based semiconductors can be used for the photoelectric conversion layer 903.

The photoelectric conversion layer 903 and the electrode 902 stacked over the photoelectric conversion layer 903 can be used without processing of their shapes for respective pixels 21. Thus, a step for processing their shapes can be omitted, which leads to a reduction in the manufacturing cost and improvement in the manufacturing yield.

A chalcopyrite-based semiconductor can be used for the selenium-based semiconductor, for example. Specifically, $CuIn_{1-x}Ga_xSe_2$ ($0 \leq x \leq 1$, abbreviated to CIGS) can be used. CIGS can be formed by an evaporation method, a sputtering method, or the like.

The use of a chalcopyrite-based semiconductor as the selenium-based semiconductor can cause avalanche multiplication by application of several volts (approximately 5 V to 20 V). Thus, voltage application to the photoelectric conversion layer 903 can increase straight-running property of the movement of signal charge generated owing to light irradiation. Note that when the thickness of the photoelectric conversion layer 903 is smaller than or equal to 1 μm, the application voltage can be made smaller. The use of OS transistors as the transistors 102 to 104 allows the pixel 21 to function normally even when the several volts is applied.

Figure 15C:
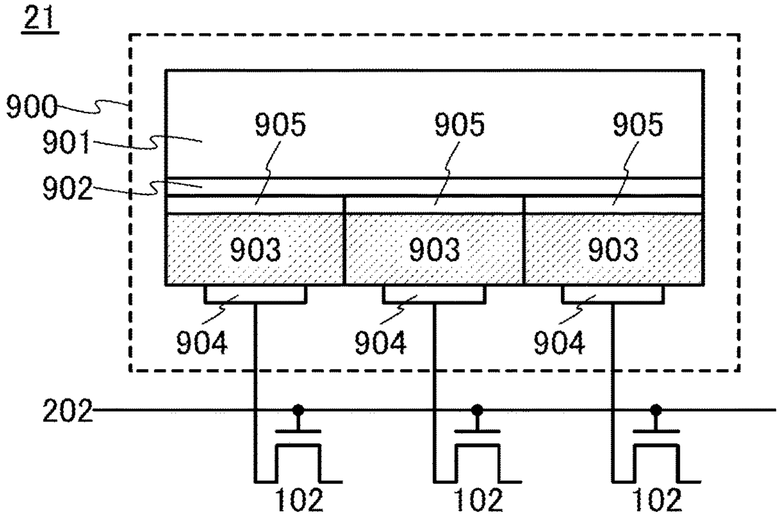

If the thickness of the photoelectric conversion layer 903 is small, dark current sometimes flows at the time of application of voltage; however, such dark current flow can be prevented by providing a layer (hole-injection barrier layer) for inhibiting the dark current from flowing in the CIGS that is the above-mentioned chalcopyrite-based semiconductor. FIG. 15C shows a structure in which a hole-injection barrier layer 905 is added to the structure of FIG. 15B.

An oxide semiconductor such as gallium oxide can be used for the hole-injection barrier layer. The thickness of the hole-injection barrier layer is preferably smaller than that of the photoelectric conversion layer 903.

As described above, the use of a selenium-based semiconductor for a sensor can provide a high-sensitive sensor. The combination of such a sensor with one embodiment of the present invention makes it possible to obtain more accurate imaging data.

This embodiment can be combined with any other embodiment as appropriate.

Embodiment 7

In this embodiment, structures of transistors which can be used in the above embodiments will be described.

Structure Example 1 of Transistor

Figure 16A:
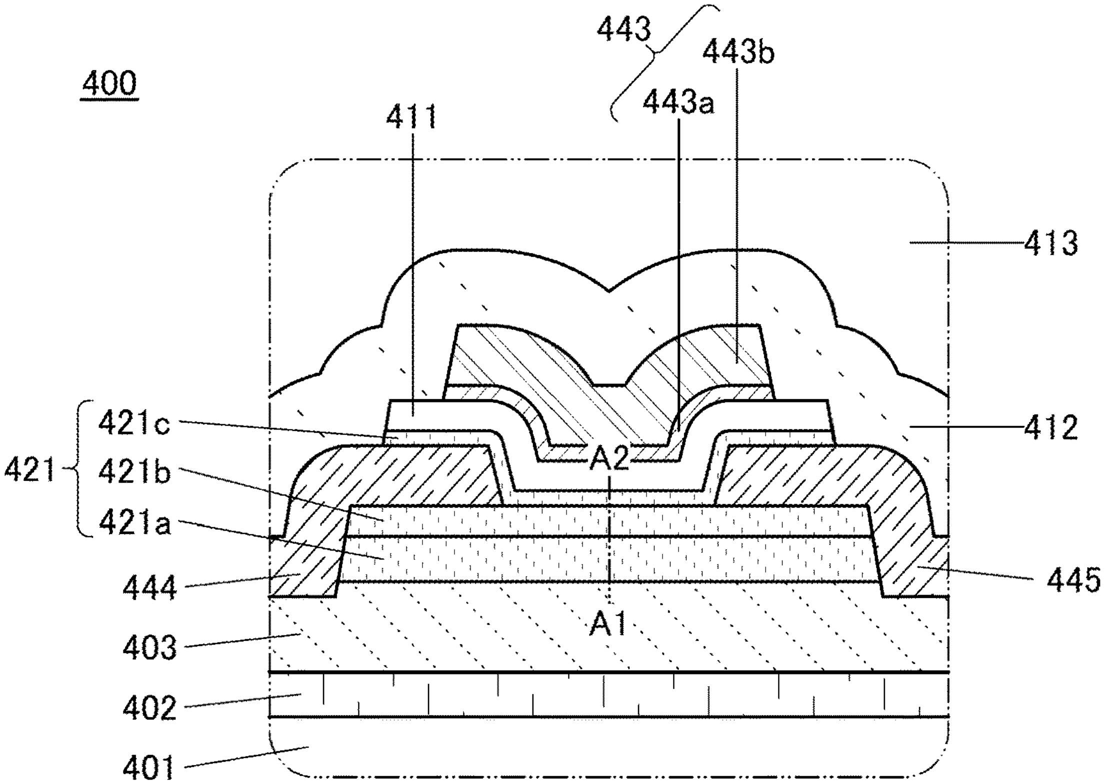
FIGS. 16A and 16B are diagrams illustrating a structure example of a transistor.

FIG. 16A shows a structure of a transistor 400 which can be used in the embodiments. The transistor 400 is formed over an insulating layer 401 with insulating layers 402 and 403 provided therebetween. Although the transistor 400 is a top-gate transistor, a bottom-gate transistor may be used.

An inverted staggered transistor or a forward staggered transistor can also be used as the transistor 400. It is also possible to use a dual-gate transistor, in which a semiconductor layer in which a channel is formed is interposed between two gate electrodes. Further, the transistor is not limited to a transistor having a single-gate structure; a multi-gate transistor having a plurality of channel formation regions, such as a double-gate transistor may be used.

The transistor 400 can be a planar type, a FIN-type, a Tri-Gate type, and the like.

The transistor 400 includes an electrode 443 that can function as a gate electrode, an electrode 444 that can function as one of a source electrode and a drain electrode, an electrode 445 that can function as the other of the source electrode and the drain electrode, an insulating layer 411 that can function as a gate insulating layer, and a semiconductor layer 421.

The insulating layer 402 is preferably formed using an insulating film that has a function of preventing diffusion of impurities such as oxygen, hydrogen, water, alkali metal, and alkaline earth metal. Examples of the insulating film include silicon oxide, silicon oxynitride, silicon nitride, silicon nitride oxide, gallium oxide, hafnium oxide, yttrium oxide, aluminum oxide, aluminum oxynitride, and the like. When the insulating film is formed using silicon nitride, gallium oxide, hafnium oxide, yttrium oxide, aluminum oxide, or the like, diffusion of impurities from the insulating layer 401 side to the semiconductor layer 421 can be reduced. Note that the insulating layer 402 can be formed by a sputtering method, a CVD method, an evaporation method, a thermal oxidation method, or the like. The insulating layer 402 can be formed to have a single-layer structure or a stacked-layer structure including any of these materials.

The insulating layer 403 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 403 can be formed by a sputtering method, a CVD method, a thermal oxidation method, a coating method, a printing method, or the like.

In the case where an oxide semiconductor is used for the semiconductor layer 421, an insulating layer containing oxygen in excess of the stoichiometric composition is preferably used for the insulating layer 402. From the insulating layer containing oxygen at a higher proportion than oxygen in the stoichiometric composition, part of oxygen is released by heating. The insulating layer containing oxygen at a higher proportion than oxygen in the stoichiometric composition is an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the layer surface in the TDS analysis is preferably higher than or equal to 100° C. and lower than or equal to 700° C., or higher than or equal to 100° C. and lower than or equal to 500° C.

The insulating layer containing oxygen at a higher proportion than the stoichiometric composition can be formed by treatment for adding oxygen to the insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The semiconductor layer 421 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In this embodiment, an example in which an oxide semiconductor is used for the semiconductor layer 421 is described. Furthermore, in this embodiment, a case where the semiconductor layer 421 is a stacked layer including a semiconductor layer 421*a*, a semiconductor layer 421*b*, and the semiconductor layer 421*c* is described.

Each of the semiconductor layer 421*a*, the semiconductor layer 421*b*, and the semiconductor layer 421*c* is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of metal elements selected from Al, Ti, Ga, Y, Zr, La, Ce, Nd, and Hf whose strength of bonding with oxygen is higher than that of In).

The semiconductor layer 421*a* and the semiconductor layer 421*c* are preferably formed using a material containing one or more kinds of metal elements contained in the semiconductor layer 421*b*. With the use of such a material, interface states at interfaces between the semiconductor layer 421*a* and the semiconductor layer 421*b* and between the semiconductor layer 421*c* and the semiconductor layer 421*b* are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 421*a* and the semiconductor layer 421*c* is greater than or equal to 3 nm and less than or equal to 100 nm, preferably greater than or equal to 3 nm and less than or equal to 50 nm. The thickness of the semiconductor layer 421*b* is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 421*b* is an In-M-Zn oxide and the semiconductor layer 421*a* and the semiconductor layer 421*c* are each an In-M-Zn oxide, the semiconductor layer 421*a* and the semiconductor layer 421*c* each have the atomic ratio where InM:Zn=$x_1$:$y_1$:$z_1$, and the semiconductor layer 421*b* has an atomic ratio where InM:Zn=$x_2$:$y_2$:$z_2$, for example. In that case, the compositions of the semiconductor layer 421*a*, the semiconductor layer 421*c*, and the semiconductor layer 421*b* are determined so that $y_1/x_1$ is large than $y_2/x_2$. It is preferable that the compositions of the semiconductor layer 421*a*, the semiconductor layer 421*c*, and the semiconductor layer 421*b* are determined so that $y_1/x_1$ is 1.5 times or more as large as $y_2/x_2$. It is further preferable that the compositions of the semiconductor layer 421*a*, the semiconductor layer 421*c*, and the semiconductor layer 421*b* are determined so that $y_1/x_1$ is twice or more as large as $y_2/x_2$. It is still further preferable that the compositions of the semiconductor layer 421*a*, the semiconductor layer 421*c*, and the semiconductor layer 421*b* are determined so that $y_1/x_1$ is three times or more as large as $y_2/x_2$. At this time, $y_1$ is preferably greater than or equal to $x_1$ in the semiconductor layer 421*b*, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the semiconductor layer 421*a* and the semiconductor layer 421*c* have the above compositions, the semiconductor layer 421*a* and the semiconductor layer 421*c* can each be a layer in which oxygen vacancies are less likely to be generated than in the semiconductor layer 421*b*.

In the case where the semiconductor layer 421*a* and the semiconductor layer 421*c* are each an In-M-Zn oxide, the content percentages of In and an element M, not taking Zn and O into consideration, are preferably as follows: the content percentage of In is lower than 50 atomic % and the percentage of M is higher than or equal to 50 atomic %. The content percentages of In and M are more preferably as follows: the content percentage of In is lower than 25 atomic % and the content percentage of M is higher than or equal to 75 atomic %. In the case where the semiconductor layer 421*b* is an In-M-Zn oxide, the content percentages of In and element M, not taking Zn and O into consideration, are preferably as follows: the content percentage of In is higher than or equal to 25 atomic % and the content percentage of M is lower than 75 atomic %. The content percentages In and element M are more preferably as follows: the content percentage of In is higher than or equal to 34 atomic % and the content percentage of M is lower than 66 atomic %.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 can be used for each of the semiconductor layer 421*a* and the semiconductor layer 421*c* containing In or Ga. Furthermore, an In—Ga—Zn oxide which is formed using a target having an atomic ratio of In:Ga:Zn=3:1:2, 1:1:1, 5:5:6, or 4:2:4.1 can be used for the semiconductor layer 421*b*. Note that the atomic ratio of each of the semiconductor layer 421*a*, the semiconductor layer 421*b*, and the semiconductor layer 421*c* may vary within a range of ±20% of any of the above-described atomic ratios as an error.

In order to give stable electrical characteristics to the transistor including the semiconductor layer 421*b*, it is preferable that impurities and oxygen vacancies in the semiconductor layer 421*b* be reduced to obtained a highly purified semiconductor layer; accordingly, the semiconductor layer 421*b* can be regarded as an intrinsic or substantially intrinsic semiconductor layer. Furthermore, it is preferable that at least the channel formation region of the semiconductor layer 421*b* be a semiconductor layer that can be regarded as an intrinsic or substantially intrinsic semiconductor layer.

Note that the substantially intrinsic semiconductor layer refers to an oxide semiconductor layer in which the carrier density is lower than $1\times10^{17}/cm^3$, lower than $1\times10^{15}/cm^3$, or lower than $1\times10^{13}/cm^3$.

Figure 16B:
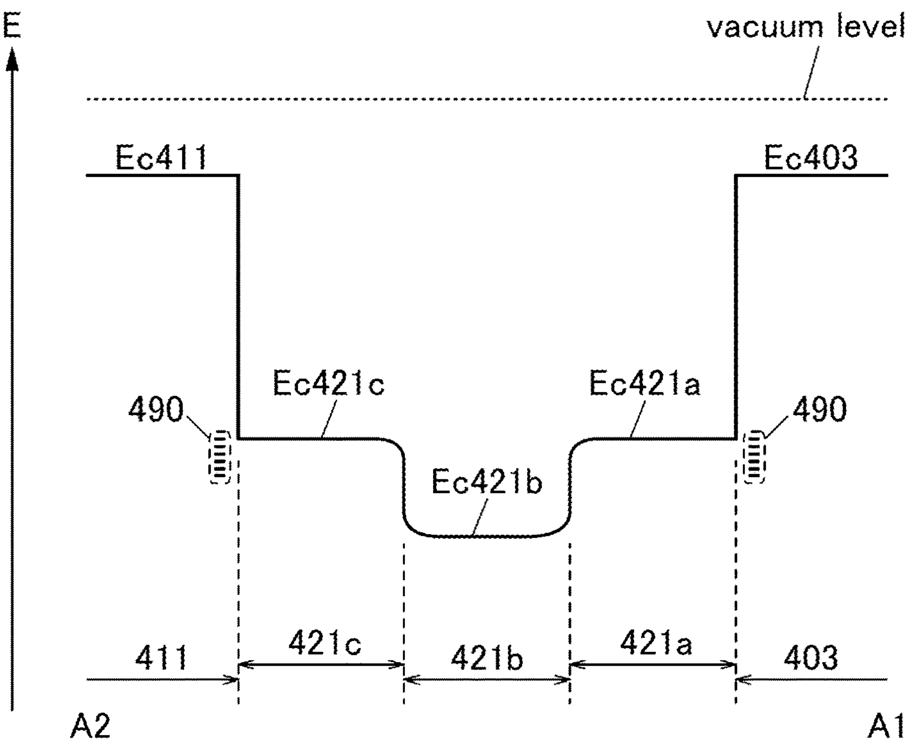

The function and effect of the semiconductor layer 421 that is a stacked layer including the semiconductor layer 421*a*, the semiconductor layer 421*b*, and the semiconductor layer 421*c* will be described with an energy band structure diagram shown in FIG. 16B. FIG. 16B is the energy band structure diagram showing a portion along dashed-dotted line A1-A2 in FIG. 16A. Thus, FIG. 16B illustrates the energy band structure of a channel formation region of the transistor 400.

In FIG. 16B, Ec403, Ec421a, Ec421b, Ec421c, and Ec411 are the energies of bottoms of the conduction band in the insulating layer 403, the semiconductor layer 421*a*, the semiconductor layer 421*b*, the semiconductor layer 421*c*, and the insulating layer 411, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A. S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 403 and the insulating layer 411 are insulators, Ec403 and Ec411 are closer to the vacuum level (have a smaller electron affinity) than Ec421a, Ec421b, and Ec421c.

Further, Ec421a is closer to the vacuum level than Ec421b. Specifically, Ec421a is preferably located closer to the vacuum level than Ec421b by 0.05 eV or more, 0.07 eV or more, 0.1 eV or more, or 0.15 eV or more and 2 eV or less, 1 eV or less, 0.5 eV or less, or 0.4 eV or less.

Further, Ec421c is closer to the vacuum level than Ec421b. Specifically, Ec421c is preferably located closer to the vacuum level than Ec421b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layer 421*a* and the semiconductor layer 421*b* and the vicinity of an interface between the semiconductor layer 421*b* and the semiconductor layer 421*c*, mixed regions are formed; thus, the energy of the bottom of the conduction band continuously changes. In other words, no state or few states exist at these interfaces.

Accordingly, electrons transfer mainly through the semiconductor layer 421*b* in the stacked-layer structure having the above energy band structure. Therefore, even when an interface state exists at an interface between the semiconductor layer 421*a* and the insulating layer 401 or an interface between the semiconductor layer 421*c* and the insulating layer 411, the interface state hardly influences the transfer of the electrons. In addition, the interface state does not exist or hardly exists at the interface between the semiconductor layer 421*a* and the semiconductor layer 421*b* and at the interface between the semiconductor layer 421*c* and the semiconductor layer 421*b*; thus, transfer of electrons are not prohibited in the region. Accordingly, high field-effect mobility can be obtained in the transistor 400 having the above stacked-layer structure of the oxide semiconductor layers.

Note that although trap states 490 due to impurities or defects might be formed in the vicinity of the interface between the semiconductor layer 421*a* and the insulating layer 403 and in the vicinity of the interface between the semiconductor layer 421*c* and the insulating layer 411 as shown in FIG. 16B, the semiconductor layer 421*b* can be separated from the trap states owing to the existence of the semiconductor layer 421*a* and the semiconductor layer 421*c*.

In particular, in the transistor 400 described in this embodiment, an upper surface and a side surface of the semiconductor layer 421*b* are in contact with the semiconductor layer 421*c*, and a bottom surface of the semiconductor layer 421*b* is in contact with the semiconductor layer 421*a*. In this manner, the semiconductor layer 421*b* is surrounded by the semiconductor layer 421*a* and the semiconductor layer 421*c*, whereby the influence of the trap state can be further reduced.

However, in the case where an energy difference between Ec421a or Ec421c and Ec421b is small, electrons in the semiconductor layer 421*b* might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec421a and Ec421b and between Ec421c and Ec421b is preferably set to be larger than or equal to 0.1 eV, more preferably larger than or equal to 0.15 eV, in which case a change in the threshold voltage of the transistor can be reduced and the transistor can have favorable electrical characteristics.

Each of the band gaps of the semiconductor layer 421*a* and the semiconductor layer 421*c* is preferably larger than that of the semiconductor layer 421*b*.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small off-state current. Specifically, the off-state current per micrometer of channel width at room temperature can be lower than $1\times10^{-20}$ A, preferably lower than $1\times10^{-22}$ A, more preferably lower than $1\times10^{-24}$ A. That is, the on/off ratio of the transistor can be greater than or equal to 20 digits and less than or equal to 150 digits.

With one embodiment of the present invention, a transistor with small power consumption can be provided. Accordingly, a semiconductor device or an imaging device with low power consumption can be provided. One embodiment of the present invention can provide an imaging device or a semiconductor device with high light sensitivity. One embodiment of the present invention can also provide an imaging device or a semiconductor device with a wide dynamic range.

Since an oxide semiconductor has a wide bandgap, a semiconductor device including an oxide semiconductor can be used in a wide range of ambient temperature. Accordingly, an imaging device or a semiconductor device of one embodiment of the present invention has a wide temperature range.

Note that the above-described three-layer structure is just an example. A two-layer structure without the semiconductor layer 421_a_ or 421_c_ may be employed.

As an example of an oxide semiconductor that can be used for the semiconductor layer 421_a_, the semiconductor layer 421_b_, and the semiconductor layer 421_c_, an oxide containing indium can be given. An oxide can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, magnesium, and the like. Note that two or more of the above elements may be used in combination as the element M. The element M is an element having a high bonding energy with oxygen, for example. The element M is an element that can increase the energy gap of the oxide, for example. Further, the oxide semiconductor preferably contains zinc. When the oxide contains zinc, the oxide is easily to be crystallized, for example.

Note that the oxide semiconductor is not limited to the oxide containing indium. The oxide semiconductor may be, for example, zinc tin oxide, gallium tin oxide, or gallium oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Influence of impurities in the oxide semiconductor will be described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}$/cm$^3$, lower than $1\times10^{15}$/cm$^3$, or lower than $1\times10^{13}$/cm$^3$. In particular, the carrier density of the oxide semiconductor is lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. The silicon concentration in the oxide semiconductor measured by secondary ion mass spectrometry (SIMS) is lower than $1\times10^{19}$ atoms/cm$^3$, preferably lower than $5\times10^{18}$ atoms/cm$^3$, more preferably lower than $2\times10^{18}$ atoms/cm$^3$.

Furthermore, when hydrogen is contained in the oxide semiconductor, the carrier density is increased in some cases. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. When nitrogen is contained in the oxide semiconductor, the carrier density is increased in some cases. The concentration of nitrogen in the oxide semiconductor measured by SIMS is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In order to reduce the hydrogen concentration in the oxide semiconductor, the hydrogen concentrations in the insulating layer 403 and the insulating layer 411 that are in contact with the semiconductor layer 421 are preferably reduced. The hydrogen concentration in the insulating layer 403 and the insulating layer 411 measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. In order to reduce the nitrogen concentration in the oxide semiconductor, the nitrogen concentrations in the insulating layer 403 and the insulating layer 411 are preferably reduced. The nitrogen concentration in the insulating layer 403 and the insulating layer 411 measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In this embodiment, first, the semiconductor layer 421_a_ is formed over the insulating layer 403, and the semiconductor layer 421_b_ is formed over the semiconductor layer 421_a_.

A sputtering method is preferably used for formation of the oxide semiconductor layers. As a sputtering method, an RF sputtering method, a DC sputtering method, an AC sputtering method, or the like can be used. A DC sputtering method or an AC sputtering method can achieve uniform deposition as compared to an RF sputtering method.

In this embodiment, as the semiconductor layer 421_a_, 20-nm-thick In—Ga—Zn oxide is deposited by a sputtering method using an In—Ga—Zn oxide target (In:Ga:Zn=1:3:2). Note that the constituent elements and compositions applicable to the semiconductor layer 421_a_ are not limited thereto.

The oxygen doping treatment may be performed after the formation of the semiconductor layer 421_a_.

Next, the semiconductor layer 421_b_ is formed over the semiconductor layer 421_a_. In this embodiment, as the semiconductor layer 421_b_, 30-nm-thick In—Ga—Zn oxide is deposited by a sputtering method using an In—Ga—Zn oxide target (In:Ga:Zn=1:1:1). Note that the constituent elements and compositions applicable to the semiconductor layer 421_b_ are not limited thereto.

The oxygen doping treatment may be performed after the formation of the semiconductor layer 421_b_.

Next, heat treatment may be performed to further reduce the impurities such as moisture or hydrogen contained in the semiconductor layer 421_a_ and the semiconductor layer 421_b_, so that the semiconductor layer 421_a_ and the semiconductor layer 421_b_ are highly purified.

For example, the semiconductor layer 421*a* and the semiconductor layer 421*b* are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By heat treatment, oxygen included in the insulating layer 403 can be diffused into the semiconductor layer 421*a* and the semiconductor layer 421*b*, concurrently with the release of impurities, so that oxygen vacancies in the semiconductor layer 421*a* and the semiconductor layer 421*b* can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the semiconductor layer 421*b* is formed. For example, the heat treatment may be performed after the semiconductor layer 421*b* is selectively etched.

The heat treatment can be performed at a temperature higher than or equal to 250° C. and lower than or equal to 650° C., preferably higher than or equal to 300° C. and lower than or equal to 500° C. The treatment time is shorter than or equal to 24 hours.

An electric furnace, an RTA apparatus, or the like can be used for the heat treatment. The use of an RTA apparatus allows the heat treatment at a temperature of higher than or equal to the strain point of the substrate if the heating time is short. Therefore, the heat treatment time can be shortened.

Next, a resist mask is formed over the semiconductor layer 421*b*, and with use of the resist mask, part of the semiconductor layer 421*a* and part of the semiconductor layer 421*b* are etched selectively. At this time, the insulating layer 403 might be partly etched, thereby having a projection.

Either of a dry etching method or a wet etching method may be used for etching of the semiconductor layer 421*a* and the semiconductor layer 421*b*, or both of them may be used. After the etching, the resist mask is removed.

The transistor 400 includes an electrode 444 and an electrode 445 over and partly in contact with the semiconductor layer 421*b*. The electrodes 444 and 445 can be formed with a single-layer structure or a stacked-layer structure using any of metals such as aluminum, titanium, chromium, nickel, copper, yttrium, zirconium, molybdenum, manganese, silver, tantalum, and tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film in which aluminum and one or more elements selected from titanium, tantalum, tungsten, molybdenum, chromium, neodymium, and scandium are combined may be used.

In addition, the transistor 400 includes the semiconductor layer 421*c* over the semiconductor layer 421*b*, the electrode 444, and the electrode 445. The semiconductor layer 421*c* is partly in contact with each of the semiconductor layer 421*b*, the electrode 444, and the electrode 445.

In this embodiment, the semiconductor layer 421*c* is formed by a sputtering method using an In—Ga—Zn oxide target (In:Ga:Zn=1:3:2). Note that the constituent elements and compositions applicable to the semiconductor layer 421*c* are not limited thereto. For example, oxide gallium may be used for the semiconductor layer 421*c*. Furthermore, oxygen doping treatment may be performed on the semiconductor layer 421*c*.

Furthermore, in the transistor 400, the insulating layer 411 is provided over the semiconductor layer 421*c*. The insulating layer 411 can function as a gate insulating layer. The insulating layer 411 can be formed using a material and a method similar to those of the insulating layer 403. The oxygen doping treatment may be performed on the insulating layer 411.

After the semiconductor layer 421*c* and the insulating layer 411 are formed, a mask is formed over the insulating layer 411, and parts of the semiconductor layer 421*c* and the insulating layer 411 are selectively etched, so that the semiconductor layer 421*c* and the insulating layer 411 may be formed into island shapes.

Moreover in the transistor 400, the electrode 443 is provided over the insulating layer 411. The electrode 443 (including another electrode or wiring that is formed in the same layer as this electrode) can be formed using a material and a method similar to those of the electrodes 444 and 445.

In this embodiment, an example in which the electrode 443 has a stacked-layer structure including an electrode 443*a* and an electrode 443*b* is shown. For example, the electrode 443*a* is formed using tantalum nitride, and the electrode 443*b* is formed using copper. The electrode 443*a* functions as a barrier layer to prevent copper diffusion. Thus, a semiconductor device with high reliability can be obtained.

Moreover, the transistor 400 includes an insulating layer 412 covering the electrode 443. The insulating layer 412 can be formed using a material and a method similar to those of the insulating layer 403. The insulating layer 412 may be subjected to oxygen doping treatment. Furthermore, a surface of the insulating layer 412 may be subjected to CMP treatment.

In addition, an insulating layer 413 is over the insulating layer 412. The insulating layer 413 can be formed using a material and a method that are similar to those of the insulating layer 403. A surface of the insulating layer 413 may be subjected to CMP treatment. By the CMP treatment, unevenness of the surface can be reduced, and coverage with an insulating layer or a conductive layer formed later can be increased.

Structure Example 2 of Transistor

Next, a structure example of a transistor that can be used as the transistor 400 will be described with reference to FIGS. 17A1, 17A2, 17B1, and 17B2, FIGS. 18A1, 18A2, 18A3, 18B1, and 18B2, FIGS. 19A, 19B, and 19C, FIGS. 20A, 20B, and 20C, and FIGS. 21A, 21B, and 21C.

[Bottom-Gate Transistor]

A transistor 510 shown in FIG. 17A1 as an example is a channel-protective transistor that is a type of bottom-gate transistor. The transistor 510 includes an electrode 446 that can function as a gate electrode over an insulating layer 403. The transistor 510 includes a semiconductor layer 421 over the electrode 446 with an insulating layer 411 positioned therebetween. The electrode 446 can be formed using a material and a method similar to those of the electrodes 444 and 445.

The transistor 510 includes an insulating layer 450 that can function as a channel protective layer over a channel formation region in the semiconductor layer 421. The insulating layer 450 can be formed using a material and a method that are similar to those of the insulating layer 411. Part of an electrode 444 and part of an electrode 445 are formed over the insulating layer 450.

With the insulating layer 450 provided over the channel formation region, the semiconductor layer 421 can be prevented from being exposed at the time of forming the electrode 444 and the electrode 445. Thus, the semiconductor layer 421 can be prevented from being reduced in thickness at the time of forming the electrode 444 and the electrode 445. According to one embodiment of the present invention, a transistor with favorable electrical characteristics can be provided.

A transistor 511 illustrated in FIG. 17A2 is different from the transistor 510 in that an electrode 451 that can function as a back gate electrode is provided over an insulating layer 412. The electrode 451 can be formed using a material and a method that are similar to those of the electrodes 444 and 445.

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing the potential of the back gate electrode independently of the potential of the gate electrode, the threshold voltage of the transistor can be changed.

The electrodes 446 and 451 can both function as gate electrodes. Thus, the insulating layers 411, 450, and 412 can all function as gate insulating layers.

In the case where one of the electrode 446 and the electrode 451 is simply referred to as a "gate electrode", the other can be referred to as a "back gate electrode". For example, in the transistor 511, in the case where the electrode 451 is referred to as a "gate electrode", the electrode 446 may be referred to as a "back gate electrode". In the case where the electrode 451 is used as a "gate electrode", the transistor 511 can be considered as a kind of top-gate transistor. Furthermore, one of the electrode 446 and the electrode 451 may be referred to as a "first gate electrode", and the other may be referred to as a "second gate electrode".

By providing the electrode 446 and the electrode 451 with the semiconductor layer 421 positioned therebetween and setting the potentials of the electrode 446 and the electrode 451 to be the same, a region of the semiconductor layer 421 through which carriers flow is enlarged in the film thickness direction; thus, the number of transferred carriers is increased. As a result, the on-state current and the field-effect mobility of the transistor 511 are increased.

Therefore, the transistor 511 has large on-state current for the area occupied thereby. That is, the area occupied by the transistor 511 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 446 and the electrode 451 each have a function of blocking an electric field generated outside, charges of charged particles and the like generated on the insulating layer 403 side or above the electrode 451 do not influence the channel formation region in the semiconductor layer 421. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect can be obtained when the electrodes 446 and 451 have the same potential or different potentials.

The BT stress test is one kind of accelerated test and can evaluate, in a short time, a change caused by long-term use (i.e., a change over time) in characteristics of transistors. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

By providing the electrode 446 and the electrode 451 and setting the potentials of the electrode 446 and the electrode 451 to be the same, the change in threshold voltage is reduced. Accordingly, variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

A transistor 520 shown in FIG. 17B1 as an example is a channel-protective transistor that is a type of bottom-gate transistor. The transistor 520 has substantially the same structure as the transistor 510 but is different from the transistor 510 in that the insulating layer 450 covers the semiconductor layer 421. Furthermore, the semiconductor layer 421 is electrically connected to the electrode 444 in the opening which is formed by selectively removing part of the insulating layer 450 overlapping the semiconductor layer 421. Furthermore, the semiconductor layer 421 is electrically connected to the electrode 445 in the opening which is formed by selectively removing part of the insulating layer 450 overlapping the semiconductor layer 421. A region of the insulating layer 450 which overlaps the channel formation region can function as a channel protective layer.

A transistor 521 illustrated in FIG. 17B2 is different from the transistor 520 in that the electrode 451 that can function as a back gate electrode is provided over the insulating layer 412. Each of the electrodes 446 and 451 can function as a gate electrode. Accordingly, each of the insulating layers 411, 450, and 412 can function as a gate insulating layer.

The distance between the electrode 444 and the electrode 446 and the distance between the electrode 445 and the electrode 446 in the transistors 520 and 521 are longer than those in the transistors 510 and 511. Thus, the parasitic capacitance generated between the electrode 444 and the electrode 446 can be reduced. The parasitic capacitance generated between the electrode 445 and the electrode 446 can also be reduced. According to one embodiment of the present invention, a transistor with favorable electrical characteristics can be provided.

[Top-Gate Transistor]

A transistor 530 shown in FIG. 18A1 as an example is a type of top-gate transistor. The transistor 530 includes the semiconductor layer 421 over the insulating layer 403; the electrode 444 in contact with part of the semiconductor layer 421 and the electrode 445 in contact with part of the semiconductor layer 421, over the semiconductor layer 421 and the insulating layer 403; the insulating layer 411 over the semiconductor layer 421, the electrode 444, and the electrode 445; and the electrode 446 over the insulating layer 411.

Since, in the transistor 530, the electrode 446 overlaps with neither the electrode 444 nor the electrode 445, the parasitic capacitance generated between the electrode 446 and the electrode 444 and the parasitic capacitance generated between the electrode 446 and the electrode 445 can be reduced. After the formation of the electrode 446, an impurity element 455 is introduced into the semiconductor layer 421 using the electrode 446 as a mask, so that an impurity region can be formed in the semiconductor layer 421 in a self-aligned manner (see FIG. 18A3). According to one embodiment of the present invention, a transistor with favorable electrical characteristics can be provided.

The introduction of the impurity element 455 can be performed with an ion implantation apparatus, an ion doping apparatus, or a plasma treatment apparatus. As the ion doping apparatus, an ion doping apparatus with a mass separation function may be used.

As the impurity element 455, for example, at least one kind of element of Group 13 elements and Group 15 elements can be used. In the case where an oxide semiconductor is used for the semiconductor layer 421, it is possible to use at least one kind of element of a rare gas, hydrogen, and nitrogen as the impurity element 455.

A transistor 531 illustrated in FIG. 18A2 is different from the transistor 530 in that the electrode 451 and an insulating layer 417 are provided. The transistor 531 includes the electrode 451 formed over the insulating layer 403 and the insulating layer 417 formed over the electrode 451. As described above, the electrode 451 can function as a back gate electrode. Thus, the insulating layer 417 can function as a gate insulating layer. The insulating layer 417 can be formed using a material and a method that are similar to those of the insulating layer 411.

The transistor 531 as well as the transistor 511 has large on-state current for the area occupied thereby. That is, the area occupied by the transistor 531 can be small for required on-state current. With one embodiment of the present invention, the area occupied by a transistor can be reduced. Therefore, with one embodiment of the present invention, a semiconductor device having a high degree of integration can be provided.

A transistor 540 shown in FIG. 18B1 as an example is a type of top-gate transistor. The transistor 540 is different from the transistor 530 in that the semiconductor layer 421 is formed after the formation of the electrode 444 and the electrode 445. A transistor 541 illustrated in FIG. 18B2 is different from the transistor 540 in that the electrode 451 and the insulating layer 417 are provided. Thus, in the transistors 540 and 541, part of the semiconductor layer 421 is formed over the electrode 444 and another part of the semiconductor layer 421 is formed over the electrode 445.

The transistor 541 as well as the transistor 511 has large on-state current for the area occupied thereby. That is, the area occupied by the transistor 541 can be small for required on-state current. With one embodiment of the present invention, the area occupied by a transistor can be reduced. Therefore, with one embodiment of the present invention, a semiconductor device having a high degree of integration can be provided.

Also in the transistors 540 and 541, after the formation of the electrode 446, the impurity element 455 is introduced into the semiconductor layer 421 using the electrode 446 as a mask, so that an impurity region can be formed in the semiconductor layer 421 in a self-aligned manner. According to one embodiment of the present invention, a transistor with favorable electrical characteristics can be provided. Furthermore, according to one embodiment of the present invention, a semiconductor device having a high degree of integration can be provided.

[S-Channel Transistor]

Figure 19A:
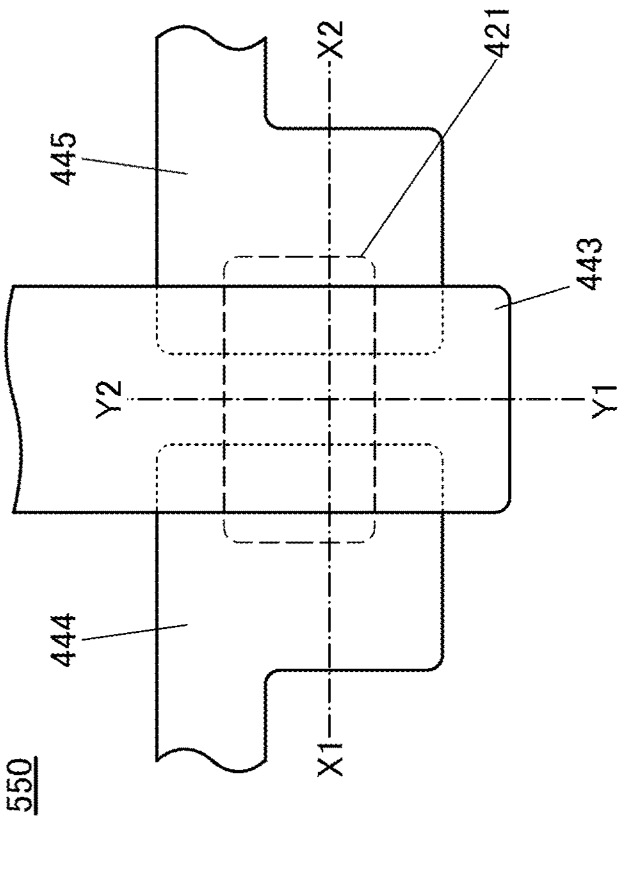
FIGS. 19A, 19B, and 19C are diagrams illustrating a structure example of a transistor.
Figure 19B:
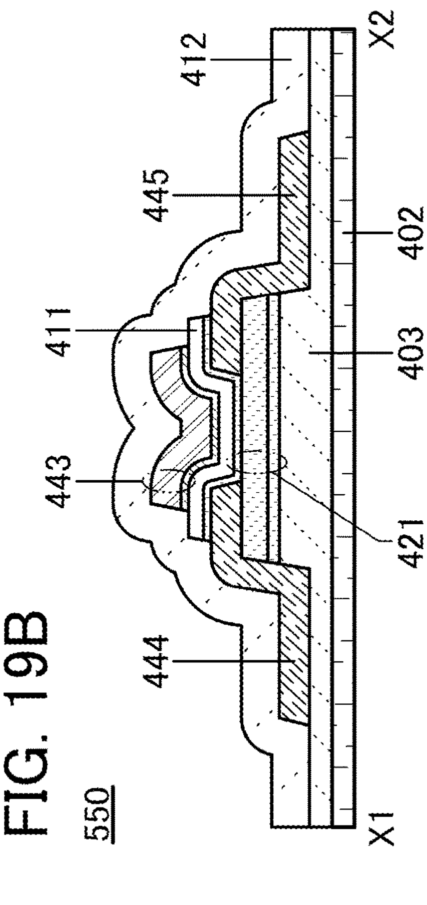
Figure 19C:
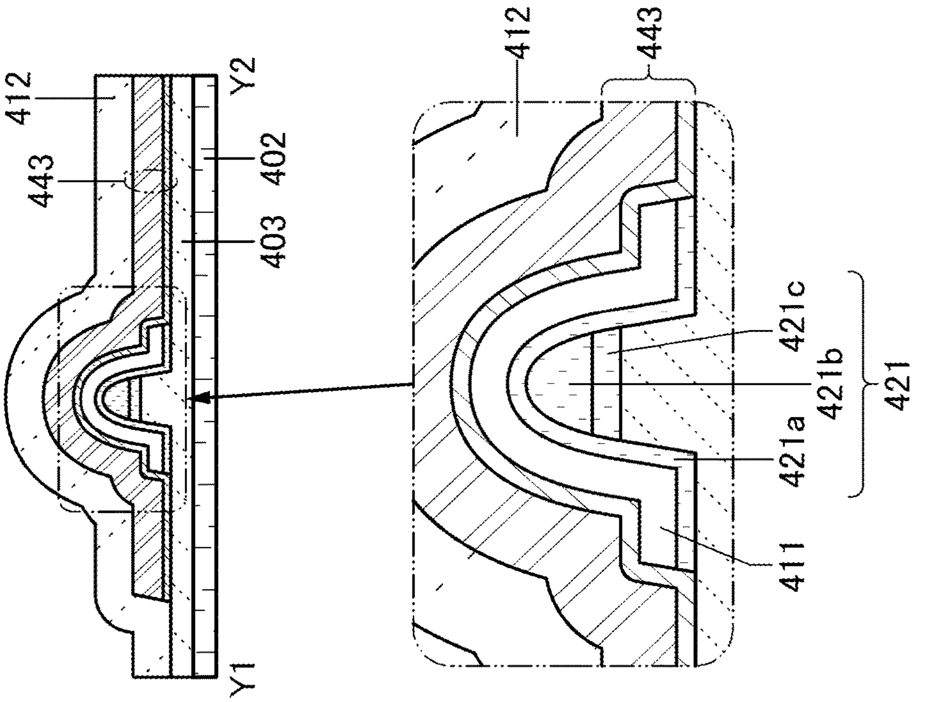

A transistor 550 illustrated in FIGS. 19A to 19C has a structure in which a top surface and side surface of the semiconductor layer 421*b* are covered with the semiconductor layer 421*a*. FIG. 19A is the top view of the transistor 550. FIG. 19B is a cross-sectional view (in the channel length direction) taken along dashed-dotted line X1-X2 in FIG. 19A. FIG. 19C is a cross-sectional view (in the channel width direction) taken along dashed-dotted line Y1-Y2 in FIG. 19A.

With the semiconductor layer 421 provided on the projection of the insulating layer 403, the side surface of the semiconductor layer 421*b* can be covered with the electrode 443. Thus, the transistor 550 has a structure in which the semiconductor layer 421*b* can be electrically surrounded by electric field of the electrode 443. In this way, the structure of a transistor in which the semiconductor layer is electrically surrounded by the electric field of the conductive film is called a surrounded channel (s-channel) structure. A transistor having an s-channel structure is referred to as an s-channel transistor.

In the transistor with an s-channel structure, a channel is formed in the whole (bulk) of the semiconductor layer 421*b* in some cases. In the s-channel structure, the drain current of the transistor is increased, so that a larger amount of on-state current can be obtained. Furthermore, the entire channel formation region of the semiconductor layer 421*b* can be depleted by the electric field of the electrode 443. Accordingly, off-state current of the transistor with an s-channel structure can be further reduced.

When the projecting portion of the insulating layer 403 is increased in height, and the channel width is shortened, the effects of the s-channel structure to increase the on-state current and reduce the off-state current can be enhanced. Part of the semiconductor layer 421*a* exposed in the formation of the semiconductor layer 421*b* may be removed. In this case, the side surfaces of the semiconductor layer 421*a* and the semiconductor layer 421*b* may be aligned to each other.

Figure 20C:
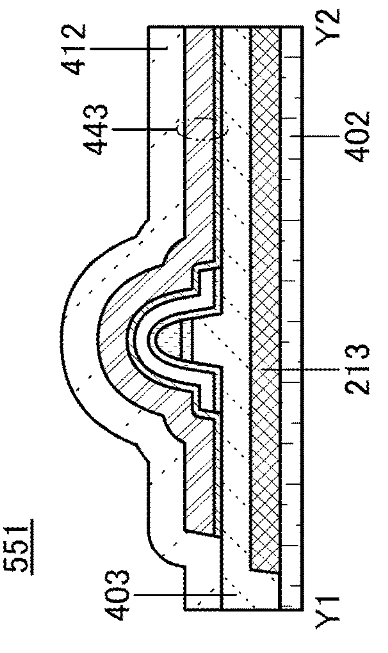
FIGS. 20A, 20B, and 20C are diagrams illustrating a structure example of a transistor.
Figure 20A:
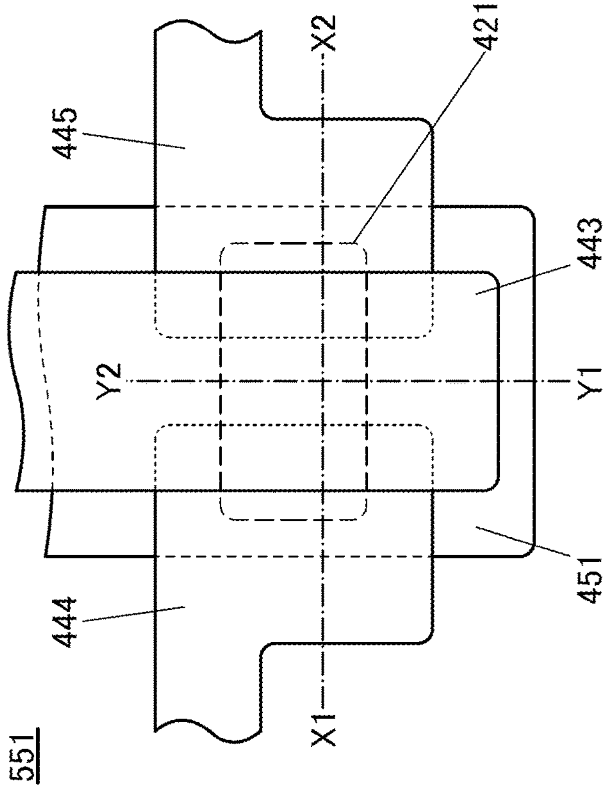
Figure 20B:
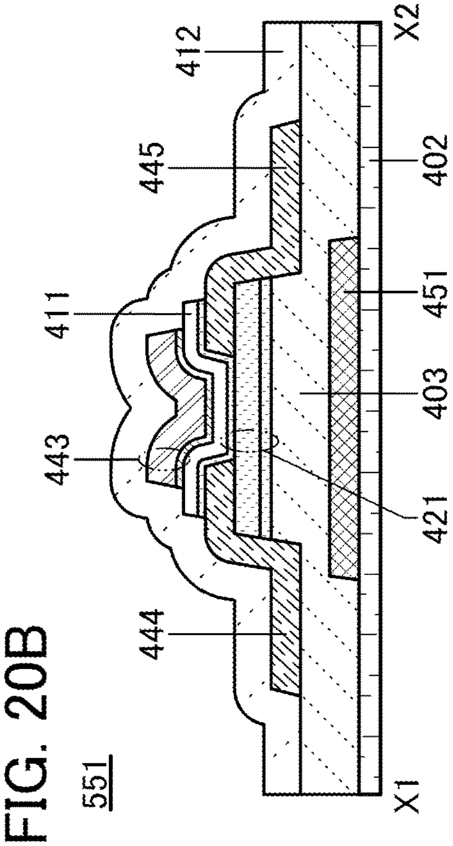

As in a transistor 551 illustrated in FIGS. 20A to 20C, the electrode 451 may be provided below the semiconductor layer 421 with an insulating layer interposed therebetween. FIG. 20A is a top view of the transistor 551. FIG. 20B is a cross-sectional view taken along the dashed-dotted line X1-X2 in FIG. 20A. FIG. 20C is a cross-sectional view taken along the dashed-dotted line Y1-Y2 in FIG. 20A.

Figure 21A:
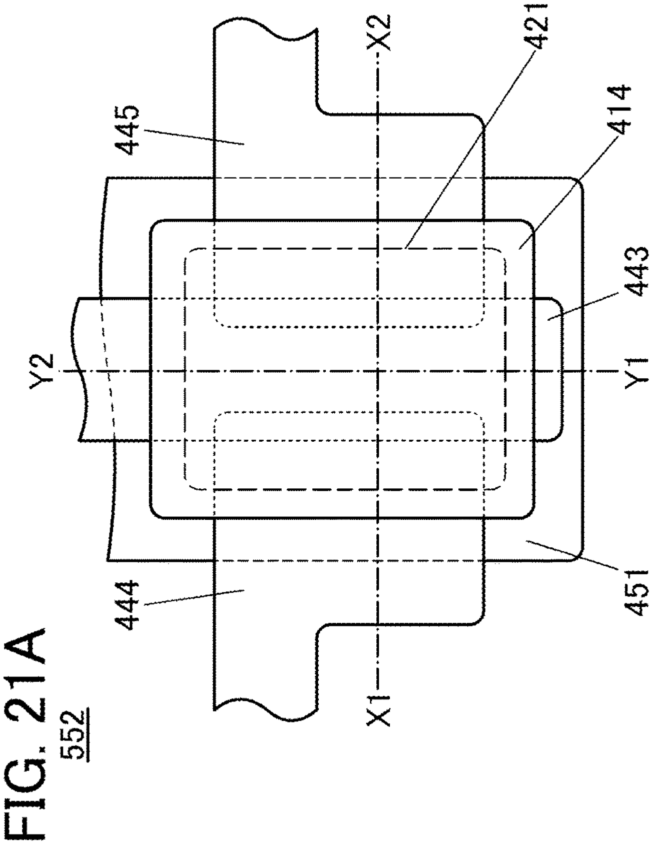
FIGS. 21A, 21B, and 21C are diagrams illustrating a structure example of a transistor.
Figure 21B:
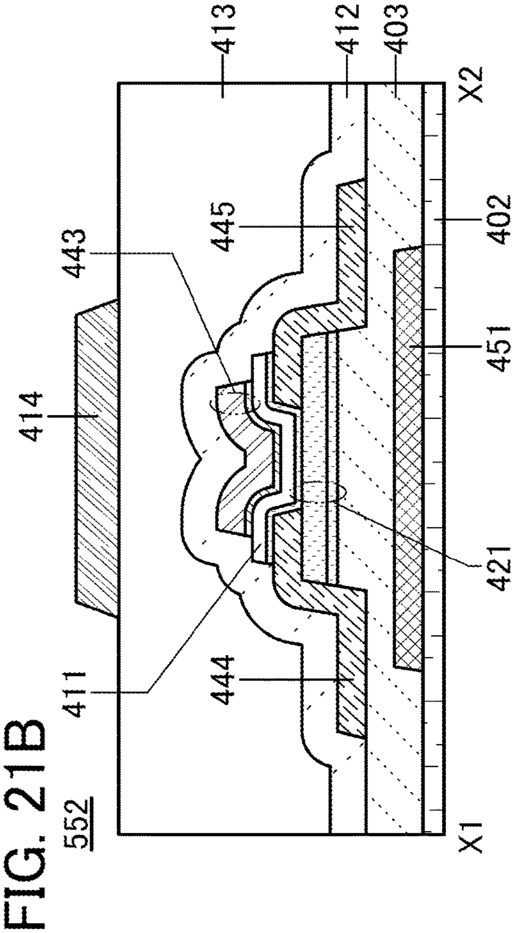
Figure 21C:
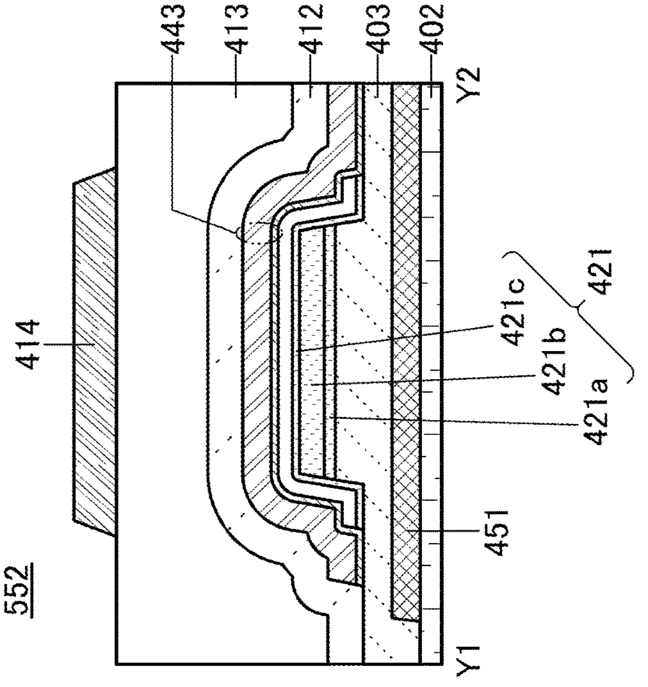

As in a transistor 452 illustrated in FIGS. 21A to 21C, a layer 414 may be provided over the electrode 443. FIG. 21A is a top view of the transistor 452. FIG. 21B is a cross-sectional view taken along the dashed-dotted line X1-X2 in FIG. 21A. FIG. 21C is a cross-sectional view taken along the dashed-dotted line Y1-Y2 in FIG. 21A.

The layer 414 is provided over the insulating layer 413 in FIGS. 21A to 21C; however, the layer 414 may be provided over the insulating layer 412. When the layer 414 is formed using a material having a light-blocking property, change in characteristics or decrease in reliability of the transistor, which is caused by light irradiation, can be prevented. When the layer 414 is formed at least larger than the semiconductor layer 421*b* such that the semiconductor layer 421*b* is covered with the layer 414, the above effects can be improved. The layer 414 can be formed using an organic material, an inorganic material, or a metal material. In the case where the layer 414 is formed using a conductive material, voltage can be supplied to the layer 414 or the layer 414 may be set to an electrically-floating state.

<Structure of Oxide Semiconductor>

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor film is classified into, for example, a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

[CAAC-OS]

A CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak will appear when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and a density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

[Microcrystalline Oxide Semiconductor Film]

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, for example, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

[Amorphous Oxide Semiconductor Film]

An amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the $InGaZnO_4$ crystal, when focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

Even when the oxide semiconductor film is a CAAC-OS film, a diffraction pattern similar to that of an nc-OS film or the like is partly observed in some cases. Therefore, whether or not a CAAC-OS film is favorable can be determined by the prorportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term “leakage current” sometimes expresses the same meaning as off-state current.

In this specification, the off-state current sometimes refers to a current that flows between a source and a drain when a transistor is off, for example Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method, for example, may be employed as a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute field effect transistor (FET).

The variety of films such as the metal film, the semiconductor film, and the inorganic insulating film which have been disclosed in the embodiment can be formed by a thermal CVD method such as a MOCVD method or an ALD method. For example, for forming an In—Ga—Zn—O film, trimethylindium, trimethylgallium, and dimethylzinc are used. The chemical formula of trimethylindium is $In(CH_3)_3$. The chemical formula of trimethylindium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. The chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tri s (2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas) are sequentially introduced a plurality of times to form an In—O layer, a $Ga(CH_3)_3$ gas and an $O_3$ gas) are introduced to form a GaO layer, and then a $Zn(CH_3)_2$ gas and an $O_3$ gas) are introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas), it is preferable to use an $O_3$ gas), which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any other embodiment as appropriate.

Embodiment 8

In this embodiment, examples of an electronic device including the imaging device of one embodiment of the present invention are described.

Examples of an electronic device including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game machines, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic devices. Examples of the moving objects included in the category of an electronic device are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 22A:
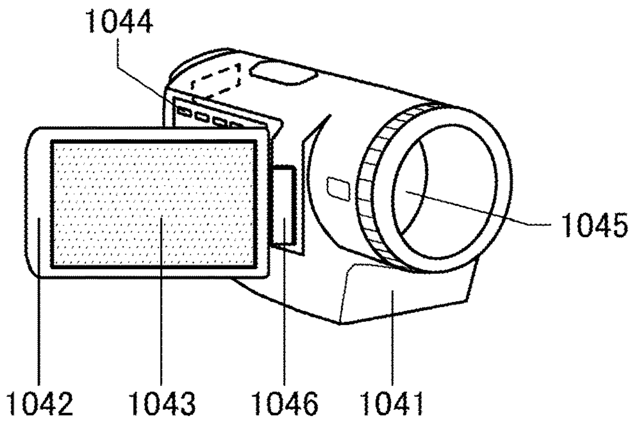
FIGS. 22A, 22B, 22C, 22D, 22E, and 22F are diagrams each illustrating an electronic device.

FIG. 22A illustrates a video camera, which includes a first housing 1041, a second housing 1042, a display portion 1043, operation keys 1044, a lens 1045, a joint 1046, and the like. The operation keys 1044 and the lens 1045 are provided for the first housing 1041, and the display portion 1043 is provided for the second housing 1042. The first housing 1041 and the second housing 1042 are connected to each other with the joint 1046, and an angle between the first housing 1041 and the second housing 1042 can be changed with the joint 1046. Images displayed on the display portion 1043 may be switched in accordance with the angle at the joint 1046 between the first housing 1041 and the second housing 1042. The imaging device of one embodiment of the present invention can be provided in a focus position of the lens 1045.

Figure 22B:
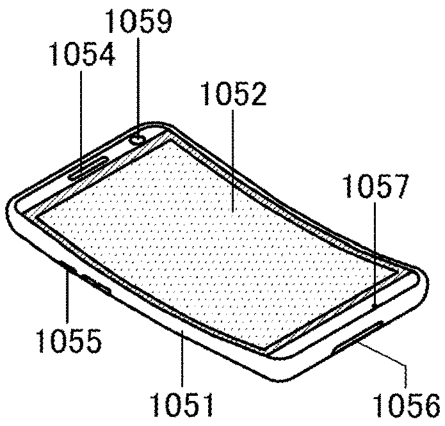

FIG. 22B illustrates a mobile phone which includes a display portion 1052, a microphone 1057, a speaker 1054, a camera 1059, an input-output terminal 1056, an operation button 1055, and the like in a housing 1051. For the camera 1059, the imaging device of one embodiment of the present invention can be used.

Figure 22C:
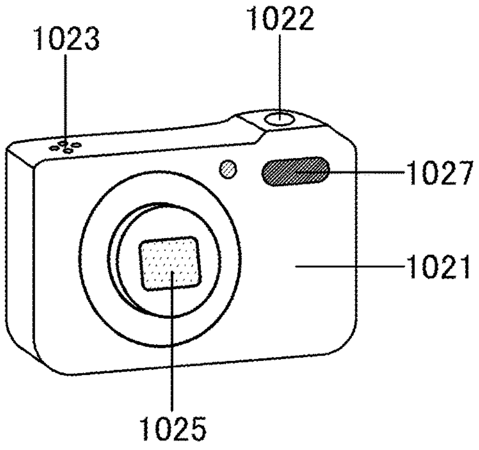

FIG. 22C illustrates a digital camera which includes a housing 1021, a shutter button 1022, a microphone 1023, a light-emitting portion 1027, a lens 1025, and the like. The imaging device of one embodiment of the present invention can be provided in a focus position of the lens 1025.

Figure 22D:
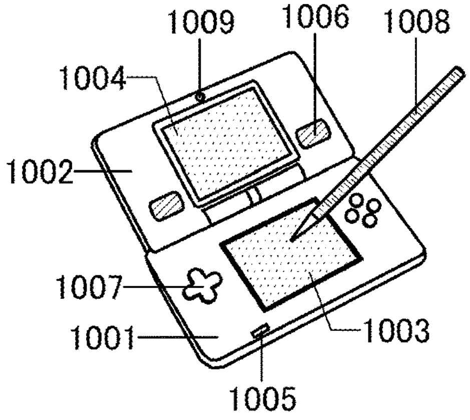

FIG. 22D illustrates a portable game machine which includes a housing 1001, a housing 1002, a display portion 1003, a display portion 1004, a microphone 1005, a speaker 1006, an operation key 1007, a stylus 1008, a camera 1009, and the like. Although the portable game machine illustrated in FIG. 22D has the two display portions 1003 and 1004, the number of display portions included in the portable game machine is not limited to this. The imaging device of one embodiment of the present invention can be used for the camera 1009.

Figure 22E:
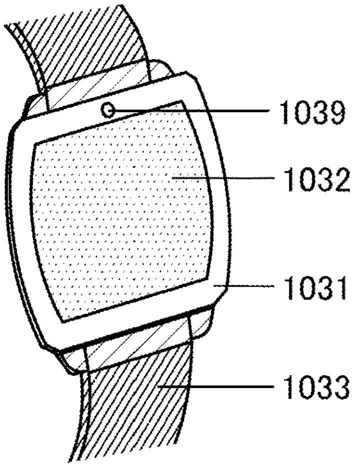

FIG. 22E illustrates a wrist-watch-type information terminal which includes a housing 1031, a display portion 1032, a wristband 1033, a camera 1039, and the like. The display portion 1032 may be a touch panel. The imaging device of one embodiment of the present invention can be used for the camera 1039.

Figure 22F:
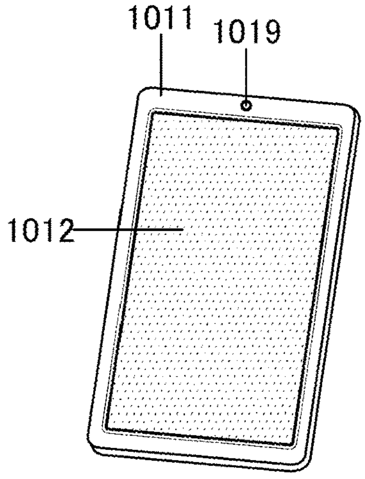

FIG. 22F illustrates a portable data terminal which includes a first housing 1011, a display portion 1012, a camera 1019, and the like. A touch panel function of the display portion 1012 enables input and output of information. The imaging device of one embodiment of the present invention can be used for the camera 1019.

Needless to say, one embodiment of the present invention is not limited to the above-described electronic devices as long as the imaging device of one embodiment of the present invention is included.

This embodiment can be combined with any other embodiment as appropriate.

This application is based on Japanese Patent Application serial no. 2014-222882 filed with Japan Patent Office on Oct. 31, 2014, the entire contents of which are hereby incorporated by reference.

What is claimed is:

1. A semiconductor device comprising:
a photoelectric conversion element;
a first transistor;
a second transistor;
a third transistor; and
a capacitor,
wherein one of an anode and a cathode of the photoelectric conversion element is electrically connected to a first wiring,
wherein the other of the anode and the cathode of the photoelectric conversion element is electrically connected to a gate of the second transistor and one electrode of the capacitor via the first transistor,
wherein the gate of the second transistor is electrically connected to a second wiring via the third transistor,
wherein the second transistor is configured to output data to a third wiring,
wherein the other electrode of the capacitor is electrically connected to the first wiring,
wherein a first conductive layer configured to be the first wiring, a second conductive layer configured to be a fourth wiring electrically connected to a gate of the first transistor, and a third conductive layer configured to be a fifth wiring electrically connected to a gate of the third transistor are provided so as to extend in a same direction in a same layer,
wherein a fifth conductive layer configured to be the second wiring is provided in a same layer as a fourth conductive layer configured to be the third wiring,
wherein a sixth conductive layer is configured to be the gate of the second transistor and the one electrode of the capacitor,
wherein, in a plan view, the first conductive layer intersects with the fourth conductive layer and the fifth conductive layer,
wherein, in the plan view, the fourth conductive layer overlaps with a channel formation region of the first transistor,
wherein, in the plan view, the sixth conductive layer and the third conductive layer do not overlap with each other, and
wherein the first wiring, the fourth wiring, and the fifth wiring are provided over the second wiring and the third wiring.

2. The semiconductor device according to claim 1, wherein a potential of the first wiring is supplied to a back gate of each of the first to third transistors.

3. A semiconductor device comprising:
a photoelectric conversion element;
a first transistor;
a second transistor;
a third transistor; and
a capacitor, wherein one of an anode and a cathode of the photoelectric conversion element is electrically connected to a first wiring, wherein the other of the anode and the cathode of the photoelectric conversion element is electrically connected to a gate of the second transistor and one electrode of the capacitor via the first transistor, wherein the gate of the second transistor is electrically connected to a second wiring via the third transistor, wherein the second transistor is configured to output data to a third wiring, wherein the other electrode of the capacitor is electrically connected to the first wiring, wherein a first conductive layer configured to be the first wiring, a second conductive layer configured to be a fourth wiring electrically connected to a gate of the first transistor, and a third conductive layer configured to be a fifth wiring electrically connected to a gate of the third transistor are provided so as to extend in a same direction in a same layer, wherein a fifth conductive layer configured to be the second wiring is provided in a same layer as a fourth conductive layer configured to be the third wiring, wherein a sixth conductive layer is configured to be the gate of the second transistor and the one electrode of the capacitor, wherein, in a plan view, the first conductive layer intersects with the fourth conductive layer and the fifth conductive layer, wherein, in the plan view, the second conductive layer intersects with the fourth conductive layer and the fifth conductive layer, wherein, in the plan view, the fourth conductive layer overlaps with a channel formation region of the first transistor, wherein, in the plan view, the sixth conductive layer and the third conductive layer do not overlap with each other, and wherein the first wiring, the fourth wiring, and the fifth wiring are provided over the second wiring and the third wiring.

4. The semiconductor device according to claim 3, wherein a potential of the first wiring is supplied to a back gate of each of the first to third transistors.

5. A semiconductor device comprising:

a photoelectric conversion element;

a first transistor;

a second transistor;

a third transistor; and a capacitor, wherein one of an anode and a cathode of the photoelectric conversion element is electrically connected to a first wiring, wherein the other of the anode and the cathode of the photoelectric conversion element is electrically connected to a gate of the second transistor and one electrode of the capacitor via the first transistor, wherein the gate of the second transistor is electrically connected to a second wiring via the third transistor, wherein the second transistor is configured to output data to a third wiring, wherein the other electrode of the capacitor is electrically connected to the first wiring, wherein a first conductive layer configured to be the first wiring, a second conductive layer configured to be a fourth wiring electrically connected to a gate of the first transistor, and a third conductive layer configured to be a fifth wiring electrically connected to a gate of the third transistor are provided so as to extend in a same direction in a same layer, wherein a fifth conductive layer configured to be the second wiring is provided in a same layer as a fourth conductive layer configured to be the third wiring, wherein a sixth conductive layer is configured to be the gate of the second transistor and the one electrode of the capacitor, wherein, in a plan view, the first conductive layer intersects with the fourth conductive layer and the fifth conductive layer, wherein, in the plan view, the second conductive layer intersects with the fourth conductive layer and the fifth conductive layer, wherein, in the plan view, the third conductive layer intersects with the fourth conductive layer and the fifth conductive layer, wherein, in the plan view, the fourth conductive layer overlaps with a channel formation region of the first transistor, wherein, in the plan view, the sixth conductive layer and the third conductive layer do not overlap with each other, and wherein the first wiring, the fourth wiring, and the fifth wiring are provided over the second wiring and the third wiring.

6. The semiconductor device according to claim 5, wherein a potential of the first wiring is supplied to a back gate of each of the first to third transistors.

* * * * *